(12) United States Patent
Okamoto et al.

(10) Patent No.: US 7,901,958 B2
(45) Date of Patent: Mar. 8, 2011

(54) FABRICATION METHOD OF SEMICONDUCTOR INTEGRATED CIRCUIT DEVICE

(75) Inventors: Masayoshi Okamoto, Ryuou (JP); Yoshiaki Hasegawa, Maebashi (JP); Yasuhiro Motoyama, Hachioji (JP); Hideyuki Matsumoto, Higashimurayama (JP); Shingo Yorisaki, Hachioji (JP); Akio Hasebe, Kodaira (JP); Ryuji Shibata, Higashiyamato (JP); Yasunori Narizuka, Hiratsuka (JP); Akira Yabushita, Yokohama (JP); Toshiyuki Majima, Yokohama (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/853,360

(22) Filed: Aug. 10, 2010

(65) Prior Publication Data

US 2010/0304510 A1    Dec. 2, 2010

Related U.S. Application Data

(63) Continuation of application No. 11/861,089, filed on Sep. 25, 2007, which is a continuation of application No. 10/968,215, filed on Oct. 20, 2004, now abandoned.

(30) Foreign Application Priority Data

Oct. 31, 2003    (JP) .................................. 2003-371515

(51) Int. Cl.
*G01R 31/26* (2006.01)
*H01L 21/66* (2006.01)

(52) U.S. Cl. ............. 438/18; 257/E21.522; 257/E21.531

(58) Field of Classification Search .................... 438/14, 438/17, 18, FOR. 101, FOR. 142; 257/E21.521, 257/E21.522, E21.531; 324/754, 758, 761
See application file for complete search history.

(56) References Cited

U.S. PATENT DOCUMENTS

| | | | |
|---|---|---|---|
| 5,182,231 A | 1/1993 | Hongo et al. | |
| 5,405,809 A | 4/1995 | Nakamura et al. | |
| 5,725,971 A | 3/1998 | Moriuchi et al. | |
| 6,305,230 B1 | 10/2001 | Kasukabe et al. | |

(Continued)

FOREIGN PATENT DOCUMENTS

EP    0 999 451 A2    5/2000

(Continued)

OTHER PUBLICATIONS

Japanese Official Action dated Sep. 1, 2009, for Application No. 2003-371515.

(Continued)

*Primary Examiner* — Matthew S Smith
*Assistant Examiner* — Quovaunda Jefferson
(74) *Attorney, Agent, or Firm* — Antonelli, Terry, Stout & Kraus, LLP.

(57) ABSTRACT

To permit electrical testing of a semiconductor integrated circuit device having test pads disposed at narrow pitches probes in a pyramid or trapezoidal pyramid form are formed from metal films formed by stacking a rhodium film and a nickel film successively. Via through-holes are formed in a polyimide film between interconnects and the metal films, and the interconnects are electrically connected to the metal films. A plane pattern of one of the metal films equipped with one probe and through-hole is obtained by turning a plane pattern of the other metal film equipped with the other probe and through-hole through a predetermined angle.

18 Claims, 39 Drawing Sheets

U.S. PATENT DOCUMENTS

| | | |
|---|---|---|
| 6,445,001 B2 | 9/2002 | Yoshida |
| 6,461,972 B1 | 10/2002 | Kabansky |
| 6,595,794 B2 | 7/2003 | Hasegawa |
| 7,235,413 B2 * | 6/2007 | Hasebe et al. .................. 438/15 |
| 7,271,015 B2 * | 9/2007 | Okamoto et al. ............... 438/14 |
| 7,423,439 B2 * | 9/2008 | Kasukabe et al. ............ 324/754 |
| 2001/0011768 A1 | 8/2001 | Kohara et al. |
| 2002/0038918 A1 | 4/2002 | Gotou et al. |
| 2002/0139567 A1 | 10/2002 | Kim et al. |
| 2004/0070413 A1 | 4/2004 | Kasukabe et al. |

FOREIGN PATENT DOCUMENTS

| | | |
|---|---|---|
| JP | 04-286349 | 3/1991 |
| JP | 5-283490 | 10/1993 |
| JP | 07-201866 | 8/1995 |
| JP | 10 12605 | 1/1998 |
| JP | 10-308423 | 11/1998 |
| JP | 11-307601 | 11/1999 |
| JP | 2000-294593 | 10/2000 |
| JP | 2001-108706 | 4/2001 |
| JP | 2001-118994 | 4/2001 |
| JP | 2002-14137 | 1/2002 |
| JP | 2002-228682 | 8/2002 |
| JP | 2003-297887 | 10/2003 |

OTHER PUBLICATIONS

Chinese Official Action for Application No. 200410086605.3, issued Mar. 7, 2008.

"Particle Size" from the Engineering Tool Box website, http://www/engineeringtoolbox.com.

Japanese Official Action dated June 1, 2010, for Application No. 2003-371515.

\* cited by examiner

FABRICATION METHOD OF SEMICONDUCTOR INTEGRATED CIRCUIT DEVICE

CROSS-REFERENCE TO RELATED APPLICATION

The present application claims priority from Japanese patent application No. 2003-371515, filed on Oct. 31, 2003, the content of which is hereby incorporated by reference into this application. This application is a Continuation application of application Ser. No. 11/861,089, filed Sep. 25, 2007, which is a Continuation application of application Ser. No. 10/968,215, filed Oct. 20, 2004 (now abandoned), the contents of which are incorporated herein by reference in their entirety.

BACKGROUND OF THE INVENTION

The present invention relates in general to technology for the manufacture of a semiconductor integrated circuit device, and, more particularly, to a technique that is effective when applied to electrical testing of a semiconductor integrated circuit device having a plurality of electrode pads disposed at narrow pitches.

For example, in the burn-in test of a semiconductor device having a protruding electrode, using a semiconductor device testing apparatus having a plurality of pyramid-shaped contact terminals protruding toward the semiconductor device, at least one contact terminal is brought into contact, at the ridge line or slope thereof, with one of the protruding electrodes, thereby bringing the semiconductor device into electrical contact with the semiconductor device testing apparatus and preventing damage to the protruding electrode during contact of the protruding electrode with the contact terminal (for example, refer to Japanese Unexamined Patent Publication No. 2002-14137.)

In addition, there is a technology for providing a probe, which is held by a support, for use in testing the electrical properties of a semiconductor wafer by bringing the probe into contact with a bump electrode of the semiconductor wafer. The probe is provided with a first contact terminal for applying a voltage to the bump electrode of the semiconductor wafer, a first insulating member encompassing the first contact terminal, a second contact terminal encompassing the first insulating member and used for detecting a voltage through the bump electrode, and a second insulating member interposed between the first and second contact terminals. Each of the first and second contact terminals has first and second terminal portions and first and second coil springs interposed between the first and second terminal portions, whereby a deviation of the probe from the bump electrode can be prevented even if the minimization of the bump electrode proceeds (for example, refer to Japanese Unexamined Patent Publication No. 2002-228682).

There also is a technology for electrically connecting integrated circuit devices fabricated in a semiconductor wafer to a testing and measuring apparatus by bringing a connection terminal of a needle of a probe into contact with a bump electrode of the integrated circuit devices, pressing the bump electrode of the adjacent integrated circuit device in the wafer to cause deformation of the tip portion of the bump electrode and thereby making the heights of the bump electrodes uniform, whereby integrated circuit devices having bump electrodes equal in their height are connected to the testing measuring apparatus via the probe at a uniform contact resistance so as to improve the test accuracy and cause fluctuations in connection resistance between the integrated circuit device and an assembly substrate to be reduced (for example, refer to Japanese Unexamined Patent Publication No. Hei 5 (1993)-283490).

There also is a technology, in which a contactor is used for testing electrical properties of a wafer by bringing a plurality of solder balls formed over a semiconductor wafer into contact with a plurality of probes corresponding to them and transmitting/receiving signals with a tester side. Each probe is provided with, as a contact terminal, a cylindrical portion capable of making conduction-free contact with the solder ball at the outside of the center thereof, whereby the contacting of the probe with the solder ball does not cause damage at the center of the solder ball, and the reflow process of the solder ball can be omitted (for example, refer to Japanese Patent Laid-Open No. 2001-108706).

SUMMARY OF THE INVENTION

Probe testing is one of the testing technologies used for testing semiconductor integrated circuit devices. It includes a function test for confirming whether a wafer functions to specification or not, or a test for judging whether the wafer is non-defective or defective by measuring its DC operating characteristics and AC operating characteristics.

In recent years, semiconductor integrated circuit devices have been discussed to perform many functions and a plurality of circuits tend to be integrated in one semiconductor chip (which will hereinafter simply be called a "chip"). In addition, a reduction in the manufacturing cost of semiconductor integrated circuit devices can be promoted by increasing the number of chips available from one wafer by miniaturizing the semiconductor elements and interconnects, while narrowing the area of the chip. In order to attain this, not only is the number of test pads (bonding pads) increased, but also these test pads are disposed at narrower pitches and the areas of the test pads are narrowed. With narrowing of the pitch of the test pads, it becomes difficult to locate probes so that they come into contact with the test pads when a prober having cantilever type probes is used for the probe testing.

Upon probe testing using a prober with cantilever type probes, the probes are wiped on the surface of the test pads in order to tear a natural oxide film that has formed over the surface of each of the test pads to thereby bring the probe into electrical contact with the corresponding test pad. Wiping of the probes will not only break the natural oxide film formed over the surface of each test pad, but also forms a dent on the surface of the test pad. As the area of the test pads becomes narrower, as described above, such a dent occupies a large portion of the surface of each test pad. This leads to a problem in that the adhesive force of a bonding wire connected to the test pad in the later step is inevitably lowered. There is also a fear that, as the area of the test pad decreases, the tip portion of the probe deviates from the test pad and a short-circuit occurs between the two test pads.

In addition, wiping of the probe on the surface of the test pad shaves off a portion of the test pad, and shavings thus generated adhere to the tip portion of the probe. The shavings adhere to the tip portion of the probe one after another by the repetition of probing, which finally disturbs the electrical connection between the probe and the test pad. After probing is conducted a predetermined number of times, the probe should be cleaned by rubbing the tip portion of the probe with a certain cleaning sheet. The inevitable addition of this cleaning step prolongs the probe testing step, which also prolongs the fabrication time of the semiconductor integrated circuit device, resulting in a rise in the production cost of the semiconductor integrated circuit device.

As described above, it has become difficult to perform probe testing owing to an increase in the number of test pads and a narrowing of the pitch between the test pads. The present inventors therefore have investigated testing by using a prober, as illustrated in FIG. 79, having a wiring substrate 102 equipped with cantilever type probes 101, and by bringing the probes 101 into contact with bump electrodes over the main surface of a chip.

FIG. 80 is a fragmentary enlarged plan view of a region A in FIG. 79 during probe testing, and FIG. 81 is a fragmentary cross-sectional view illustrating a substantial part of the cross-section taken along a line C-C of FIG. 80. In the region A, the extending direction of bump electrode 103 is almost the same as the extending direction of the probe 101. The probe 101 therefore wipes in the extending direction (shown by an arrow in FIGS. 80 and 81) of the bump electrode 103 after contact with the bump electrode 103 (refer to FIGS. 82 and 83). FIG. 84 is a fragmentary enlarged plan view of a region B in FIG. 79 during the probe testing step, and FIG. 85 is a fragmentary enlarged cross-sectional view illustrating a substantial part of the cross-section taken along a line D-D in FIG. 84. In the region B, the extending direction of the bump electrode 103 intersects with the extending direction of the probe 101. The probe 101 therefore wipes (overdrives) in the direction (shown by an arrow in FIGS. 84 and 85) intersecting with the extending direction of the bump electrode 103 after contact with the bump electrode 103 (refer to FIGS. 86 and 87). Therefore, there is a fear that, after the wiping of the probe 101, the tip portion of the probe 101 deviates from the bump electrode 103, and a short-circuit between the bump electrodes 103 is caused by the probe 101.

At present, a method of reducing the number of test pads to be brought into contact with probes has been investigated utilizing DFT (Design For Testability) or BIST (Built In Self Test). Use of DFT (Design for Testability) or BIST (Built In Self Test) however needs disposal of new test pads. For the purpose of preventing elements or interconnects from being damaged by the impact upon contact of the probe with the test pad, the test pad is disposed in an input/output region having neither elements nor interconnects formed therebelow. With an increase in the operation speed of a semiconductor integrated circuit device, on the other hand, there is a growing need for disposal of a large number of power supply pads in their input/output regions in order to reduce noise (to reduce source impedance). In a chip of limited size, the size of each input/output region is also limited. The disposal of the power supply pads therefore makes it difficult to keep a region for the disposal of the above-described test pad that is used for DFT or BIST.

An object of the present invention is to provide a technique for permitting electrical testing of a semiconductor integrated circuit device having test pads disposed at narrow pitches.

Another object of the invention is to provide, upon testing of a semiconductor integrated circuit device, a technique that is capable of reducing damage to the test pads.

A further object of the invention is to provide a technique that is capable of shortening the electrical testing step in the fabrication of a semiconductor integrated circuit device.

The above-described and the other objects and novel features of the present invention will be apparent from the description herein and the accompanying drawings.

Of the aspects and features of the invention disclosed in the present application, typical ones will be summarized briefly.

In one aspect of the present invention, there is thus provided a method of fabricating a semiconductor integrated circuit device which comprises the steps of:

(a) preparing a semiconductor wafer which has been partitioned into a plurality of chip regions, each having a semiconductor integrated circuit formed thereover, and which has, formed over the main surface of the wafer, a plurality of first electrodes to be electrically connected to the semiconductor integrated circuit;

(b) preparing a first card comprising a wiring substrate having first interconnects formed thereover; a first sheet having a plurality of contact terminals to be brought into contact with the first electrodes and second interconnects to be electrically connected to the contact terminals, said second interconnects being electrically connected to the first interconnects, and tip portions of the contact terminals being fixed to the wiring substrate so as to be opposite to the main surface of the semiconductor wafer; and a pressing mechanism for pressing, from the rear surface of the first sheet, a region of the first sheet in which the contact terminals have been formed; and (c) performing electrical testing of the semiconductor integrated circuit by bringing the tip portions of the contact terminals into contact with the first electrodes, wherein:

each of the tip portions of the contact terminals is disposed over the main surface of the first sheet so as to be positioned opposite to the corresponding one of the first electrodes, and the first electrodes are arranged in a plurality of rows along the periphery of each of the chip regions, and the first electrodes included in the first row and the first electrodes included in the second row are disposed alternately in a direction along the periphery of each of the chip regions.

In another aspect of the present invention, there is provided a method of fabrication of a semiconductor integrated circuit device, which comprises the steps of:

(a) preparing a semiconductor wafer which has been partitioned into a plurality of chip regions, each having a semiconductor integrated circuit formed thereover, and which has, formed over the main surface of the wafer, a plurality of first electrodes to be electrically connected to the semiconductor integrated circuit;

(b) preparing a first card comprising a wiring substrate having first interconnects formed thereover; a first sheet having a plurality of contact terminals to be brought into contact with the first electrodes, and second interconnects to be electrically connected to the contact terminals, said second interconnects being electrically connected to the first interconnects, and tip portions of the contact terminals being fixed to the wiring substrate so as to be positioned opposite to the main surface of the semiconductor wafer; and a pressing mechanism for pressing, from the rear surface of the first sheet, a region of the first sheet in which the contact terminals have been formed, and (c) performing electrical testing of the semiconductor integrated circuit by bringing the tip portions of the contact terminals into contact with the first electrodes, wherein:

each of the tip portions of the contact terminals is disposed over the main surface of the first sheet so as to be positioned opposite to the corresponding one of the first electrodes, the first sheet is formed by the steps of:

(b-1) preparing a first substrate having crystallizability, (b-2) selectively and anisotropically etching the first substrate to form a plurality of first holes in a pyramid or trapezoidal pyramid form, (b-3) over each of the first holes, selectively forming a plurality of first metal films to fill therewith the first holes, (b-4) forming a first polyimide film over the first substrate and the first metal films, (b-5) selectively etching the first polyimide film to form a plurality of first opening portions reaching the first metal films, (b-6) forming, over the first polyimide film, a second metal film to embed therewith the first opening portions, and patterning the second metal film to form the second interconnects to be electrically connected to the first metal films, (b-7) forming a second polyimide film over the second interconnects and the first polyimide film, (b-8) bonding a second sheet onto the first substrate, forming a second opening portion in the second sheet over the first metal film, and forming a third opening portion in the second sheet over a first region, in which the first metal film has not been formed, over the first substrate, (b-9) forming, in the second opening portion, an elastic material to embed therewith the second opening portion, while the second sheet is bonded to the first substrate, (b-10) removing the first substrate and forming the contact terminals from the first metal films, and (b-11) removing the second polyimide film and the first polyimide film below the third opening portion, and wherein the second sheet has a linear expansion coefficient similar to that of the semiconductor wafer.

In a further aspect of the invention, there is also provided a method of fabrication of a semiconductor integrated circuit device, which comprises the steps of:

(a) preparing a semiconductor wafer which has been partitioned into a plurality of chip regions, each having a semiconductor integrated circuit formed thereover, and which has, formed over the main surface of the wafer, a plurality of first electrodes to be electrically connected to the semiconductor integrated circuit;

(b) preparing a first card comprising a wiring substrate having first interconnects formed thereover; a first sheet having a plurality of contact terminals to be brought into contact with the first electrodes, and second interconnects to be electrically connected to the contact terminals, said second interconnects being electrically connected to the first interconnects and tip portions of the contact terminals being fixed to the wiring substrate so as to be opposite to the main surface of the semiconductor wafer; and a pressing mechanism for pressing, from the rear surface of the first sheet, a region of the first sheet in which the contact terminals have been formed, and (c) performing electrical testing of the semiconductor integrated circuit by bringing the tip portions of the contact terminals into contact with the first electrodes, wherein:

each of the tip portions of the contact terminals is disposed over the main surface of the first sheet so as to be opposite to the corresponding one of the first electrodes, and the tip portions of the contact terminals each has a height greater than the particle size of dust which adheres to the semiconductor wafer during the manufacturing of the semiconductor integrated circuit device.

In a still further aspect of the invention, there is also provided a method of fabrication of a semiconductor integrated circuit device, which comprises the steps of:

(a) preparing a semiconductor wafer which has been partitioned into a plurality of chip regions, each having a semiconductor integrated circuit formed thereover, and which has, formed over the main surface of the wafer, a plurality of first electrodes to be electrically connected to the semiconductor integrated circuit;

(b) preparing a first card comprising a wiring substrate having first interconnects formed thereover; a first sheet having a plurality of contact terminals to be brought into contact with the first electrodes, and second interconnects to be electrically connected to the contact terminals, said second interconnects being electrically connected to the first interconnects, and tip portions of the contact terminals being fixed to the wiring substrate so as to be opposite to the main surface of the semiconductor wafer; and a pressing mechanism for pressing, from the rear surface of the first sheet, a region of the first sheet in which the contact terminals have been formed; and (c) performing electrical testing of the semiconductor integrated circuit by bringing the tip portions of the contact terminals into contact with the first electrodes, wherein:

each of the tip portions of the contact terminals is disposed over the main surface of the first sheet so as to be positioned opposite to the corresponding one of the first electrodes, and a first area of an electrical contact surface between the tip portion of a first contact terminal, of the contact terminals, through which a relatively large current flows during electrical testing, and the first electrode is greater than a second area of an electrical contact surface between the tip portion of a second contact terminal, of the contact terminals, through which a relatively small current flows during electrical testing, and the first electrode.

The outline of the other features of the invention as described herein will be itemized.

Item 1: A method of fabrication of a semiconductor integrated circuit device which comprises the steps of:

(a) preparing a semiconductor wafer which has been partitioned into a plurality of chip regions, each having a semiconductor integrated circuit formed thereover, and which has, formed over the main surface of the wafer, a plurality of first electrodes to be electrically connected to the semiconductor integrated circuit;

(b) preparing a first card comprising a wiring substrate having first interconnects formed thereover; a first sheet having a plurality of contact terminals to be brought into contact with the first electrodes and second interconnects to be electrically connected to the contact terminals, said second interconnects being electrically connected to the first interconnects, and tip portions of the contact terminals being fixed to the wiring substrate so as to be opposite to the main surface of the semiconductor wafer; and a pressing mechanism for pressing, from the rear surface of the first sheet, a region of the first sheet in which the contact terminals have been formed; and (c) performing electrical testing of the semiconductor integrated circuit by bringing the tip portions of the contact terminals into contact with the first electrodes, wherein:

each of the tip portions of the contact terminals is disposed over the main surface of the first sheet so as to be positioned opposite to a corresponding one of the first electrodes, and wherein:

the first electrodes are each a protruding electrode.

Item 2: A method of fabrication of a semiconductor integrated circuit device, which comprises the steps of:

(a) preparing a semiconductor wafer which has been partitioned into a plurality of chip regions, each having a semiconductor integrated circuit formed thereover, and which has, formed over the main surface of the wafer, a plurality of first electrodes to be electrically connected to the semiconductor integrated circuit;

(b) preparing a first card comprising a wiring substrate having first interconnects formed thereover; a first sheet having a plurality of contact terminals to be brought into contact with the first electrodes, and second interconnects to be electrically connected to the contact terminals, said second interconnects being electrically connected to the first interconnects and tip portions of the contact terminals being fixed to the wiring substrate so as to be opposite to the main surface of the semiconductor wafer; and a pressing mechanism for pressing, from the rear surface of the first sheet, a region of the first sheet in which the contact terminals have been formed, (c) subjecting the semiconductor wafer to at least one of plasma treatment and washing treatment, and (d) performing electrical testing of the semiconductor integrated circuit by bringing the tip portions of the contact terminals into contact with the first electrodes, wherein:

each of the tip portions of the contact terminals is disposed over the main surface of the first sheet so as to be positioned opposite to a corresponding one of the first electrodes.

Item 3: A method of fabrication of a semiconductor integrated circuit device according to Item 2, wherein:

the plasma treatment is ashing or etching with a fluorine gas.

Item 4: A method of fabrication of a semiconductor integrated circuit device according to Item 2, wherein:

the washing treatment is an ultrasonic washing treatment.

Item 5: A method of fabrication of a semiconductor integrated circuit device which comprises the steps of:

(a) preparing a semiconductor wafer which has been partitioned into a plurality of chip regions, each having a semiconductor integrated circuit formed thereover, and which has, formed over the main surface of the wafer, a plurality of first electrodes to be electrically connected to the semiconductor integrated circuit;

(b) preparing a first card comprising a wiring substrate having first interconnects formed thereover; a first sheet having a plurality of contact terminals to be brought into contact with the first electrodes, and second interconnects to be electrically connected to the contact terminals, said second interconnects being electrically connected to the first interconnects, and tip portions of the contact terminals being fixed to the wiring substrate so as to be opposite to the main surface of the semiconductor wafer; and a pressing mechanism for pressing, from the rear surface of the first sheet, a region of the first sheet in which the contact terminals have been formed; and (c) performing electrical testing of the semiconductor integrated circuit by bringing the tip portions of the contact terminals into contact with the first electrodes, wherein:

each of the tip portions of the contact terminals is disposed over the main surface of the first sheet so as to be positioned opposite to a corresponding one of the first electrodes, and said step (c) further comprises the steps of:

(c1) after the tip portions of the contact terminals are brought into contact with the first electrodes, the tip portions of the contact terminals are moved in one way or reciprocated in a first direction relative to the first electrodes, and (c2) after the step (c1), the electrical testing is performed.

Item 6: A method of fabrication of a semiconductor integrated circuit device according to Item 5, wherein:

said first direction is a direction intersecting with the main surface of the semiconductor wafer.

Item 7: A method of fabrication of a semiconductor integrated circuit device according to Item 5, wherein:

the first electrodes each have aluminum as a main component.

Item 8: A method of fabrication of a semiconductor integrated circuit device which comprises the steps of:

(a) preparing a semiconductor wafer which has been partitioned into a plurality of chip regions, each having a semiconductor integrated circuit formed thereover, and which has, formed over the main surface of the wafer, a plurality of first electrodes to be electrically connected to the semiconductor integrated circuit;

(b) preparing a first card comprising a wiring substrate having first interconnects formed thereover; a first sheet having a plurality of contact terminals to be brought into contact with the first electrodes, and second interconnects to be electrically connected to the contact terminals, said second interconnects being electrically connected to the first interconnects, and tip portions of the contact terminals being fixed to the wiring substrate so as to be opposite to the main surface of the semiconductor wafer; and a pressing mechanism for pressing, from the rear surface of the first sheet, a region of the first sheet in which the contact terminals have been formed; and (c) performing electrical testing of the semiconductor integrated circuit by bringing the tip portions of the contact terminals into contact with the first electrodes, wherein:

the chip regions each have a plurality of circuit blocks, the first electrodes form a plurality of electrode groups to be electrically connected to the circuit blocks, respectively, and in the step (c), the electrical testing of the semiconductor integrated circuit is performed by bringing the tip portions of the contact terminals into contact with at least one of the electrode groups to be electrically connected to at least one selected from the circuit blocks.

Item 9: A method of fabrication of a semiconductor integrated circuit device according to Item 8, wherein:

each of the circuit blocks has, formed therein, a first circuit for checking each operation of the circuit blocks.

Item 10: A method of fabrication of a semiconductor integrated circuit device which comprises the steps of:

(a) preparing a semiconductor wafer which has been partitioned into a plurality of chip regions, each having a semiconductor integrated circuit formed thereover, and which has, formed over the main surface of the wafer, a plurality of first electrodes to be electrically connected to the semiconductor integrated circuit;

(b) preparing a first card comprising a wiring substrate having first interconnects formed thereover; a first sheet having a plurality of contact terminals to be brought into contact with the first electrodes, and second interconnects to be electrically connected to the contact terminals, said second interconnects being electrically connected to the first interconnects, and tip portions of the contact terminals being fixed to the wiring substrate so as to be opposite to the main surface of the semiconductor wafer; and a pressing mechanism for pressing, from the rear surface of the first sheet, a region of the first sheet in which the contact terminals have been formed, and (c) performing electrical testing of the semiconductor integrated circuit by bringing the tip portions of the contact terminals into contact with the first electrodes, wherein:

the chip regions each have a plurality of circuit blocks, the first electrodes are classified into a first electrode group to be electrically connected to a first circuit block, of the circuit blocks, and a second electrode group to be electrically connected to the circuit block(s) other than the first circuit block, the second electrode group is disposed in a second region along the periphery of the chip region and the first electrode group is disposed in a third region inside of the second region, and in the step (c), the electrical testing of the semiconductor integrated circuit is performed by bringing the tip portions of the contact terminals into contact with the first electrode group.

Item 11: A method of fabrication of a semiconductor integrated circuit device which comprises the steps of:

(a) preparing a semiconductor wafer which has been partitioned into a plurality of chip regions, each having a semiconductor integrated circuit formed thereover, and which has a plurality of first electrodes formed over the main surface of the wafer;

(b) preparing a first card comprising a wiring substrate having first interconnects formed thereover; a first sheet having a plurality of contact terminals to be brought into contact with the first electrodes, and second interconnects to be electrically connected to the contact terminals, said second interconnects being electrically connected to the first interconnects, and tip portions of the contact terminals being fixed to the wiring substrate so as to be opposite to the main surface of the semiconductor wafer; and a pressing mechanism for pressing, from the rear surface of the first sheet, a region of the first sheet in which the contact terminals have been formed, and (c) performing electrical testing of the semiconductor integrated circuit by bringing the tip portions of the contact terminals into contact with the first electrodes, wherein:

each of the tip portions of the contact terminals is disposed over the main surface of the first sheet so as to be positioned opposite to a corresponding one of the first electrodes, and the first electrodes are disposed in a second region along the periphery of the chip region and are classified into a third electrode group disposed at corners of the chip region and a second electrode group other than the third electrode group.

Item 12: A method of fabrication of a semiconductor integrated circuit device according to Item 11, wherein:

the chip regions each has, formed therein, a first circuit which checks operations of the semiconductor integrated circuit and is to be electrically connected to the third electrode group, in the step (c), the electrical testing of the semiconductor integrated circuit device is performed by bringing the tip portions of the contact terminals into contact with the third electrode group.

Item 13: A method of fabrication of a semiconductor integrated circuit device according to Item 11, wherein:

the second electrode group is electrically connected to the semiconductor integrated circuit, and in the step (c), the electrical testing of the semiconductor integrated circuit device is performed by bringing the tip portions of the contact terminals into contact with the second electrode group and the third electrode group.

Item 14: A method of fabrication of a semiconductor integrated circuit device which comprises the steps of:

(a) preparing a semiconductor wafer which has been partitioned into a plurality of chip regions, each having a semiconductor integrated circuit formed thereover, and which has, formed over the main surface of the wafer, a plurality of first electrodes to be electrically connected to the semiconductor integrated circuit;

(b) preparing a first card comprising a wiring substrate having first interconnects formed thereover; a first sheet having a plurality of contact terminals to be brought into contact with the first electrodes, and second interconnects to be electrically connected to the contact terminals, said second interconnects being electrically connected to the first interconnects, and tip portions of the contact terminals being fixed to the wiring substrate so as to be opposite to the main surface of the semiconductor wafer; and a pressing mechanism for pressing, from the rear surface of the first sheet, a region of the first sheet in which the contact terminals have been formed, and (c) performing electrical testing of the semiconductor integrated circuit by bringing the tip portions of the contact terminals into contact with the first electrodes in the chip regions, wherein:

each of the tip portions of the contact terminals is disposed over the main surface of the first sheet so as to be positioned opposite to a corresponding one of the first electrodes.

Item 15: A method of fabrication of a semiconductor integrated circuit device which comprises the steps of:

(a) preparing a semiconductor chip which has a semiconductor integrated circuit formed thereover and which has, over the main surface of the chip, a plurality of first electrodes to be electrically connected to the semiconductor integrated circuit;

(b) preparing a first card comprising a wiring substrate having first interconnects formed thereover; a first sheet having a plurality of contact terminals to be brought into contact with the first electrodes, and second interconnects to be electrically connected to the contact terminals, said second interconnects being electrically connected to the first interconnects, and tip portions of the contact terminals being fixed to the wiring substrate so as to be opposite to the main surface of the semiconductor wafer; and a pressing mechanism for pressing, from the rear surface of the first sheet, a region of the first sheet in which the contact terminals have been formed, and (c) performing electrical testing of the semiconductor integrated circuit by bringing the tip portions of the contact terminals into contact with the first electrodes, wherein:

each of the tip portions of the contact terminals is disposed over the main surface of the first sheet so as to be positioned opposite to a corresponding one of the first electrodes, and the first electrodes are arranged in a plurality of rows along the periphery of the semiconductor chip, and the first electrodes included in the first row and the first electrodes included in the second row are disposed alternately in a direction along the periphery of the semiconductor chip.

Item 16: A method of fabrication of a semiconductor integrated device according to claim 15, wherein:

the first electrode is a protruding electrode having gold as a main component and is rectangular, as seen in plan view, with long sides and short sides, said long sides extending toward the periphery of the semiconductor chip.

Item 17: A method of fabrication of a semiconductor integrated circuit device according to claim 15, wherein:

the semiconductor integrated circuit device includes an LCD driver.

Item 18: A method of fabrication of a semiconductor integrated circuit device according to claim 15, wherein:

in the first sheet, the second interconnects have a plurality of interconnect layers.

Item 19: A method of fabrication of a semiconductor integrated circuit device which comprises the steps of:

(a) preparing a semiconductor chip which has a semiconductor integrated circuit formed thereover and which has, over the main surface of the chip, a plurality of first electrodes to be electrically connected to the semiconductor integrated circuit;

(b) preparing a first card comprising a wiring substrate having first interconnects formed thereover; a first sheet having a plurality of contact terminals to be brought into contact with the first electrodes, and second interconnects to be electrically connected to the contact terminals, said second interconnects being electrically connected to the first interconnects, and tip portions of the contact terminals being fixed to the wiring substrate so as to be opposite to the main surface of the semiconductor wafer; and a pressing mechanism for pressing, from the rear surface of the first sheet, a region of the first sheet in which the contact terminals have been formed, and (c) performing electrical testing of the semiconductor integrated circuit by bringing the tip portions of the contact terminals into contact with the first electrodes, wherein:

each of the tip portions of the contact terminals is disposed over the main surface of the first sheet so as to be positioned opposite to the corresponding one of the first electrodes, said first sheet is formed by the steps of:

(b-1) preparing a first substrate having crystallizability, (b-2) selectively and anisotropically etching the first substrate to form a plurality of first holes in the pyramid or trapezoidal pyramid form, (b-3) over each of the first holes, selectively forming a plurality of first metal films to fill therewith the first holes, (b-4) forming a first polyimide film over the first substrate and the first metal films, (b-5) selectively etching the first polyimide film to form a plurality of first opening portions reaching the first metal films, (b-6) forming, over the first polyimide film, a second metal film to embed therewith the first opening portions and patterning the second metal film to form the second interconnects to be electrically connected to the first metal films, (b-7) forming a second polyimide film over the second interconnects and the first polyimide film, (b-8) bonding a second sheet onto the first substrate, forming a second opening portion in the second sheet over the first metal film, and forming a third opening portion in the second sheet over a first region, in which the first metal film has not been formed, over the first substrate, (b-9) forming, in the second opening portion, an elastic material to embed therewith the second opening portion, while the second sheet is bonded to the first substrate, (b-10) removing the first substrate and forming the contact terminals from the first metal films, and (b-11) removing the second polyimide film and the first polyimide film below the third opening portion, and the second sheet has a linear expansion coefficient similar to that of the semiconductor chip.

Item 20: A method of fabrication of a semiconductor integrated circuit device according to claim 19, wherein:

the second sheet is made of 42 alloy or invar.

Item 21: A method of fabrication of a semiconductor integrated circuit device according to claim 19, wherein:

the first metal film includes a first metal layer and a second metal layer, the step (b3) further comprises the steps of: forming the first metal layer over the first substrate and forming the second metal layer over the first metal layer, and the first metal layer has a higher hardness than the second metal layer and has oxidation resistance.

Item 22: A method of fabrication of a semiconductor integrated circuit device according to Item 21, wherein:

the first metal layer has rhodium as a main component, and the second metal layer has nickel or copper as a main component.

Item 23: A method of fabrication of a semiconductor integrated circuit device according to Item 22, wherein:

the first metal layer has a thickness of from 1 to 4 μm.

Item 24: A method of fabrication of a semiconductor integrated circuit device which comprises the steps of:

(a) preparing a semiconductor chip which has a semiconductor integrated circuit formed thereover and which has, over the main surface of the chip, a plurality of first electrodes to be electrically connected to the semiconductor integrated circuit;

(b) preparing a first card comprising a wiring substrate having first interconnects formed thereover; a first sheet having a plurality of contact terminals to be brought into contact with the first electrodes, and second interconnects to be electrically connected to the contact terminals, said second interconnects being electrically connected to the first interconnects, and tip portions of the contact terminals being fixed to the wiring substrate so as to be opposite to the main surface of the semiconductor wafer; and a pressing mechanism for pressing, from the rear surface of the first sheet, a region of the first sheet in which the contact terminals have been formed, and (c) performing electrical testing of the semiconductor integrated circuit by bringing the tip portions of the contact terminals into contact with the first electrodes, wherein:

each of the tip portions of the contact terminals is disposed over the main surface of the first sheet so as to be positioned opposite to a corresponding one of the first electrodes, and the tip portions of the contact terminals each has a height greater than the particle size of dust which adheres to the semiconductor chip during the manufacturing of the semiconductor integrated circuit device.

Item 25: A method of fabrication of a semiconductor integrated circuit device which comprises the steps of:

(a) preparing a semiconductor chip which has a semiconductor integrated circuit formed thereover and which has, over the main surface of the chip, a plurality of first electrodes to be electrically connected to the semiconductor integrated circuit;

(b) preparing a first card comprising a wiring substrate having first interconnects formed thereover; a first sheet having a plurality of contact terminals to be brought into contact with the first electrodes, and second interconnects to be electrically connected to the contact terminals, said second interconnects being electrically connected to the first interconnects, and tip portions of the contact terminals being fixed to the wiring substrate so as to be opposite to the main surface of the semiconductor wafer; and a pressing mechanism for pressing, from the rear surface of the first sheet, a region of the first sheet in which the contact terminals have been formed, and (c) performing electrical testing of the semiconductor integrated circuit by bringing the tip portions of the contact terminals into contact with the first electrodes, wherein:

each of the tip portions of the contact terminals is disposed over the main surface of the first sheet so as to be positioned opposite to a corresponding one of the first electrodes, and a first area of an electrical contact surface between the tip portion of a first contact terminal, of the contact terminals, through which a relatively large current flows upon electrical testing, and the first electrode is greater than a second area of an electrical contact surface between the tip portion of a second contact terminal, of the contact terminals, through which a relatively small current flows upon electrical testing, and the first electrode.

Item 26: A method of fabrication of a semiconductor integrated circuit device according to claim 25, wherein:

protrusions in the pyramid or trapezoidal pyramid form are disposed at the tip portions of the contact terminals, and the number of the protrusions disposed at the tip portion of the first contact terminal is greater than that disposed at the tip portion of the second contact terminal.

Item 27: A method of fabrication of a semiconductor integrated circuit device according to claim 25, wherein:

protrusions in the pyramid or trapezoidal pyramid form are disposed at the tip portions of the contact terminals, and the protrusion disposed at the tip portion of the first contact terminal has a larger size, as seen in plan view, than that disposed at the tip portion of the second contact terminal and these protrusions are equal in height.

Advantages available by the typical aspects and features of the invention as disclosed herein will be described briefly.

The present invention makes it possible to carry out electrical testing (probe testing) of a semiconductor integrated circuit device having test pads disposed at narrow pitches.

DETAILED DESCRIPTION OF THE PREFERRED EMBODIMENTS

Figure 1:
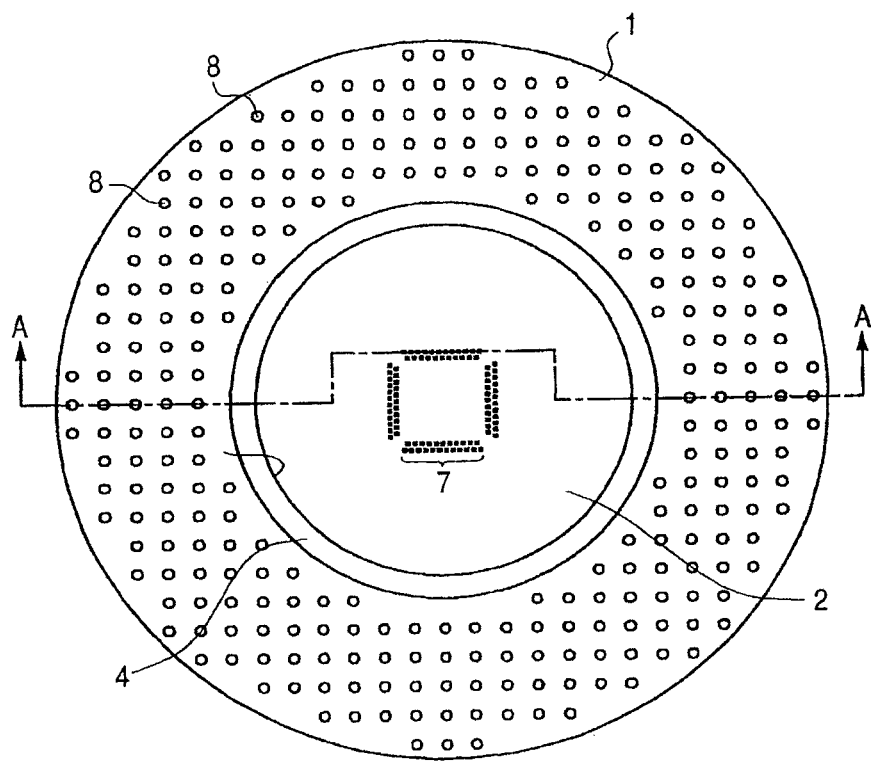
FIG. 1 is a fragmentary plan view of the lower surface of a probe card according to Embodiment 1 of the invention.

Prior to a detailed description of the invention, the meanings of the terms used herein will be described.

The term "wafer" means a single crystal silicon substrate (usually having a substantially flat disk form), an SOI (Silicon On Insulator) substrate, a sapphire substrate, a glass substrate, or any other insulating, semi-insulating or semiconductor substrate, or a composite substrate thereof which is used for the fabrication of integrated circuits. The term "semiconductor integrated circuit device" as used herein means not only those devices fabricated over a semiconductor or insulator substrate, such as a silicon wafer or sapphire substrate, but also those formed over other insulating substrates, such as glass substrates, e.g., TFT (Thin Film Transistor) and STN (Super-Twisted-Nematic) liquid crystals, unless otherwise specifically indicated.

The term "device surface" means a main surface of a wafer over which device patterns corresponding to plural chip regions are to be formed by lithography.

The term "contact terminal" means a silicon wafer integrally formed with interconnect layers and tip portions electrically connected thereto by employing a wafer process similar to that used for the fabrication of a semiconductor integrated circuit, that is, a patterning method using photolithography, CVD (Chemical Vapor Deposition), sputtering and etching in any combination.

The term "thin film probe" means a thin film which has, disposed thereover, contact terminals arranged to come in contact with a wafer to be tested, and interconnects which are led from the contact terminals and have an electrode for outside contact. The thickness of this thin film probe is about 10 μm to 100 μm.

The term "probe card" means a structural body having a contact terminal to be brought into contact with a wafer to be tested and a multilayer wiring substrate, while the term "semiconductor inspection apparatus" means an inspection apparatus having a probe card and a sample holder on which a wafer to be tested is placed.

The term "probe testing" means electrical testing, by using a prober, of a wafer whose wafer step has been completed, more specifically electrical testing of a semiconductor integrated circuit by pressing the tip portion of the contact terminal against an electrode formed over the main surface of a chip region. In the probe testing, the circuit is judged as defective or non-defective based on the results of a function test for finding whether the product functions according to specification or not, or according to the results of the tests on DC operating characteristics and AC operating characteristics. The probe testing is discriminated from a selection test (final test) to be performed after the wafer is divided into chips (or after completion of the packaging).

In the description of the embodiments, a description may be made after the subject matter is divided in plural sections or in plural embodiments, if necessary for convenience' sake. These plural sections or embodiments are not independent of each other, but are in a relation such that one is a modification, represents an example, shown details or is a complementary description of a part or whole of the other one, unless otherwise specifically indicated.

In the description of the embodiments, when reference is made to a number of elements (including the number, value, amount and range), the number is not limited to a specific number, but can be greater than or less than the specific number, unless otherwise it is specifically indicated or principally apparent that the number is limited to the specific number.

Moreover in the description of the embodiments, it is needless to say that the constituting elements (including element steps) are not always essential unless otherwise specifically indicated or it is principally apparent that they are essential.

Similarly, in the description of the embodiments, when reference is made to a shape or positional relationship of the constituting elements, that substantially analogous or similar to it is also embraced, unless otherwise specifically indicated or it is principally apparent that it is not. This also applies to the above-described value and range.

In all of the drawings, like membershaving the same function will be identified by like reference numerals and overlapping descriptions thereof will be omitted.

In the drawings used to illustrate the below-described embodiments, even a plan view is sometimes partially hatched for facilitating an understanding of it.

In the description of embodiments, a MISFET (Metal Insulator Semiconductor Field Effect Transistor) typifying field effect transistors will be abbreviated as MIS.

The embodiments of the invention will be described more specifically based on the accompanying drawings.

Embodiment 1

Figure 2:
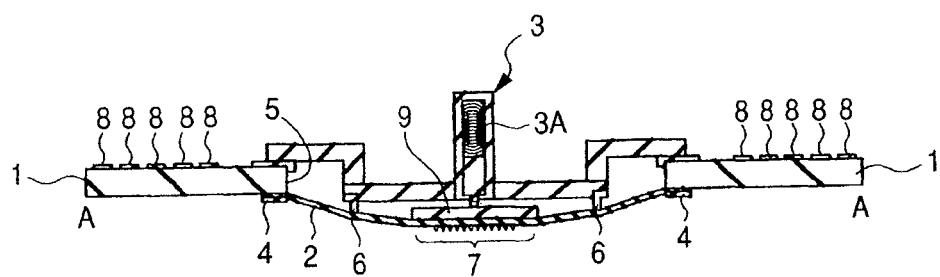
FIG. 2 is a cross-sectional view taken along a line A-A of FIG. 1.

FIG. 1 is a fragmentary plan view of the lower surface of a probe card according to Embodiment 1, and FIG. 2 is a cross-sectional view taken along a line A-A of FIG. 1.

As illustrated in FIGS. 1 and 2, the probe card (first card) of Embodiment 1 is made of, for example, a multilayer wiring substrate 1, a thin film sheet (thin film probe (first sheet)) 2 and a plunger (pressing mechanism) 3. The thin film sheet 2 is fixed to the lower surface of the multilayer wiring substrate 1 by a presser ring 4, and the plunger 3 is attached to the upper surface of the multilayer wiring substrate 1. An opening portion 5 is located at the center of the multilayer wiring substrate 1, and, in this opening portion 5, the thin film sheet 2 and the plunger 3 are bonded via an adhesive ring 6.

Over the lower surface of the thin film sheet 2, a plurality of probes (contact terminals) 7, for example, having a pyramid form or trapezoidal pyramid form are provided. In the thin film sheet 2, there are a plurality of interconnects which are electrically connected to the respective probes 7 and extend from each probe 7 to the end portion of the thin film sheet 2. Over the lower surface of the multilayer wiring substrate 1, there are a plurality of receivers (not illustrated) having an electrical contact with the end portions of the interconnects. The receivers are electrically connected, via an interconnect (first interconnect) formed in the multilayer wiring substrate 1, to POGO seats 8 disposed over the upper surface of the multilayer wiring substrate 1. These POGO seats 8 each has a function of receiving a pin for introducing signals from a tester to the probe card.

In this Embodiment 1, the thin film sheet 2 is made of, for example, a thin film composed mainly of polyimide. In this Embodiment, since such a thin film sheet 2 has flexibility, the plunger 3 is able to press, from the upper surface (reverse surface) of the thin film sheet 2 in response to a pressing tool (pressing mechanism) 9, the thin film sheet 2 in a region having the probes 7 formed therein in order to bring all the probes 7 into contact with the pad of a chip (semiconductor integrated circuit device). In other words, a certain pressure is applied to the pressing tool 9 by the elastic power of a spring 3A disposed in the plunger 3. In Embodiment 1, 42 alloy is given as one example of the material of the pressing tool 9. A probe card structured so that a plunger presses probes in order to bring all the probes into contact with the pad of a chip is described, for example, in Japanese Unexamined Patent Publication No. 2001-159643.

Figure 3:
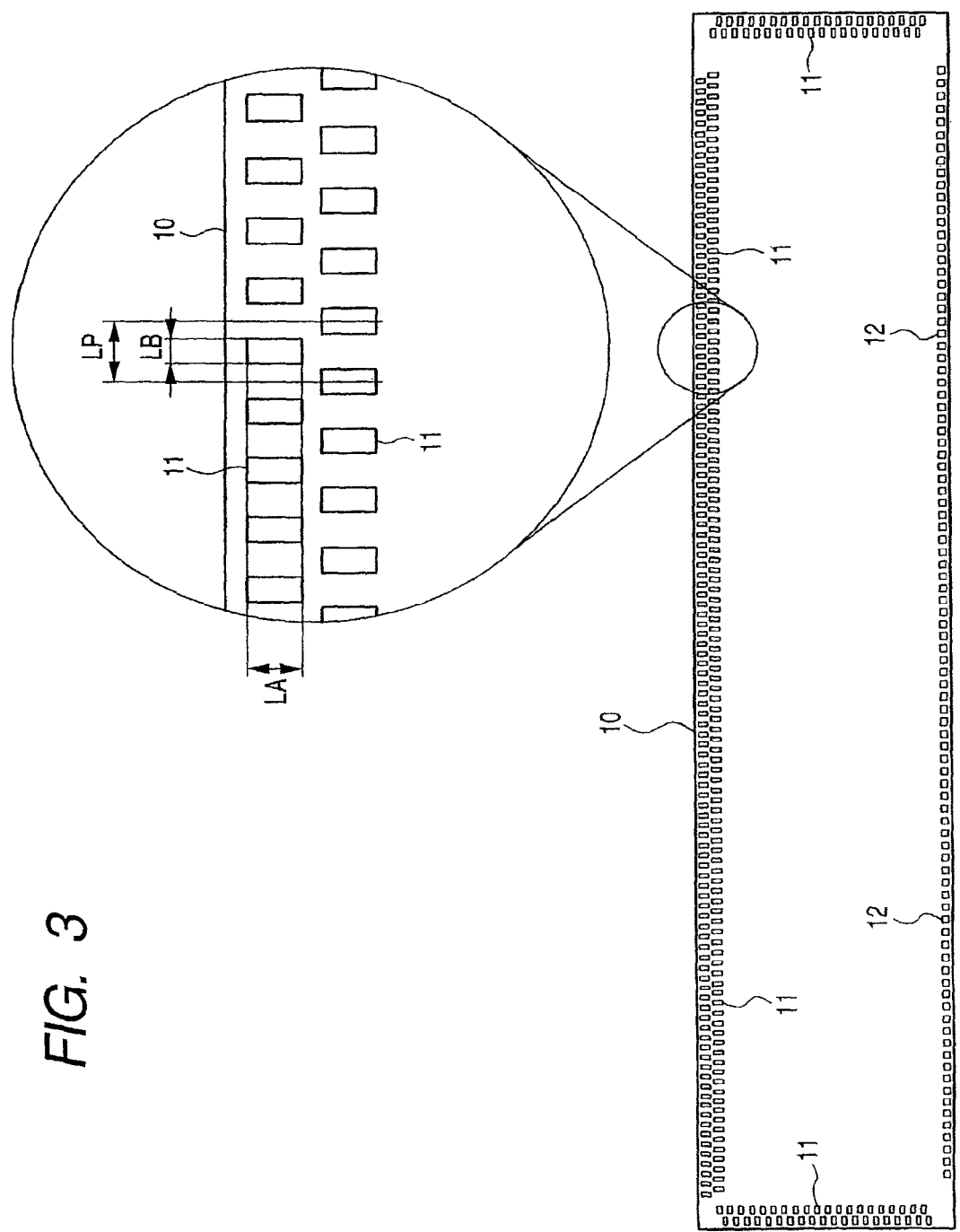
FIG. 3 is a plan view of a semiconductor chip which is subjected to probe testing with the probe card according to Embodiment 1 of the invention.
Figure 88:
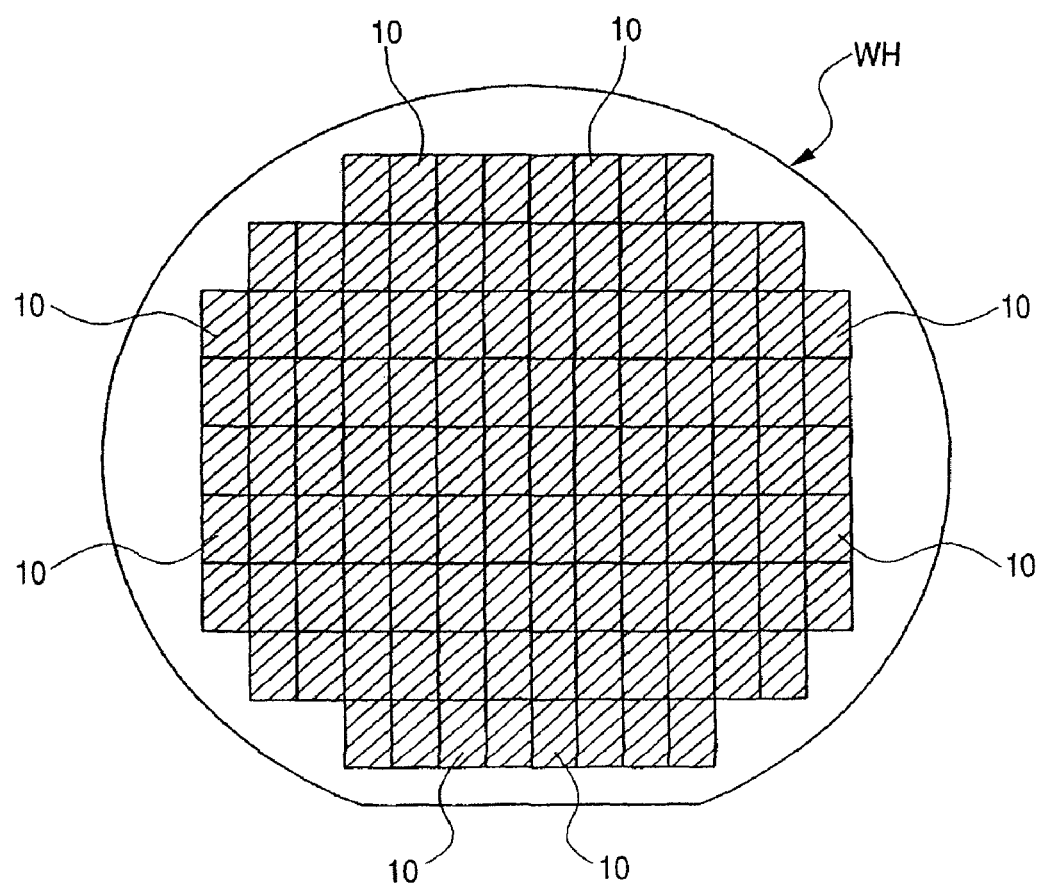
FIG. 88 is a plan view of a semiconductor wafer having, formed thereover, semiconductor chip regions which are to be subjected to probe testing using the probe card of Embodiment 1 of the invention.

In Embodiment 1, a chip having an LCD (Liquid Crystal Display) driver formed thereover, for example, is subjected to probe testing (electrical testing) using the probe card. FIG. 88 is a plan view of a wafer WH partitioned into a plurality of chips (chip regions) 10. The wafer WH partitioned into the chips 10 is subjected to probe testing using the probe card of Embodiment 1. FIG. 3 includes a plan view of the chip 10 and a partially enlarged view thereof. The chip 10 is made of, for example, a single crystal silicon substrate, and, over the main surface of the chip, an LCD driver circuit is formed. At the periphery of the main surface of the chip 10, there are a large number of pads (first electrodes) 11 and 12 which are electrically connected to the LCD driver circuit. In FIG. 3, the pads 11 arranged along the upper long side and both short sides of the chip 10 each serves as an output terminal, while pads 12 arranged along the lower long side of the chip 10 each serve as an input terminal. The number of the output terminals of the LCD driver is greater than that of the input terminals so that in order to widen the distance between two adjacent pads 11 as much as possible, the pads 11 are arranged in two rows along the upper long side and both short sides of the chip 10; and, besides, these two rows of the pads 11 on the upper long side and both short sides of the chip 10 are arranged alternately. In Embodiment 1, the pitch LP between two adjacent pads 11 is about 45 μm. In Embodiment 1, the pads 11 are each rectangular as seen in plan view. The length LA of the long side extending in a direction crossing (at right angles) with the outer circumference of the chip 10 is about 80 μm, while the length LB of the short side extending along the outer circumference of the chip 10 is about 30 μm.

Figure 4:
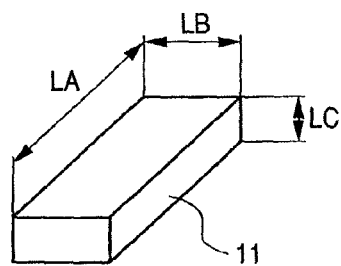
FIG. 4 is a perspective view of a pad formed over a semiconductor chip as illustrated in FIG. 3.

The pads 11 and 12 are bump electrodes (protruding electrodes) made of, for example, Au (gold) and they are formed over the input or output terminals (bonding pads) of the chip 10 by electroplating, electroless plating, deposition, sputtering or the like. FIG. 4 is a perspective view of the pad 11. The pad 11 has a height LC of about 15 μm, and the pad 12 has a similar height.

The chip 10 can be manufactured by forming LCD driver circuits (semiconductor integrated circuits) or input/output terminals (bonding pads) in a large number of partitioned chip regions over the main surface of the wafer in accordance with conventional semiconductor fabrication technology, forming the pads 11 over the input/output terminals by the above-described method, and dicing the wafer into respective chip regions. In Embodiment 1, the probe testing is performed for each chip region prior to the dicing of the wafer. Upon description of the probe testing (step by which the pads 11 and 12 are brought into contact with the probes 7) hereinafter, reference to the chip 10 will mean each chip region before the dicing of the wafer, unless otherwise specifically indicated.

Figure 5:
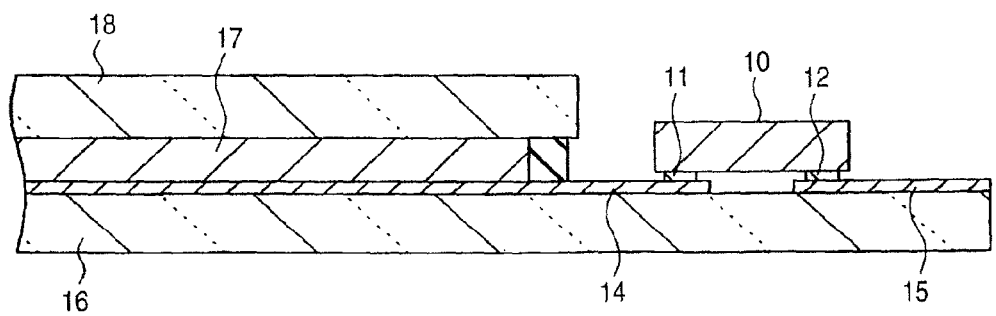
FIG. 5 is a fragmentary cross-sectional view illustrating a method of connecting the semiconductor chip, as illustrated in FIG. 4, to a liquid crystal panel.

FIG. 5 is a fragmentary cross-sectional view illustrating a method of connection of the chip 10 to a liquid crystal panel. As illustrated in FIG. 5, the liquid crystal panel has, for example, a glass substrate 16 having picture electrodes 14 and 15 formed over the main surface thereof, a liquid crystal layer 17, and a glass substrate 18 disposed opposite to the glass substrate 16 via the liquid crystal layer 17. In Embodiment 1, the chip 10 can be connected to the liquid crystal panel by facedown bonding of the chip 10 so that the pads 11 and 12 are connected to the picture electrodes 14 and 15 over the glass substrate 16 of the liquid crystal panel, respectively.

Figure 6:
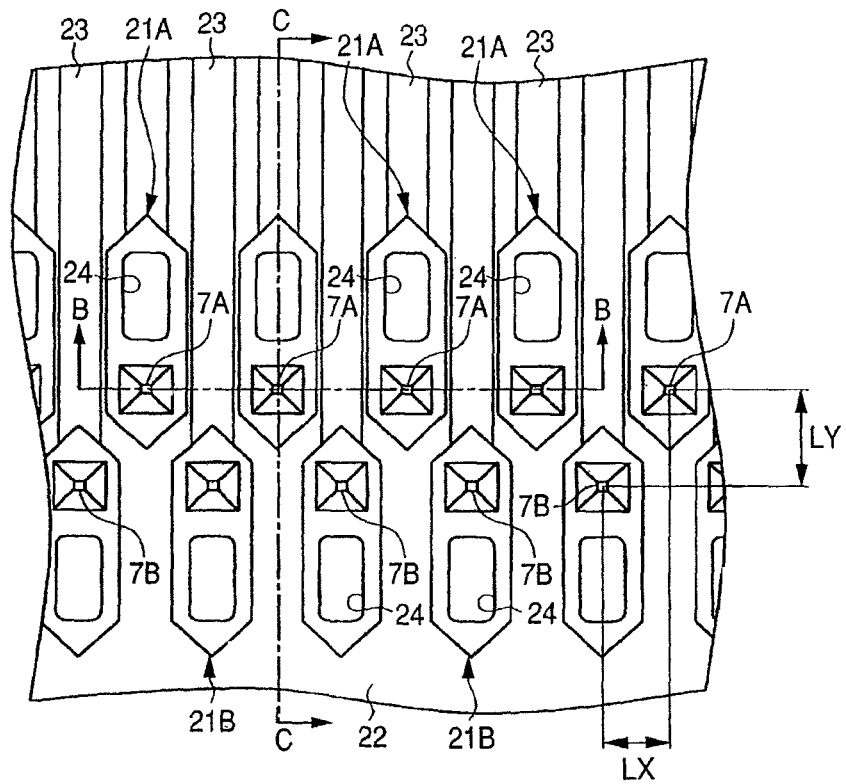
FIG. 6 is a fragmentary plan view of a thin film sheet constituting the probe card of Embodiment 1 of the invention.
Figure 7:
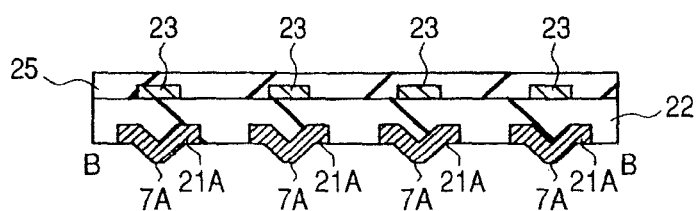
FIG. 7 is a cross-sectional view taken along a line B-B of FIG. 6.
Figure 8:
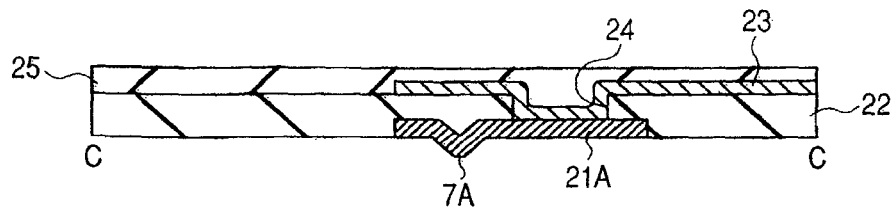
FIG. 8 is a cross-sectional view taken along a line C-C of FIG. 6.

FIG. 6 is an enlarged fragmentary plan view illustrating a portion of a region over the lower surface of the thin film sheet 2 in which the probes 7 have been formed; FIG. 7 is a fragmentary cross-sectional view taken along a line B-B of FIG. 6; and FIG. 8 is a fragmentary cross-sectional view taken along a line C-C of FIG. 6.

Each of the probes 7 is a portion of the metal film 21A or 21B which has been patterned into a hexagonal planar shape in the thin film sheet 2, and it is, of the metal film 21A or 21B, a portion which protrudes as a pyramid or trapezoidal pyramid form from the lower surface of the thin film sheet 2. The probes 7 are disposed over the main surface of the thin film sheet 2 according to the positions of the pads 11 and 12 formed over the chip 10. FIG. 6 illustrates the positions of the probes 7 corresponding to the pads 11. Of these probes 7, probes 7A correspond to the pads 11 of a row which is relatively near to the outer circumference of the chip 10 (this row will hereinafter be called "first row") among the pads 11 arranged in two rows, while probes 7B correspond to the pads 11 of the other row which is relatively far from the outer circumference of the chip 10 (which will hereinafter be called "second row") among the pads 11 arranged in two rows. The distance between the nearest two probes 7A and 7b is defined as distance LX in the horizontal direction and distance LY in the vertical direction. The distance LX is 22.5 μm, half of the pitch LP of two adjacent pads 11. In Embodiment 1, the distance LY is about 100 μm.

The metal films 21A and 21B are each formed, for example, by stacking a rhodium film and a nickel film one after another in order. A polyimide film 22 is formed over the metal films 21A and 21B, and, over the polyimide film 22, an interconnect (second interconnect) 23 is connected to each metal film 21. The interconnect 23 is in contact with the metal films 21A and 21B at the bottom of a through-hole 24 formed in the polyimide film 23. Over the polyimide film 22 and interconnect 23, a polyimide film 25 is formed.

As described above, the metal films 21A and 21B partially become the probes 7A and 7B formed in the pyramid or trapezoidal pyramid form, and in the polyimide film 22, the through-hole 24 reaching each of the metal films 21A and 21B is formed. If a plane pattern of the metal film 21A having the probe 7A formed therein and the through-hole 24, and a plane pattern of the metal film 21B having the probe 7B formed therein and the through-hole 24 are disposed in the same direction, there is a fear that, owing to the inevitable contact between the adjacent metal film 21A and metal film 21B, an input/output available from the probe 7A and that from 7B would not be independent of each other. In this Embodiment 1, as illustrated in FIG. 6, the plane pattern of the metal film 21B having the probe 7B formed therein and the through-hole 24 is obtained by turning by 180 degrees the plane pattern of the metal film 21A having the probe 7A formed therein and the through-hole 24. This makes it possible to avoid planar arrangement, on a horizontal line on the paper, of the width portion of the metal film 21A having the probe 7A and through-hole 24 arranged therein and the width portion of the metal 21B having the probe 7B and the through-hole 24 arranged therein. Instead, the forward tapered portions, as a planar shape, of the metal film 21A and metal film 21B are arranged on a horizontal line on the paper. As a result, such inconveniences as inevitable contact between the adjacent metal film 21A and metal film 21B can be prevented. In addition, even if the pads 11 are disposed at narrow pitches (refer to FIG. 3), the probes 7A and 7B can be disposed at their corresponding positions.

Figure 9:
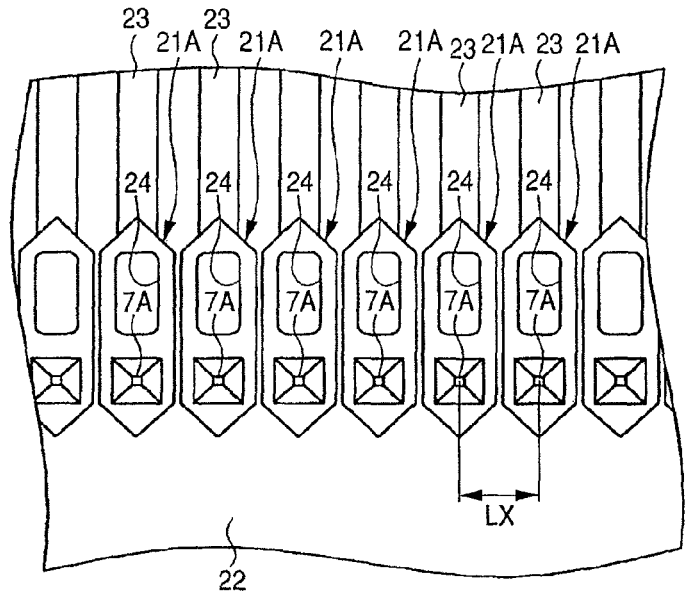
FIG. 9 is a fragmentary plan view of a thin film sheet constituting the probe card of Embodiment 1 of the invention.
Figure 10:
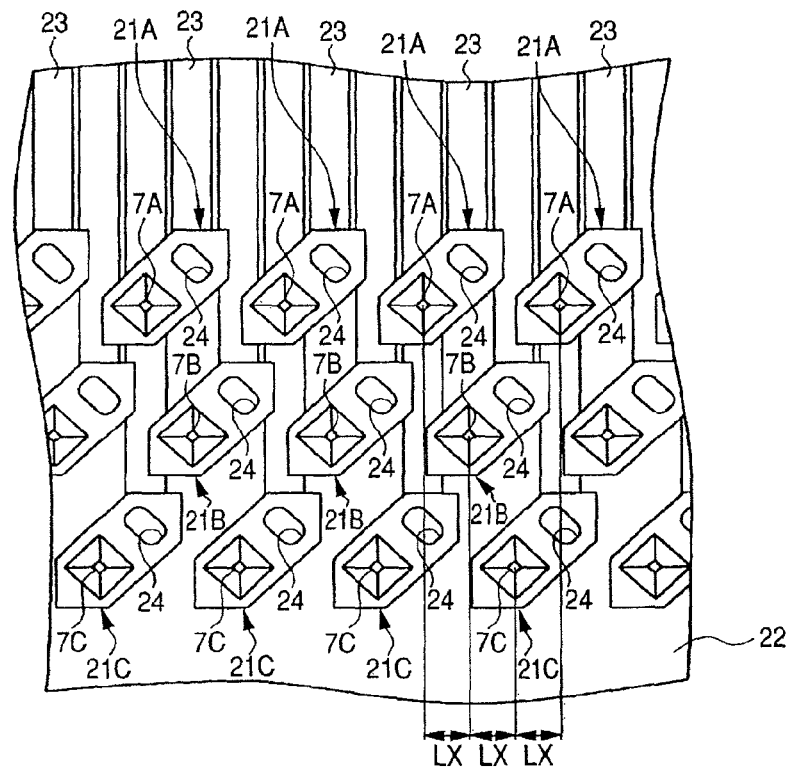
FIG. 10 is a fragmentary plan view of a thin film sheet constituting the probe card of Embodiment 1 of the invention.
Figure 11:
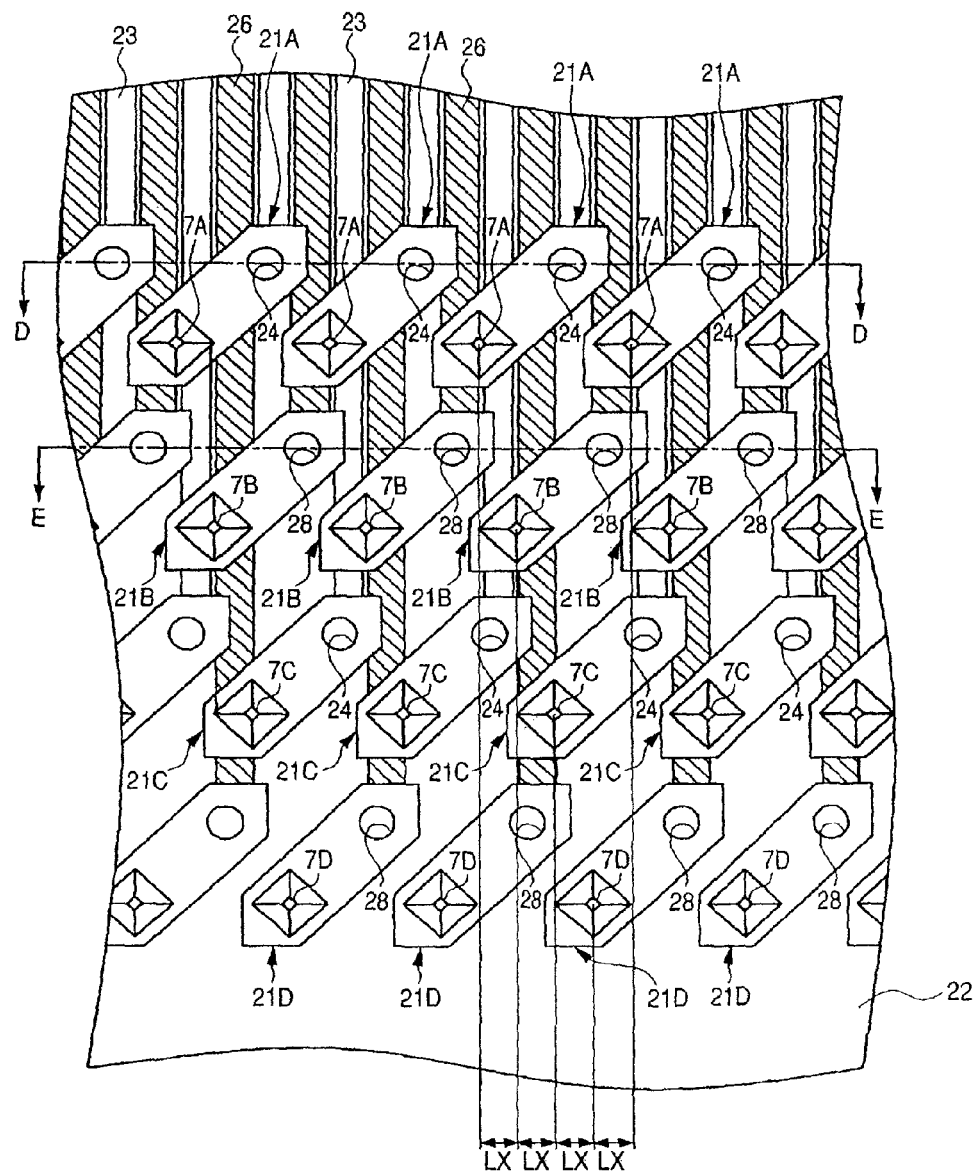
FIG. 11 is a fragmentary plan view of a thin film sheet constituting the probe card of Embodiment 1 of the invention.

In Embodiment 1, the chip having pads 11 arranged in two rows was described based on FIG. 3. When the chip has pads arranged in one row, on the other hand, a thin film sheet 2, as illustrated in FIG. 9, in which the width portions of the metal films 21A have been arranged on a horizontal line on the paper, can be used. When the chip has a greater number of the pads 11, they are sometimes arranged in at least 3 rows. FIG. 10 is a fragmentary plan view of a thin film sheet 2 suited for the pads 11 arranged in three rows, while FIG. 11 is a fragmentary plan view of a thin film sheet 2 suited for the pads 11 arranged in four rows. When the size of the chip is not changed, the distance LX as explained using FIG. 6 becomes narrower with an increase in the number of pads 11 and there is a fear that contact between the metal films, including the metal films 21A and 2aB, might occur. As illustrated in FIGS. 10 and 11, by using, as metal films 21A, 21B, 21C and 21D, those obtained by turning by 45 degrees the plane pattern of the metal film 21A of FIG. 6, such inconveniences as mutual contacts among metal films 21A, 21B, 21C and 21D can be prevented. Here, the plane pattern of the metal film 21A illustrated in FIG. 6 is turned by 45 degrees. It is needless to say that the angle of the plane pattern to be turned is not limited to 45 degrees, but it may be another angle if mutual contact among films 21A, 21B, 21C and 21D can be avoided. The metal film 21C has a probe 7C corresponding to the pad 11 which is disposed at an inner position within the chip 10 relative to the pad 11 to which the probe 7B corresponds, while the metal film 21D has a probe 7D corresponding to the pad 11 which is disposed at an inner position within the chip 10 relative to the pad 11 to which the probe 7C corresponds.

Figure 12:
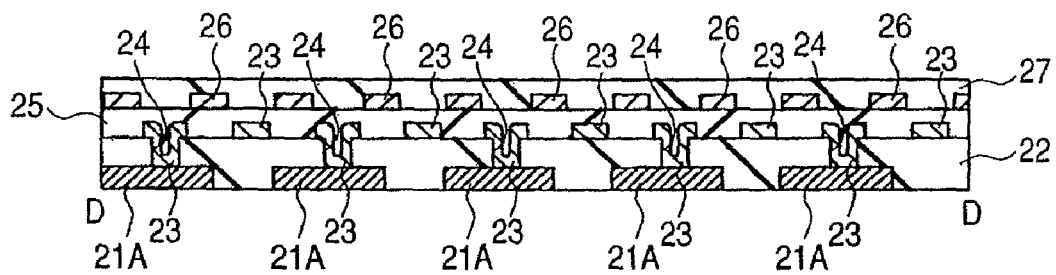
FIG. 12 is a cross-sectional view taken along a line D-D of FIG. 11.
Figure 13:
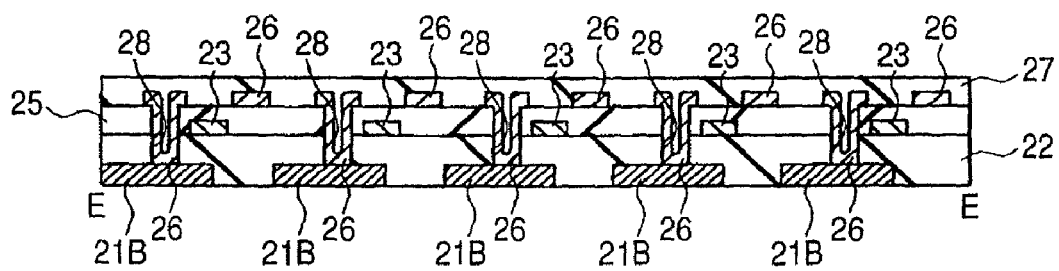
FIG. 13 is a cross-sectional view taken along a line E-E of FIG. 11.

FIG. 12 is a fragmentary cross-sectional view taken along a line D-D of FIG. 11, and FIG. 13 is a fragmentary cross-sectional view taken along a line E-E of FIG. 11. When the metal films 21A to 21D having the probes 7A to 7D corresponding to the four rows of the pads 11 are arranged as illustrated in FIG. 11, it becomes difficult to form, as one interconnect layer, all the overlying interconnects electrically connected to the metal films 21A to 21D. This is because mutual contact between the metal films 21A to 21D may occur owing to the narrowing of the distance LX, and, in addition, mutual contact between the interconnects electrically connected to the metal films 21A to 21D may occur. In Embodiment 1, these interconnects are formed as two interconnect layers (interconnects 23 and 26) as illustrated in FIGS. 12 and 13. A polyimide film 27 is formed over the interconnect 26 and polyimide film 25. The relatively lower interconnect 23 has contact with the metal films 21A and 21C on the bottom of the through-hole 24 formed in the polyimide film 22, while the relatively upper interconnect 26 has contact with the metal films 21B and 21D on the bottom of the through-hole 28 formed in the polyimide films 22 and 25. This makes it possible to keep a large distance between the two adjacent interconnects 23 or two adjacent interconnects 26 in the same interconnect layer and thereby prevent contact between the two adjacent interconnects 23 or 26. When the pads 11 are arranged in at least 5 rows, the number of probes corresponding to them increases and the distance LX becomes narrow, the distance between interconnects may be widened by increasing the number of interconnect layers.

The structure of the thin film sheet 2 of Embodiment 1 and its manufacturing steps will next be described with reference to FIGS. 14 to 23. FIGS. 14 to 23 are each a fragmentary cross-sectional view of the thin film sheet 2, which has the probes 7A and 7B corresponding to two rows of the pads 11 (refer to FIG. 3), as described with reference to FIGS. 6 to 8, during its manufacturing steps. Descriptions on the structure and manufacturing steps of a thin film sheet, and the structure and manufacturing steps of probes having a similar structure to those of the probes 7 (probes 7A to 7D) can also be found in Japanese Unexamined Patent Publications Nos. Hei 6 (1994)-22885, Hei 7 (1995)-283280, Hei 8 (1996)-50146, and Hei 8 (1996)-201427, Japanese Patent Application No. Hei 9 (1997)-119107, Japanese Unexamined Patent Publication Nos. Hei 11 (1999)-23615, 2002-139554 and Hei 10 (1998)-308423, Japanese Patent Application No. Hei 9 (1997)-189660, Japanese Unexamined Patent Publications No. Hei 11 (1999)-97471 and 2000-150594, and Japanese Patent Application No. 2002-289377, 2002-294376, 2003-189949 and 2003-74429.

Figure 14:
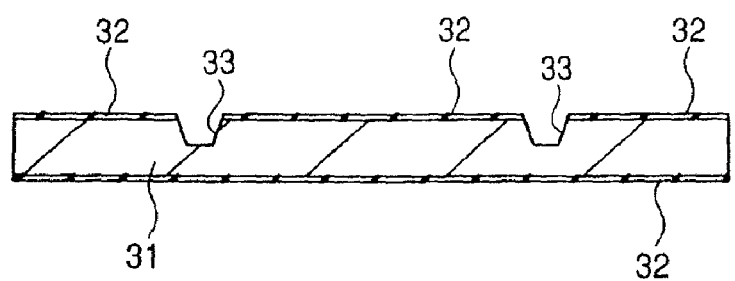
FIG. 14 is a fragmentary cross-sectional view illustrating a step in the manufacture of a thin film sheet constituting the probe card of Embodiment 1 of the invention.

As illustrated in FIG. 14, over both sides of a wafer (first substrate) 31 made of silicon having a thickness of from about 0.2 to 0.6 mm, a silicon oxide film 32 is formed to a film thickness of about 0.5 µm by thermal oxidation. Using a photoresist film as a mask, the silicon oxide film 32 over the main surface side of the wafer 31 is etched to form, in the silicon oxide film 32 over the main surface side of the wafer 31, an opening portion reaching the wafer 31. With the remaining portion of the silicon oxide film 32 as a mask, the wafer 31 is anisotropically etched with a strong aqueous alkaline solution (for example, an aqueous solution of potassium hydroxide) to form a hole (first hole) 33 in a pyramid or trapezoidal pyramid form encompassed by a (111) plane over the main surface of the wafer 31.

Figure 15:
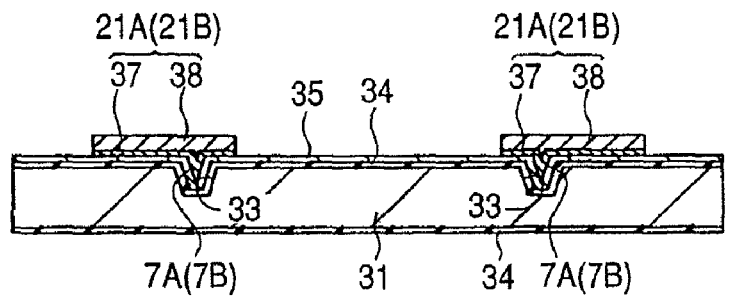
FIG. 15 is a fragmentary cross-sectional view of the thin film sheet in a manufacturing step following that of FIG. 14.

As illustrated in FIG. 15, the silicon oxide film used as a mask upon formation of the hole 33 is removed by wet etching with a mixed solution of hydrofluoric acid and ammonium fluoride. The wafer 31 is then thermally oxidized to form a silicon oxide film 34 having a thickness of about 0.5 µm all over the surface of the wafer 31, including the inside of the hole 33. Over the main surface of the wafer 31 including the inside of the hole 33, a conductive film 35 is then formed. This conductive film 35 can be formed, for example, by successively depositing a chromium film that is about 0.1 µm thick and a copper film of about 1 µm thick by sputtering or vapor deposition. After formation of a photoresist film over the conductive film 35, the photoresist film is removed by photolithography from a region in which metal films 21A and 21B (refer to FIGS. 6 to 8) will be formed by a subsequent step, whereby an opening portion is formed.

By electroplating using the conductive film 35 as an electrode, a highly hard conductive film (first metal film) 37 and a conductive film (first metal film) 38 are deposited successively over the conductive film 35 which has appeared on the bottom of the opening of the photoresist film. In Embodiment 1, for example, a rhodium film is used as the conductive film 37, while a nickel film is used as the conductive film 38. By the steps so far described, the metal film 21A or 21B can be formed from the conductive films 37 and 38. The conductive films 37 and 38 in the hole 33 become the probe 7A or 7B. The conductive film 35 will be removed by the next step, but that step will be described in detail later.

In the metal film 21A or 21B, the conductive film 37 made of a rhodium film will be a surface film when the probe 7A or 7B is formed in the later steps and the conductive film 37 will be brought into direct contact with the pad 11. For the conductive film 37, a material having high hardness and excellent abrasion resistance is preferably selected. The conductive film 37 is brought into direct contact with the pad 11 so that when shavings of the pad 11 by the probe 7A or 7B attach to the conductive film 37, a cleaning step for removing the shavings becomes necessary, which may unfortunately prolong the probe testing step. As the material for the conductive film 37, a material resistant to adhesion of the material forming the pad 11 is preferably selected. In Embodiment 1, a rhodium film capable of satisfying these conditions is selected as the conductive film 37. This make it possible to omit the cleaning step. Since the conductive film 37 has a higher strength and abrasion resistance with an increase in its thickness, formation of a thicker film is preferred to prolong the life of the probe 7A or 7B. The rhodium film as the conductive film 37, however, exhibits a plating stress during film formation, and this plating stress increases as the film becomes thicker. This plating stress acts on the interface between the silicon oxide film 34 and the conductive film 35 so that there is a fear that an increased plating stress may inconveniently cause peeling of the silicon oxide film 34 from the conductive film 35. It is therefore preferred, as one countermeasure against it, to make the conductive film 37 as thick as possible within a range not causing peeling of the silicon oxide film 34 from the conductive film 35. In Embodiment 1, for example, the thickness of this conductive film 37 is adjusted to fall within a range of from about 1 µm or greater to the maximum thickness (for example, about 4 µm) which can be formed actually by electroplating. The thickness is preferably from about 2 µm to 3.5 µm, more preferably about 2.5 µm. According to an experiment made by the present inventors with regard to abrasion resistance, a conductive film 37 having a thickness of about 2 µm withstood contact about 1000,000 times between the probe 7A or 7B and the pads 12 in the probe testing. During the formation of the nickel film serving as the conductive film 38, a plating stress also occurs, though the stress is not greater than that of the conductive film 37. It is therefore preferred to adjust the thickness of the conductive film 38 to fall within a range not permitting peeling of the silicon oxide film 34 from the conductive film 35.

Figure 16:
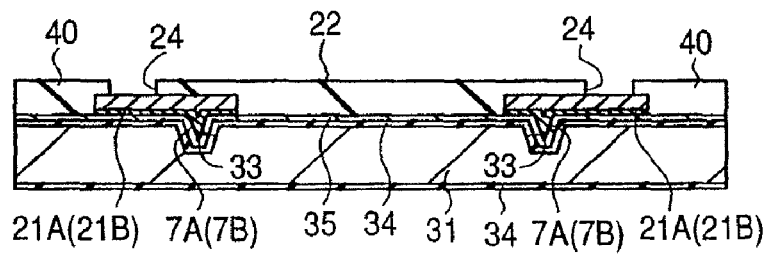
FIG. 16 is a fragmentary cross-sectional view of the thin film sheet in a manufacturing step following that of FIG. 15.

After removal of the photoresist film employed for the formation of the metal film 21A or 21B (conductive films 37 and 38), a polyimide film (first polyimide film) 22 (refer also to FIGS. 7 and 8) is formed to cover the metal film 21A or 21B, and the conductive film 35, as illustrated in FIG. 16. The through-hole (first opening portion) 24 reaching the metal film 21A or 21B is formed in the polyimide film 22. It can be formed by laser beam drilling or dry etching using an aluminum film as a mask.

Figure 17:
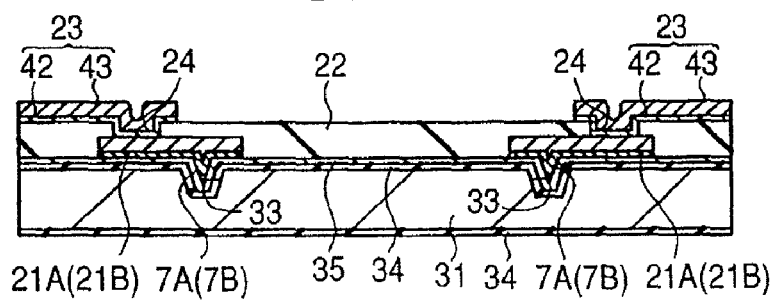
FIG. 17 is a fragmentary cross-sectional view of the thin film sheet in a manufacturing step following that of FIG. 16.

As illustrated in FIG. 17, a conductive film (second metal film) 42 is formed over the polyimide film 22 including the inside of the through-hole 24. This conductive film 42 can be formed, for example, by depositing a chromium film which is about 0.1 µm thick and a copper film which is about 1 µm thick successively by sputtering or vapor deposition. After formation of a photoresist film over the conductive film 42, the photoresist film is patterned by photolithography to form, in the photoresist film, an opening portion reaching the conductive film 42. By plating, a conductive film (second metal film) 43 is then formed over the conductive film 42 in the opening portion. In Embodiment 1, a film obtained by stacking a copper film as the conductive film 43 and then a copper or nickel film in this order can be given as one example.

After removal of the photoresist film, the conductive film 42 is etched using the conductive film 43 as a mask, whereby an interconnect 23 made of the conductive films 42 and 43 is formed. The interconnect 23 can be electrically connected to the metal film 21A or 21B on the bottom of the through-hole 24.

Figure 18:
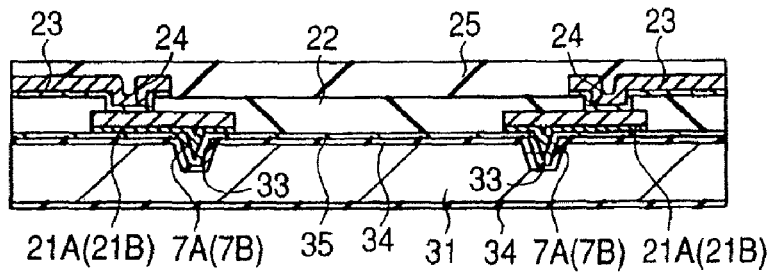
FIG. 18 is a fragmentary cross-sectional view of the thin film sheet in a manufacturing step following that of FIG. 17.

As illustrated in FIG. 18, the polyimide film (second polyimide film) 25, as described before, is formed over the main surface of the wafer 31. The polyimide film 25 functions as an adhesive layer of a metal sheet to be fixed onto the main surface of the wafer 31 in the subsequent step.

Figure 19:
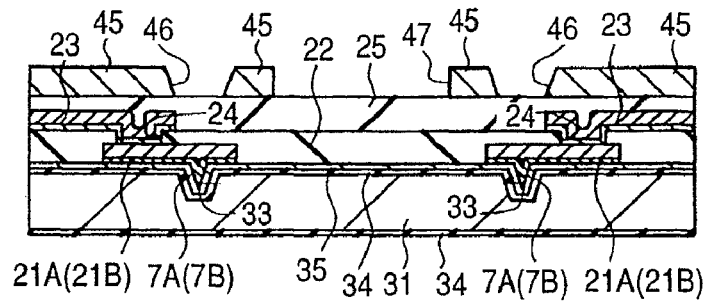
FIG. 19 is a fragmentary cross-sectional view of the thin film sheet in a manufacturing step following that of FIG. 18.

As illustrated in FIG. 19, a metal sheet (second sheet) 45 is then fixed to the upper surface of the polyimide film 25. As a material for the metal sheet 45, a material having a low linear expansion coefficient and moreover having a linear expansion coefficient close to that of the wafer 31 made of silicon is selected. In Embodiment 1, 42 alloy (an alloy containing 42% nickel and 58% iron and having a linear expansion coefficient of 4 ppm/° C.) or an invar (an alloy containing 36% nickel and 64% iron and having a linear expansion coefficient of 1.5 ppm/° C.) can be given as an example. Instead of using the metal sheet 45, a silicon film similar to the wafer 31 in material quality may be formed, or a material having a linear expansion coefficient comparable to that of silicon, for example, an alloy of iron, nickel and cobalt or a mixed material of ceramic and a resin, may be used. Such a metal sheet 45 can be fixed by laying it over the main surface of the wafer 31 so as to avoid misalignment, and then heating at a temperature at least equal to the glass transition point of the polyimide film 25 under pressure of from 10 to 200 kgf/cm2 to perform bonding under pressure and heat.

The thin film sheet 2 having improved strength can be obtained by fixing the metal sheet 45 thereto using the polyimide film 25. When the metal sheet 45 is not fixed, a misalignment of the position of the probe 7A or 7B and the position of the pad 11 may occur owing to the expansion or shrinkage of the thin film sheet 2 and the wafer to be tested as influenced by the temperature upon probe testing. This may lead to an inconvenience such as contact failure between the probe 7A or 7B and the corresponding pad 11. According to Embodiment 1, on the other hand, an expansion or shrinkage amount of the thin film sheet 2 and the wafer to be tested, which will otherwise vary depending on the temperature upon probe testing, can be made uniform by fixing the metal sheet 45 to the wafer. This makes it possible to prevent the misalignment of the probe 7A or 7B with the corresponding pad 11. In other words, it becomes possible for the probe 7A or 7B to maintain electrical contact with the corresponding pad 11 irrespective of the temperature upon probe testing. In addition, it becomes possible to maintain relative positional accuracy between the thin film sheet 2 and the wafer to be tested under various conditions.

Using a photoresist film patterned by photolithography as a mask, the metal sheet 45 is etched to form an opening portion (second opening portion) 46 in the metal sheet 45 over the probe 7A or 7B and an opening portion (third opening portion) 47 in the metal sheet 45 over a region (first region) between the metal films 21A or the metal films 21B, as seen in plan view. In Embodiment 1, spray etching using an iron chloride solution is employed for the above-described etching.

Figure 20:
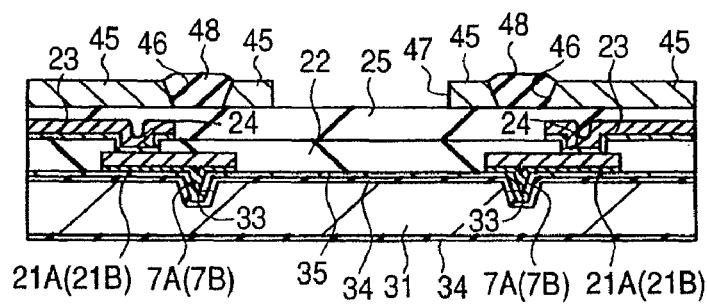
FIG. 20 is a fragmentary cross-sectional view of the thin film sheet in a manufacturing step following that of FIG. 19.

After removal of the photoresist film, an elastomer (elastic material) 48 is formed in the opening 46, as illustrated in FIG. 20. The elastomer 48 is formed in such a manner that a predetermined amount of it protrudes from the opening portion 46. In Embodiment 1, the elastomer 48 is formed, for example, by applying an elastic resin to the inside of the opening portion 46 by printing or dispenser coating, or by disposing a silicon sheet. The elastomer 48 absorbs the difference in the height of the tip portions of a number of the probes 7A or 7B by partial deformation while relaxing the impact caused by the contact of the tip portions of the probes 7A or 7B with the pads 11. Thus, the elastomer 48 absorbs the difference in the height of the pad 11 by its elasticity and accomplishes the needed contact between each probe 7A or 7B and the pad 11.

Figure 21:
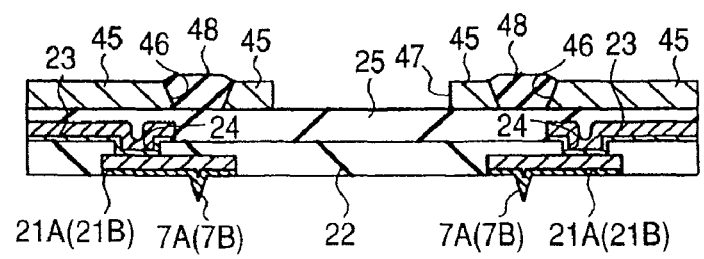
FIG. 21 is a fragmentary cross-sectional view of the thin film sheet in a manufacturing step following that of FIG. 20.

As illustrated in FIG. 21, the silicon oxide film 34 on the reverse side of the wafer 31 is removed by etching, for example, with a mixed solution of hydrofluoric acid and ammonium fluoride. The wafer 31 which is a shape for the formation of the thin film sheet 2 is then removed by etching with a strong aqueous alkali solution (for example, an aqueous solution of potassium hydroxide). The silicon oxide film 34 and conductive film 35 are removed successively by etching. The silicon oxide film 34 is etched using a mixture of hydrofluoric acid and ammonium fluoride, the chromium film constituting the conductive film 35 is etched using an aqueous solution of potassium permanganate, and the copper film constituting the conductive film 35 is etched with an alkaline copper etchant. By the steps so far mentioned, the rhodium film which constitutes the conductive film 37 (refer to FIG. 15) forming the probe 7A or 7B is exposed from the surface of the probe 7A or 7B. As described above, the probe 7A or 7B having the rhodium film as the surface film thereof is resistant to adhesion of a material, such as Au, of the pad 11 with which the probe 7A or 7B is brought into contact, has a higher hardness than Ni, and is not oxidized easily, so that stable contact resistance can be attained.

Figure 22:
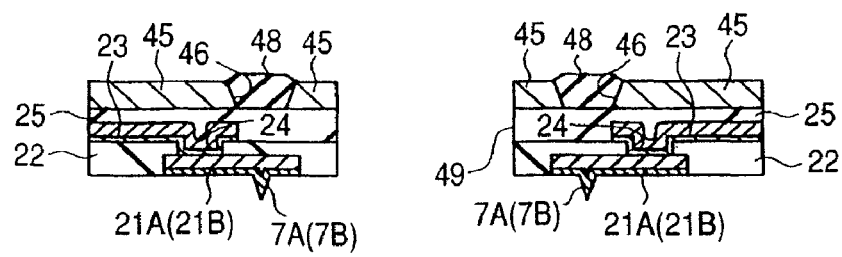
FIG. 22 is a fragmentary cross-sectional view of the thin film sheet in a manufacturing step following that of FIG. 21.
Figure 23:
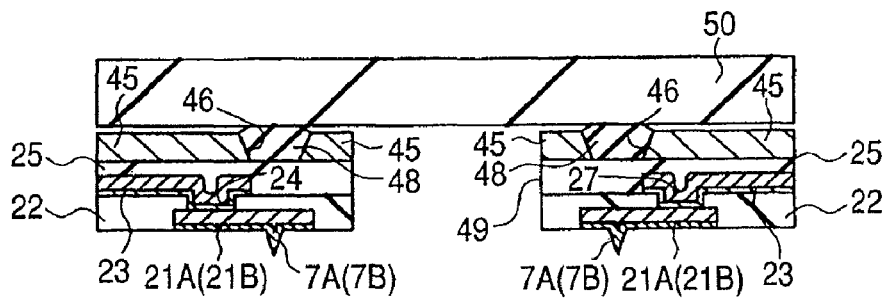
FIG. 23 is a fragmentary cross-sectional view of the thin film sheet in a manufacturing step following that of FIG. 22.

As illustrated in FIG. 22, the polyimide films 25 and 22 below the opening portion 47 are removed to form an opening portion 49. This opening portion 49 can be formed by laser beam drilling or dry etching using the metal sheet 45 and elastomer 48 as a mask. As illustrated in FIG. 23, a pressing tool 50 made of, for example, 42 alloy is then bonded onto the elastomer 48 as illustrated in FIG. 23, whereby the thin film sheet 2 of Embodiment 1 is formed.

Figure 24:
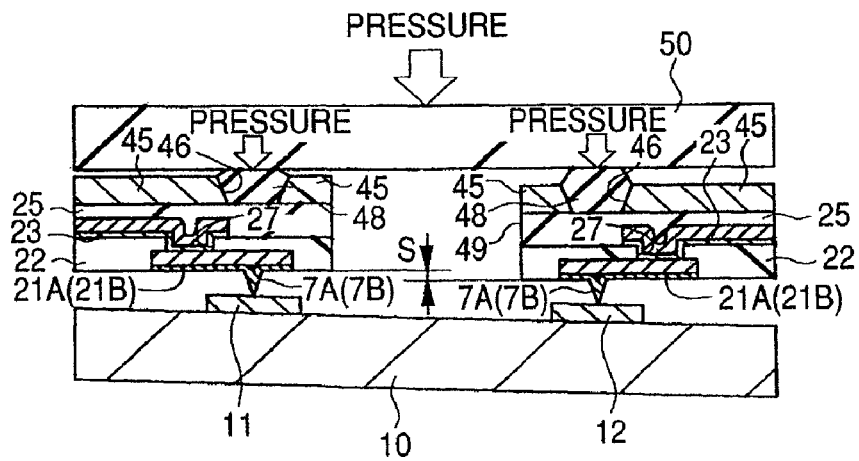
FIG. 24 is a fragmentary cross-sectional view illustrating the contact between a probe of the thin film sheet constituting the probe card of Embodiment 1 of the invention and a pad of a semiconductor chip.

The thin film sheet 2 of Embodiment 1 thus formed by the above-described steps has improved rigidity because it has the metal sheet 45 adhered thereto. As illustrated in FIG. 24, if the wafer (chip 10) to be tested has warpage, there occurs a difference S in the height between the pad 11 and the pad 12. There is a fear that this difference S may cause an inconvenience, that is, interference with the contact between the relatively short pad 12 and the probe 7A or 7B. However, the rigidity of the thin film sheet 2 lowers, because the opening portion 49 is formed between the metal films 21A (metal films 21B). When a pressure is applied by the pressing tool 50 upon probe testing, it is possible to impart the thin film sheet 2 with a step difference in the opening portion 49 within a range of elastic deformation of the elastomer 48. As a result, the thin film sheet 2 is able to have a step difference to eliminate the difference S, making it possible to bring all the probes 7A or 7B into contact with the pads 11 or 12 without failure.

Figure 25:
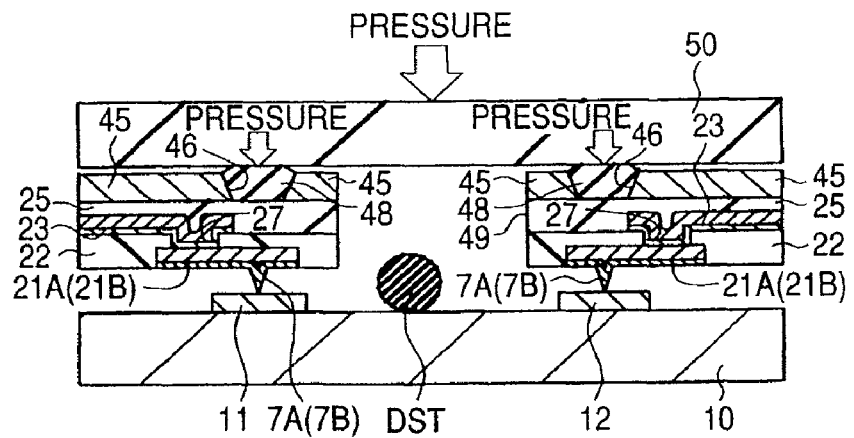
FIG. 25 is a fragmentary cross-sectional view illustrating the contact between a probe of the thin film sheet constituting the probe card of Embodiment 1 of the invention and a pad of a semiconductor chip.

As illustrated in FIG. 25, there is a fear that when the probe 7A or 7B is brought into contact with the pad 11 or 12, absence of the opening portion 49 in the thin film sheet 2 causes the thin film sheet 2 to run on dust DST, if any, which has adhered to the main surface of the wafer (chip 10) to be tested, and the contact between the probe 7A or 7B with the pad 11 or 12 cannot be accomplished. There is another fear that the deformation of the thin film sheet 2 may occur when the thin film sheet 2 runs on the dust DST. Particularly, the existence of dust DST in the vicinity of the probe 7A or 7B may presumably cause an inconvenience by embedding the probe 7A or 7B inside of the thin film sheet 2. The probability of the occurrence of such inconveniences can be reduced by forming the opening portion 49 and positioning the dust DST within the opening portion 49 when viewed from the top.

The plane pattern of the opening portion 49 will next be described. FIGS. 26, 28, 30, 32 and 34 are fragmentary plan views of the lower surface of the thin film sheet 2, while FIGS. 27, 29, 31, 33 and 35 are fragmentary cross-sectional views taken along a line F-F of FIGS. 26, 28, 30, 32 and 34, respectively.

Figure 26:
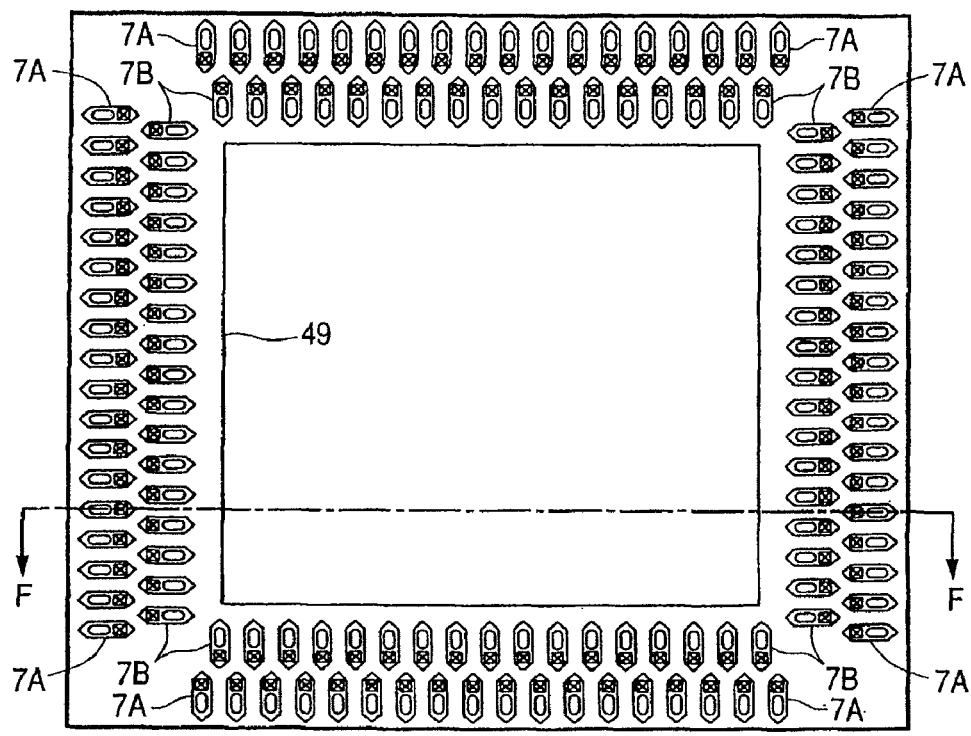
FIG. 26 is a fragmentary plan view of a thin film sheet constituting the probe card of Embodiment 1 of the invention.
Figure 27:
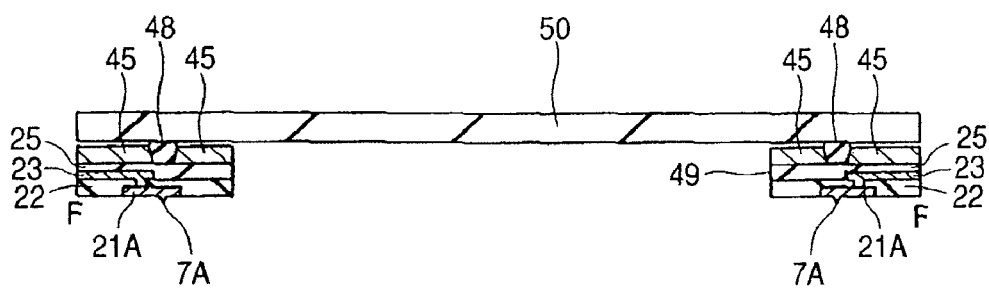
FIG. 27 is a fragmentary cross-sectional view taken along a line F-F of FIG. 26.
Figure 28:
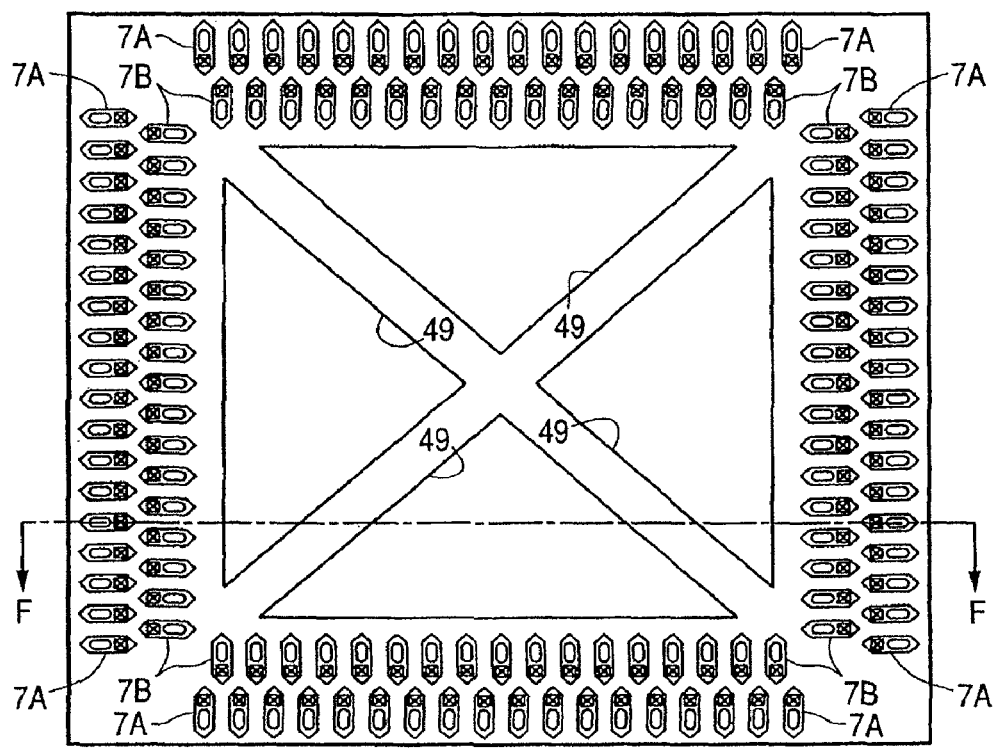
FIG. 28 is a fragmentary plan view of a thin film sheet constituting the probe card of Embodiment 1 of the invention.
Figure 29:
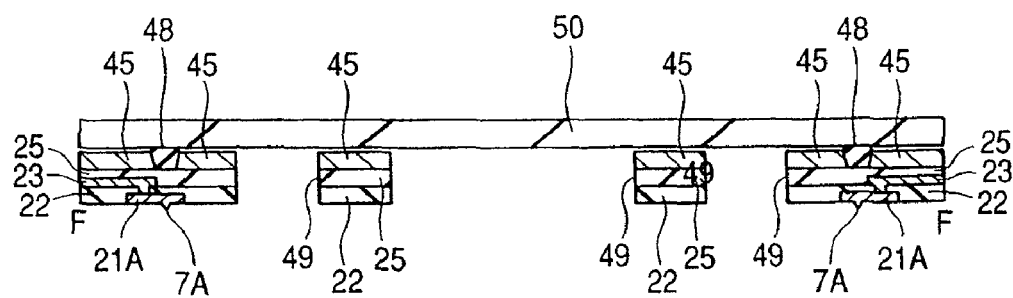
FIG. 29 is a fragmentary cross-sectional view taken along a line F-F of FIG. 28.
Figure 30:
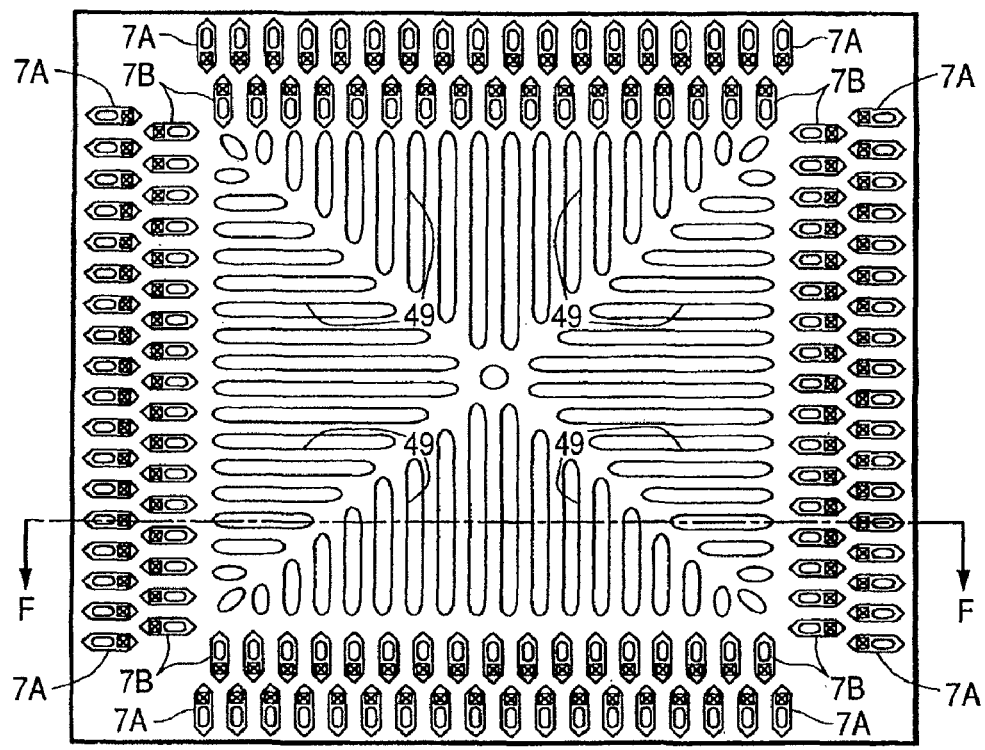
FIG. 30 is a fragmentary plan view of a thin film sheet constituting the probe card of Embodiment 1 of the invention.
Figure 31:
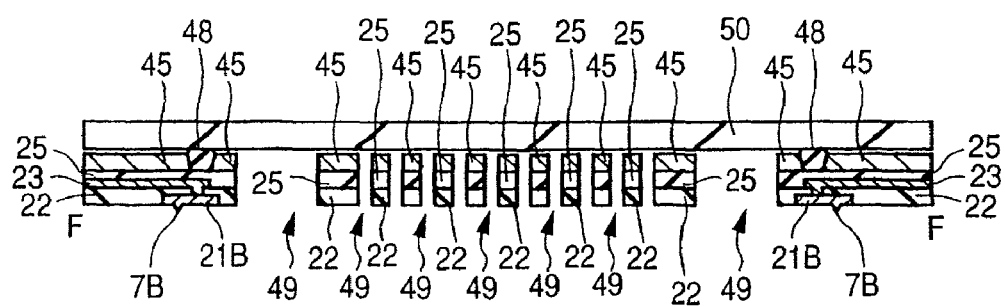
FIG. 31 is a fragmentary cross-sectional view taken along a line F-F of FIG. 30.
Figure 32:
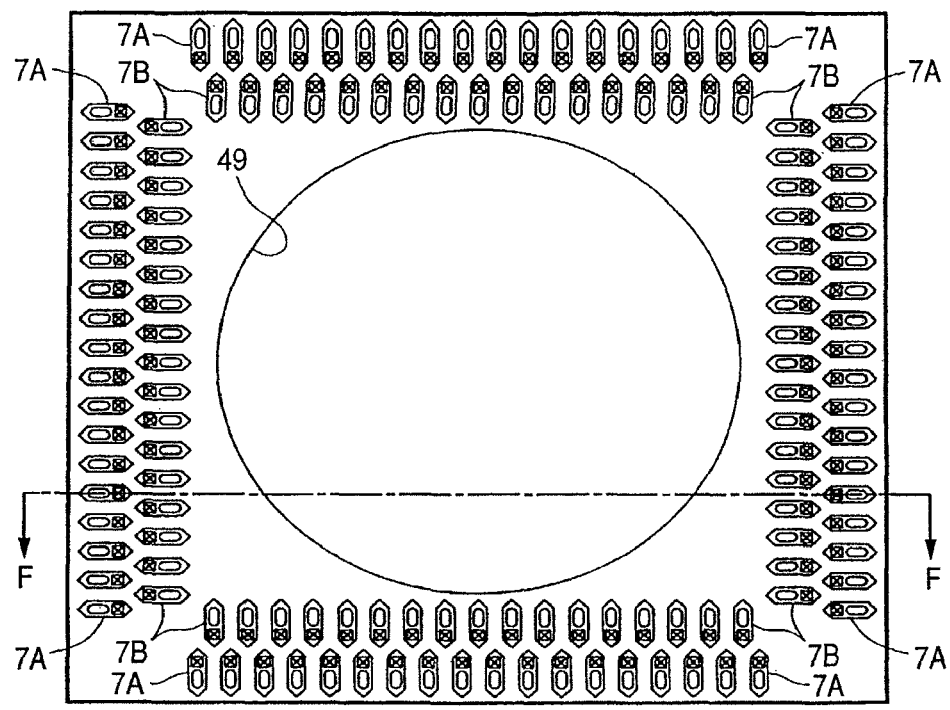
FIG. 32 is a fragmentary plan view of a thin film sheet constituting the probe card of Embodiment 1 of the invention.
Figure 33:
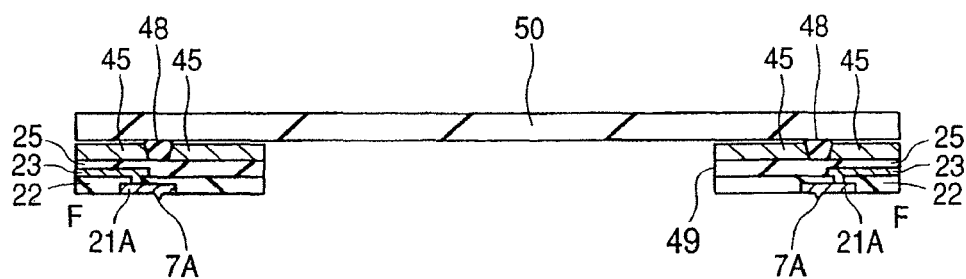
FIG. 33 is a fragmentary cross-sectional view taken along a line F-F of FIG. 32.
Figure 34:
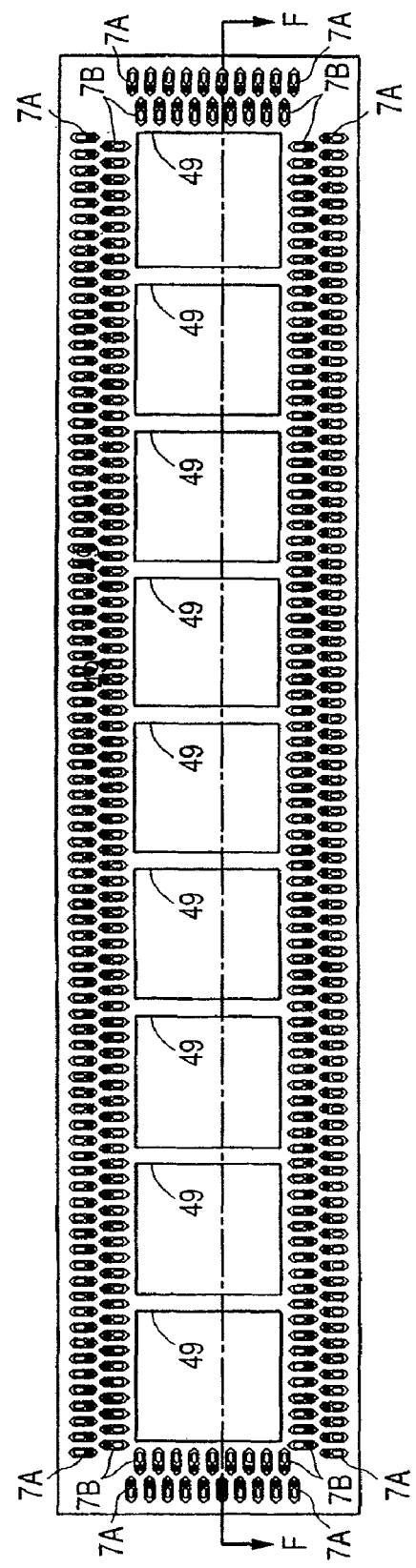
FIG. 34 is a fragmentary plan view of a thin film sheet constituting the probe card of Embodiment 1 of the invention.
Figure 35:
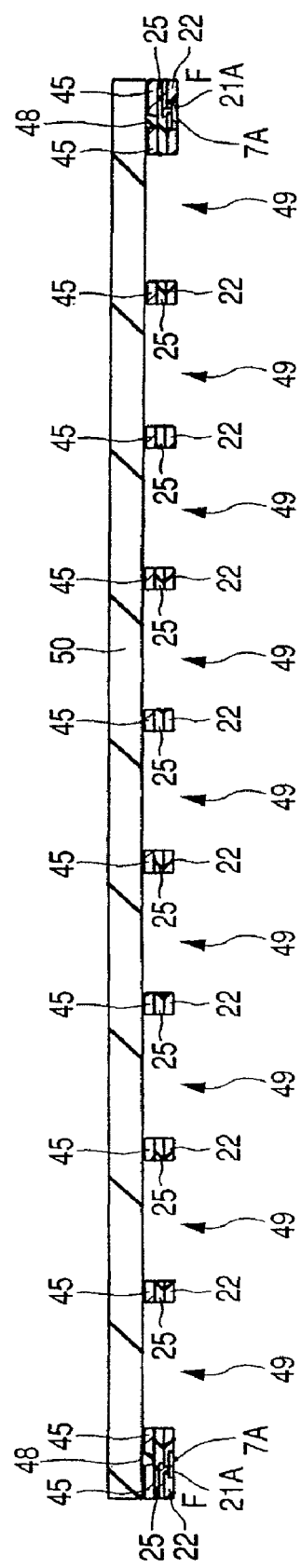
FIG. 35 is a fragmentary cross-sectional view taken along a line F-F of FIG. 34.

In Embodiment 1, a rectangular pattern as illustrated in FIG. 26 can be given as one example of the plane pattern of the opening portion 49. When the rigidity of the thin film sheet 2 lowers excessively by adopting such a plane pattern, the polyimide films 22 and 25, and the metal sheet 45 may be left like a beam diagonally in the opening portion 49, which is rectangular as seen in plan view. By this, the thin film sheet 2 can maintain desired rigidity. As illustrated in FIG. 30, it is possible to form slit-like opening portions 49, as illustrated in FIG. 30, and leave the polyimide films 22 and 25 and the metal sheet 45 as a beam, as described above. By this, a desired rigidity of the thin film sheet 2 can also be maintained. The time spent for forming slit-like openings 49 can be shortened by using laser beam drilling, as described with reference to FIG. 22. When the pressing ring 4, adhesion ring 6 and pressing tool 50, as described with reference to FIGS. 1 and 2, each has a disk planar shape, the opening portion 49 may have a disk planar shape, as illustrated in FIG. 32. When the pattern of each of the adhesion ring 6 and pressing tool 50 has a disk planar, shape but the opening portion 49 is rectangular in plan view, on the other hand, there is a fear that an unnecessary force will concentrate on the angles of the rectangular pattern. However, it is possible to prevent concentration of an unnecessary force by using a pattern of disk planar shape for the opening portion. As described with reference to FIG. 3, the chip 10 to be tested has a rectangular shape, as seen in plan view, having long sides and short sides. As illustrated in FIG. 34, it is possible to form opening portions 49 which have a rectangular shape, as seen in plan view, having short sides and long sides, and to leave the polyimide films 22 and 25 and the metal sheet 45 in the pattern as a plurality of beams extending in the direction along the short sides. By this structure, the desired rigidity of the thin film sheet 2 can be maintained.

Embodiment 2

A description will next be made of Embodiment 2.

Figure 36:
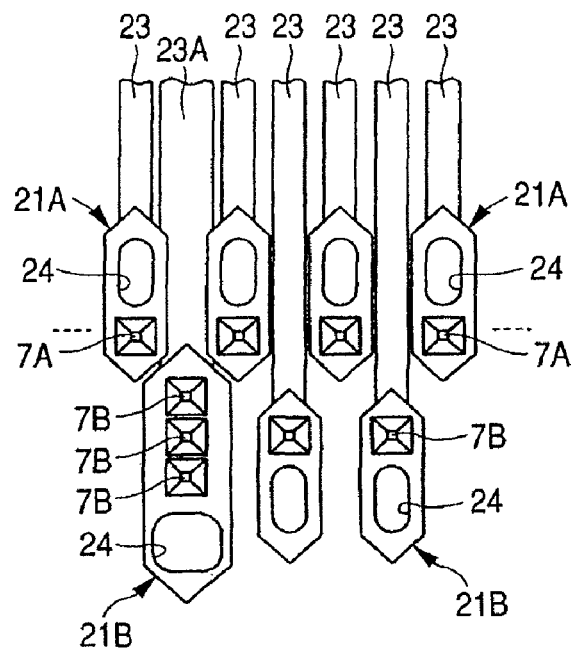
FIG. 36 is a fragmentary plan view of a thin film sheet constituting a probe card of Embodiment 2 of the invention.
Figure 37:
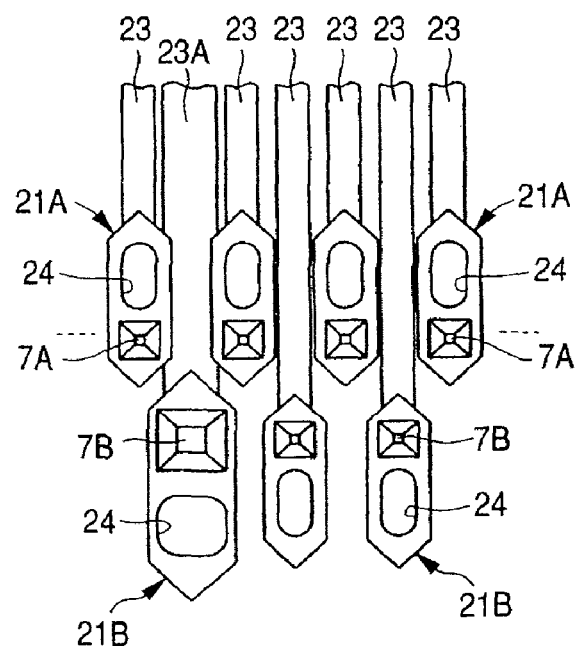
FIG. 37 is a fragmentary plan view of a thin film sheet constituting the probe card of Embodiment 2 of the invention.

A relatively high current flows in some of the pads 11 and 12, which were described with reference to FIG. 3 in conjunction with Embodiment 1. When all of the probes 7A or 7B have the same size, an electrical load applied to the probe 7A or 7B to be brought into contact with the pad 11 or 12 through which a relatively high current flows increases. With an increase in the electrical load, the probe 7A or 7B which becomes hot may inevitably be welded with the pad 11 or 12 or the probe 7A or 7B may be broken. In Embodiment 2, as illustrated in FIG. 36, a plurality of probes (first contact terminals) 7B (or probes (first contact terminals) 7A) are disposed for the metal film 21B (or metal film 21A) which is opposite to the pad 11 or 12 through which a relatively high current flows, and the total contact area (first contact area) of the probes 7B (or probes 7A) and the pad 11 or 12 through which a relatively high current flows is made greater than the total contact area (second contact area) of the other probe (second contact terminal) 7B (or probe (second contact terminal) 7A) and the pad 11 or 12. An interconnect 23A electrically connected to the metal film 21B (or metal film 21A) equipped with the probes 7B (or probes 7A) is formed so that its width would be greater than that of the other interconnect 23. This makes it possible to reduce the contact resistance between the probe 7B (or probe 7A) and the pad 11 or 12 through which a relatively high current flows and, moreover, to reduce the resistance of the interconnect 23, whereby the electrical load applied to the probe 7B (or probe 7A) can be decreased. As a result, the occurrence of such inconveniences as described above can be prevented.

Figure 38:
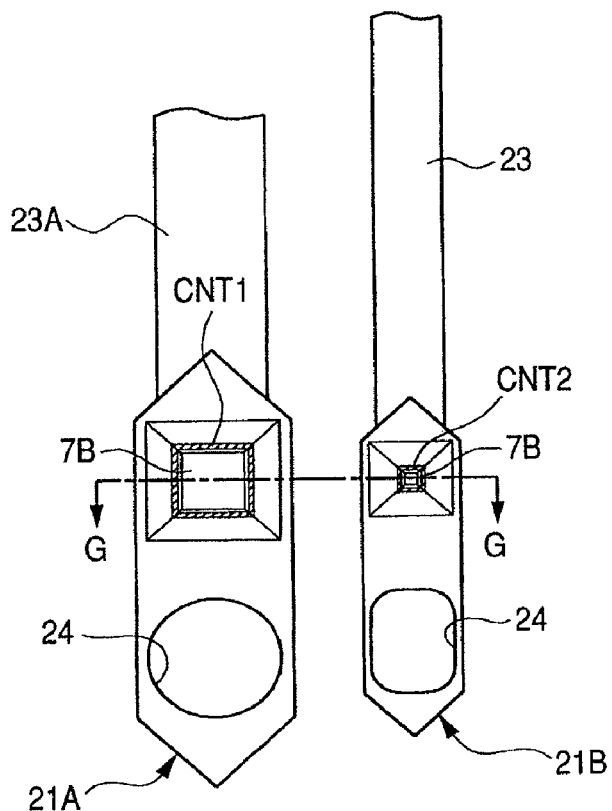
FIG. 38 is a fragmentary plan view of a thin film sheet constituting the probe card of Embodiment 2 of the invention.

Instead of providing the metal film 21B (or metal film 21A), which is opposite to the pad 11 or 12 through which a relatively high current flows, with a plurality of probes 7B (or probes 7A), the metal film 21B (or metal film 21A) may be equipped with a probe 7B (or probe 7A) having a relatively large size. Since a thin natural oxide film has been formed over the surface of the pad 11 or 12, the probe 7B (or probe 7A) breaks the natural oxide film and forms an electrical contact with the pad 11 or 12 on the side surface. FIG. 38 is a fragmentary plan view illustrating an electrical contact area of the probe 7B and pad 11 or 12, in which an electrical contact area CNT1 between the probe 7B of a relatively great size and the pad 11 or 12 and an electrical contact area CNT2 between the probe 7B of a relatively small size and the pad 11 or 12 are illustrated. These electrical contact areas CNT1 and CNT2 are illustrated with diagonal lines. By disposing the probe 7B (or probe 7A) having a relatively large size, the electrical contact area CNT1 of the probe 7B (or probe 7A) having a relatively large size can be made greater than the electrical contact area CNT2 of the probe 7B (or probe 7A) having a relatively small size. This makes it possible to reduce the contact resistance between the pad 11 or 12 through which a relatively great current flows and the probe 7B (or probe 7A). It is preferred to adjust the ratio of the electrical contact area CNT1 to the electrical contact area CNT2 to be greater than the ratio of current flowing through the probe 7B (or probe 7A) having a relatively large size to current flowing through the probe 7B (or probe 7A) having a relatively small size.

Figure 39:
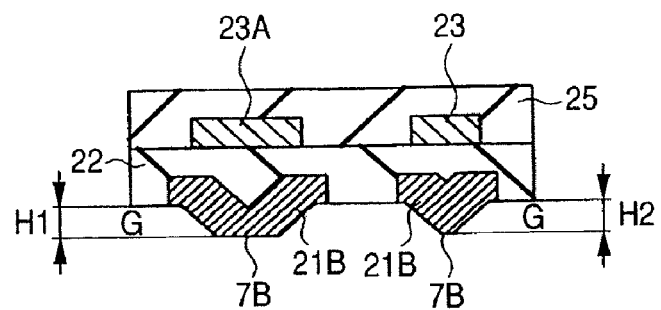
FIG. 39 is a fragmentary cross-sectional view taken along a line G-G of FIG. 38.

When the probe 7B (or probe 7A) of a relatively great size is formed as described above, the height H1 of the probe 7B (or probe 7A) of a relatively great size and the height H2 of the probe 7B (or probe 7A) of a relatively small size are adjusted to be equal, as illustrated in FIG. 39. This makes it possible to bring all the probes 7A and 7B into contact with the pads 11 and 12 without failure.

Embodiment 3

A description will next be made of Embodiment 3.

When the probes 7A or 7B (refer to FIGS. 6 to 8) as described in conjunction with in Embodiments 1 and 2 are brought into contact with the pad 11 or 12 (refer to FIG. 3), a force is applied to a flat portion of the tip portion of the probe 7A or 7B. When a great force is applied to the probe 7A or 7B and the area of this flat portion is small, the metal film 21A or 21B including the probe 7A or 7B may be embedded inevitably into the polyimide films 22 and 25 (refer to FIGS. 6 to 8). Also, when the load applied to the probe 7A or 7B is excessively large, crushing or wearing of the probes 7A and 7B themselves may occur. In Embodiment 3, therefore, the area of the flat portion of the tip portion of the probe 7A or 7B is widened within an extent not causing such inconveniences. This makes it possible to prevent the breakage of the probes 7A and 7B.

Figure 40:
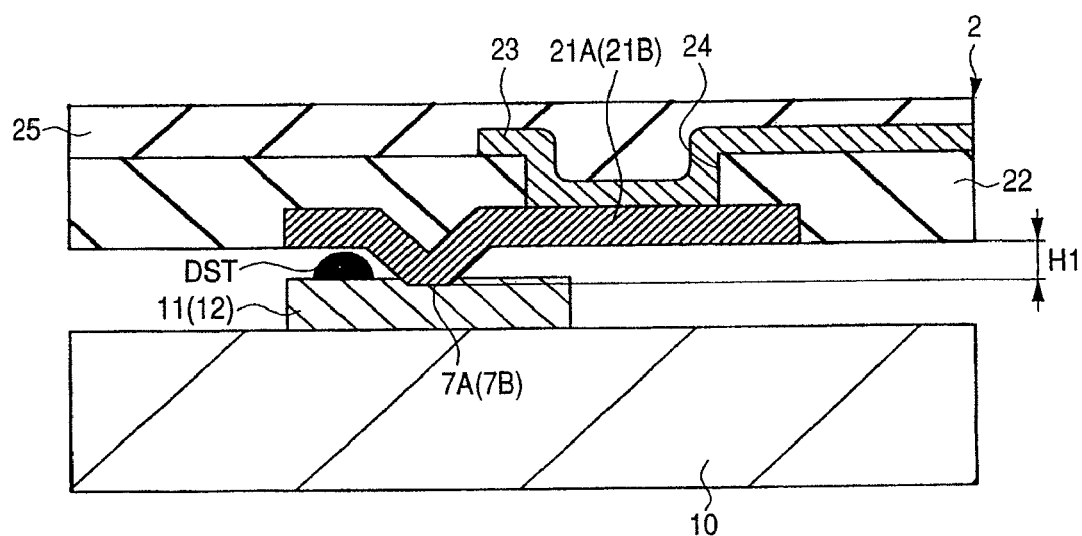
FIG. 40 is a fragmentary cross-sectional view of a thin film sheet constituting a probe card of Embodiment 3 of the invention.

In Embodiment 3, not only the area of the flat portion of the tip portion of the probe 7A or 7B, but also the height of the probe 7A or 7B is increased. As illustrated in FIG. 40, the height H1 of the probe 7A (probe 7B) is set to be greater than about 50% or greater, preferably about 70% or greater, more preferably about 100% or greater of the size of the dust DST existing in a semiconductor manufacturing line (clean room). The height H1 of the probe 7A (probe 7B) is about 200 μm when it is set at about 50% or greater of the size of the dust DST, about 300 μm when it is set at about 70% or greater of the size of the dust DST and about 500 μm when it is set at about 100% of the size of the dust DST. There is a fear that when the height H1 is too low, the thin film sheet 2 (refer to FIG. 2) runs on the dust DST attached to the surface of the chip 10 and changes its shape. In particular, existence of the dust DST in the vicinity of the probe 7A or 7B may cause such an inconvenience as embedding of the probe 7A or 7B in the thin film sheet 2. By increasing the height H1 of the probe 7A (probe 7B), as described above, it is possible to prevent the thin film sheet 2 (refer to FIG. 2) from running on the dust DST, leading to prolongation of the life of the thin film sheet.

Embodiment 4

A description will next be made of Embodiment 4.

When probe testing is performed by using, instead of the probe card having the thin film sheet 2 (refer to FIGS. 1 and 2) with the probes 7 formed thereover, which was described in conjunction with Embodiments 1 to 3, a probe card having a cantilever type probe made of tungsten, the occurrence of an electrical contact between the probe and the pad 11 or 12 is recognized when the needle point of the probe slides by a predetermined amount of overdrive applied to the needle point after the contact of the needle point of the probe with the pad 11 or 12 (refer to FIG. 3). This means that a natural oxide film which has been formed over the surface of the pad 11 or 12 is broken by the sliding of the needle point of the probe, whereby the probe is electrically connected to the pad 11 or 12. According to an experiment made by the present inven tors, pressure applied to the pad 11 or 12 (chip 10 (refer to FIG. 3)) from the needle point, when the needle point of the probe slides on the pad 11 or 12, was from 5 to 10 g per probe. The experiment by the present inventors shows that, owing to such a pressure, cracks appear in an interconnect disposed below the pad 11 or 12. There is a fear that transmission of such a pressure to an interconnect (fourth interconnect) or semiconductor element formed in the chip 10 may inflict damage on the interconnect and semiconductor device. It is therefore difficult to dispose an interconnect and semiconductor element below the pad 11 or 12.

Figure 41:
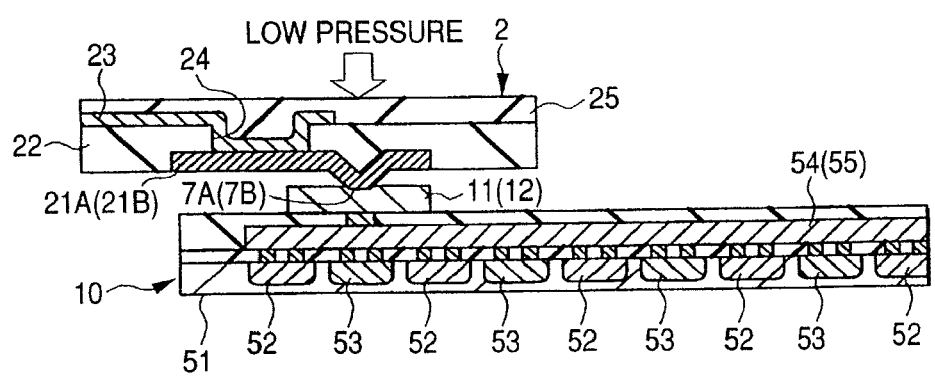
FIG. 41 is a fragmentary cross-sectional view of a probe card of Embodiment 4 of the invention and a semiconductor chip to be subjected to probe testing using the probe card.
Figure 42:
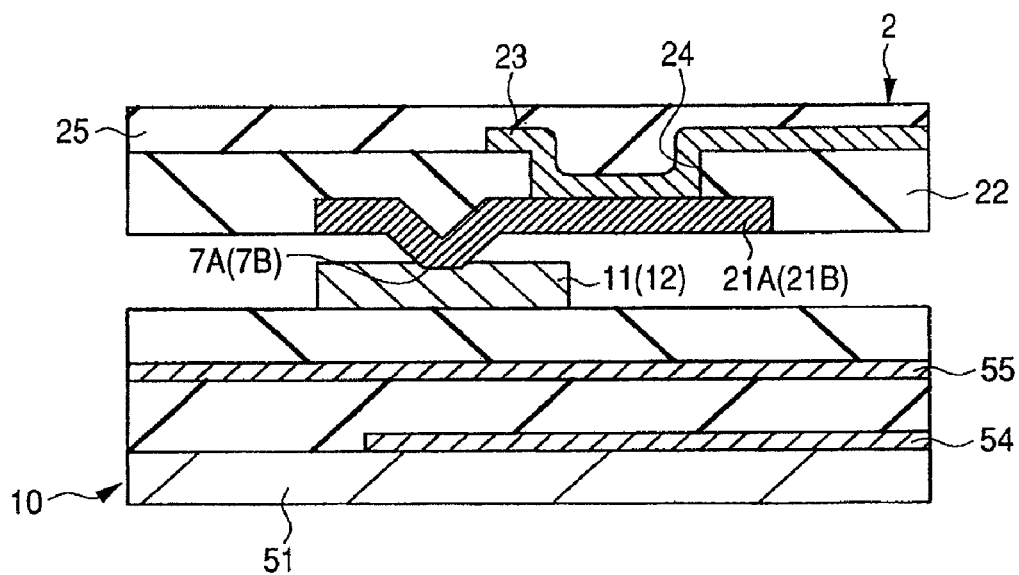
FIG. 42 is a fragmentary cross-sectional view of the probe card of Embodiment 4 of the invention and a semiconductor chip to be subjected to probe testing using the probe card.
Figure 43:
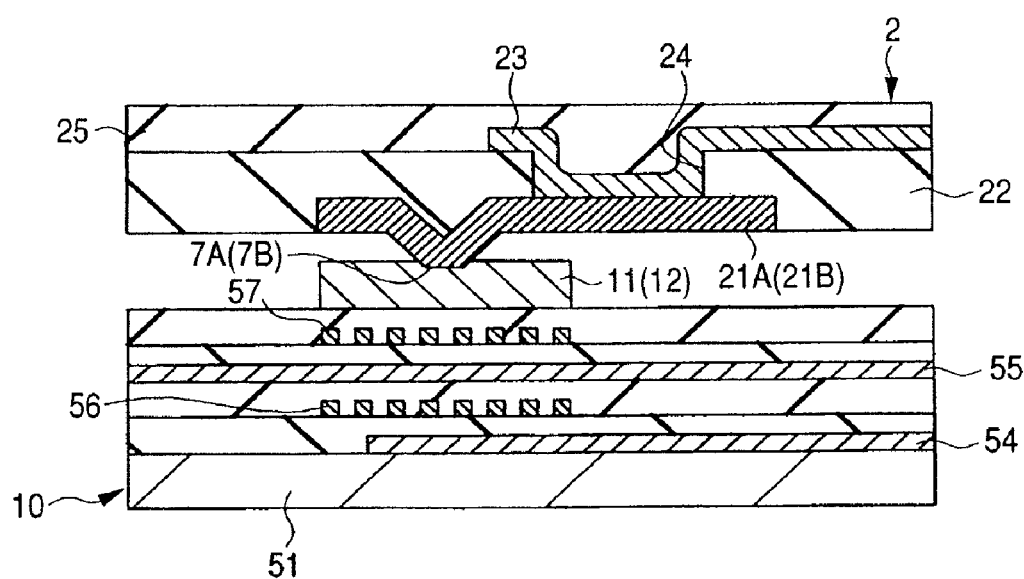
FIG. 43 is a fragmentary cross-sectional view of the probe card of Embodiment 4 of the invention and a semiconductor chip to be subjected to probe testing using the probe card.

When probe testing is performed using the probe card having the thin film sheet 2 with the probes 7 (probes 7A and 7B (refer to FIGS. 6 to 8)) formed thereover, which card was described in conjunction with Embodiments 1 to 3, each probe 7 and the pad 11 or 12 can be electrically connected without sliding the probe 7 over the pad 11 or 12. According to the experiment by the present inventors, the pressure (first pressure) applied to the pad 11 or 12 at that time was about 2 g to 3 g per probe 7, which was much smaller than that of the cantilever type probe. Even if an interconnect and semiconductor element are disposed below the pad 11 or 12, therefore, the risk of subjecting the interconnect or semiconductor element to damage can be reduced. More specifically, as illustrated in FIGS. 41 and 42, over the main surface (element forming surface) of a semiconductor substrate 51 constituting the chip 10, a p type semiconductor region 52 and an n type semiconductor region 53, which will be semiconductor elements later, and interconnects 54 and 55 can be formed below the pad 11 or 12. As illustrated in FIG. 43, below the pad 11 or 12, pads 56 and 57, that are made of a metal film, may be disposed over the interconnects 54 and 55, respectively. This makes it possible to improve the resistance against damage caused by the pressure applied from the probe 7 to the interconnects 54 and 55.

Figure 44:
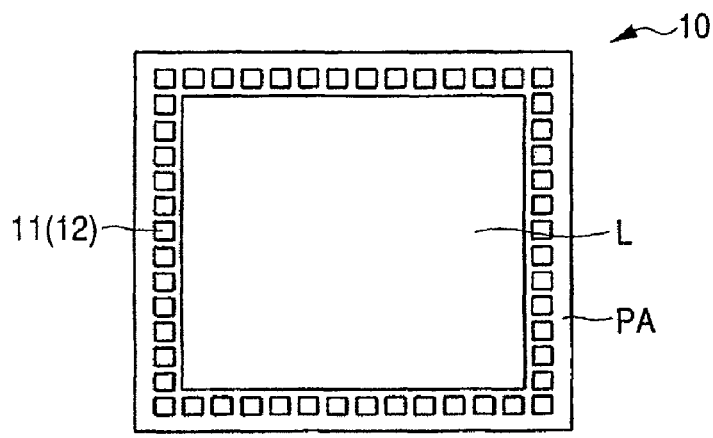
FIG. 44 is a plan view of a semiconductor chip to be subjected to probe testing using a probe card having cantilever type probes.
Figure 45:
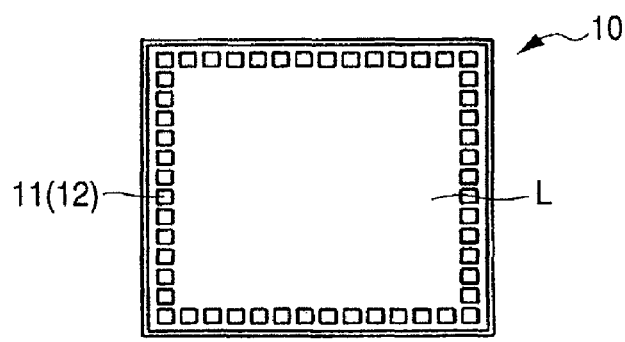
FIG. 45 is a plan view of a semiconductor chip to be subjected to probe testing using the probe card of Embodiment 4 of the invention.
Figure 46:
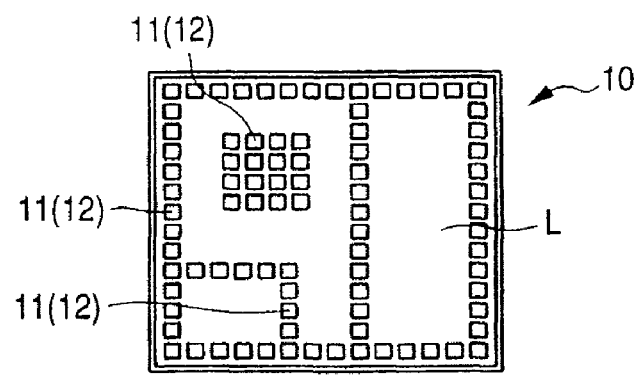
FIG. 46 is a plan view of a semiconductor chip to be subjected to probe testing using the probe card of Embodiment 4 of the invention.

In Embodiment 1, the chip 10 having an LCD driver formed thereover was described; while, in Embodiment 4, the chip 10 is an SoC (System on Chip) having a semiconductor integrated circuit formed thereover which has a plurality of functions. As illustrated in FIG. 44, when such a chip 10 is subjected to probe testing using the probe card with cantilever type probes, damage to interconnects and semiconductor elements can be prevented, for example, not disposing pads 11 and 12 over an active region L in which the interconnects and semiconductor elements have been formed, but disposing pads 11 and 12 over a pad formation region PA which is formed in addition to the active region L. When probe testing is performed using a probe card having the thin film sheet 2 with the probes 7 formed thereover, on the other hand, there is less fear of damage to the interconnects and semiconductor elements so that it is possible to dispose the pads 11 and 12 over the active region L. This makes it possible to omit the pad formation region PA and thereby narrow the area of the chip 10. In addition, since the pads 11 and 12 can be disposed over the active region L, the positions of the pads 11 and 12 can be selected freely not only along the periphery of the chip 10, but also within the plane of the chip 10, which increases the freedom of layout of the design of the semiconductor elements, interconnects and pads 11 and 12 within the chip 10. For example, the operating speed of an input/output buffer circuit can be improved by forming the pads 11 and 12 just above the input/output buffer circuit formed within the chip 10 and shortening the interconnect length from the input/output buffer circuit to the pad 11 and 12.

Embodiment 5

A description will next be made of Embodiment 5.

In Embodiment 1, pads 11 and 12 (refer to FIG. 3) were bump electrodes made of Au. In this case, when probe testing is performed using a probe card having cantilever type probes made of tungsten, the needle point of the probe slides on the pad to break a natural oxide film over the pad 11 or 12a so that a dent of the probe formed on the surface of the pad 11 or 12 inevitably increases. As described in Embodiment 4, use of a cantilever type probe has the inherent drawback that pressure applied to the pad 11 or 12 per probe is as high as from about 5 g to 10 g, and because the pad 11 or 12 is made of a relatively soft metal such as Au, use of such a probe becomes a cause for deepening its dent. There is therefore a danger of a bonding failure when the pad on an assembly substrate is bonded to the pad 11 or 12 by reflow processing in a later step. When products are fabricated using the chip 10 having such a bonding failure, they may be defective products.

Figure 47:
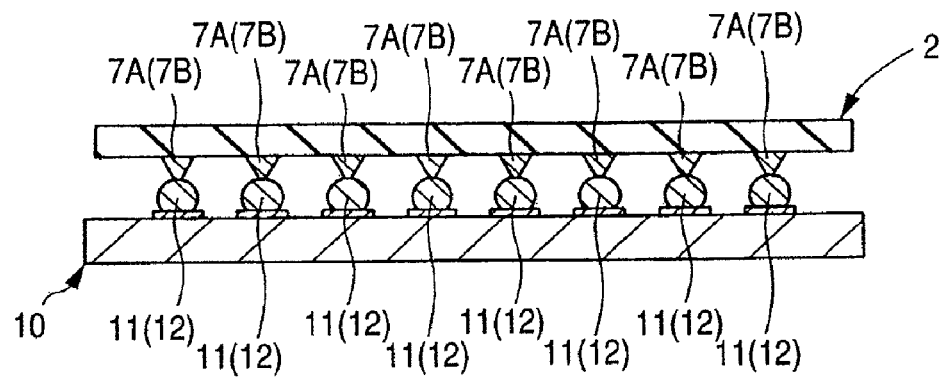
FIG. 47 is a fragmentary cross-sectional view illustrating a probe testing step performed by a probe card of Embodiment 5 of the invention.
Figure 48:
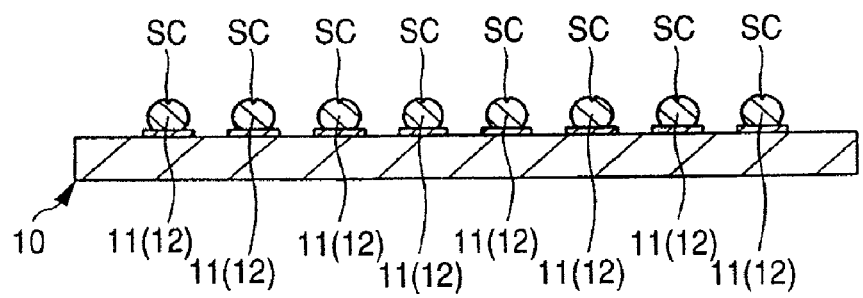
FIG. 48 is a fragmentary cross-sectional view of a semiconductor integrated circuit device during a manufacturing step following the probe testing step of FIG. 47.
Figure 49:
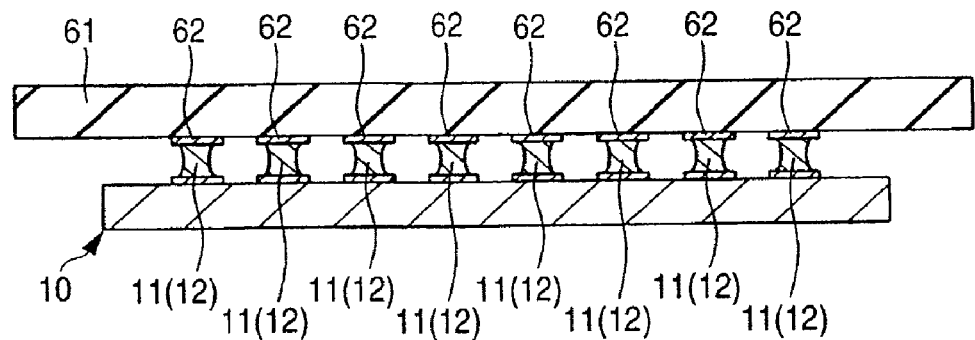
FIG. 49 is a fragmentary cross-sectional view of the semiconductor integrated circuit device during a manufacturing step following that of FIG. 48.

As already described in conjunction with Embodiment 4, when probe testing is performed using a probe card having the thin film sheet 2 with the probes 7A and 7B (refer to FIGS. 6 to 8) formed thereover, which card was described in conjunction with Embodiments 1 to 2, the probes 7 can be electrically connected to the pads 11 and 12 without causing the probes 7 to slide over the pads 11 and 12. The pressure applied on the pads 11 and 12 at this time is as small as about 2 to 3 g per probe 7. As illustrated in FIG. 47, even after probe testing is performed (refer to FIG. 47) using a probe card having the thin film sheet 2 with the probes 7A and 7B formed thereover, dents SC formed by the probes on the surfaces of the pads 11 and 12 can be made smaller and shallower (refer to FIG. 48). As a result, it is possible to prevent a bonding failure even if a pad 62 on the side of an assembly substrate 61 is bonded to the pad 11 or 12 by reflow processing in a later step, as illustrated in FIG. 49.

In the above-described Embodiments, pads 11 and 12 are each made of Au. Even when the pads 11 and 12 are each made of a solder, probe testing using a probe card with cantilever type probes may make a dent, which has been formed on the surface of each of the pads 11 and 12 by the probe, greater and deeper. The dent of the probe can be made smaller and shallower by performing probe testing using the probe card having the thin film sheet 2 with the probes 7A and 7B formed thereover.

Figure 50:
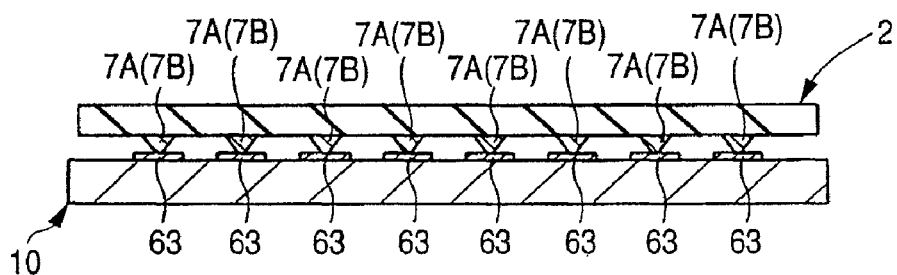
FIG. 50 is a fragmentary cross-sectional view illustrating a probe testing step performed by the probe card of Embodiment 5 of the invention.
Figure 51:
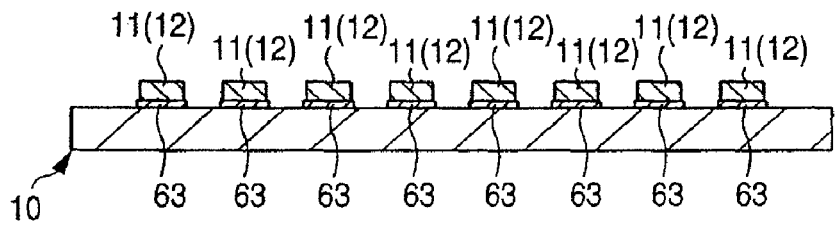
FIG. 51 is a fragmentary cross-sectional view of the semiconductor integrated circuit device during a manufacturing step following the probe testing step of FIG. 50.
Figure 52:
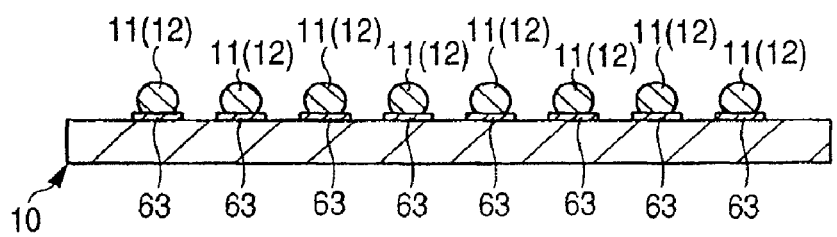
FIG. 52 is a fragmentary cross-sectional view of the semiconductor integrated circuit device during a manufacturing step following that of FIG. 51.
Figure 53:
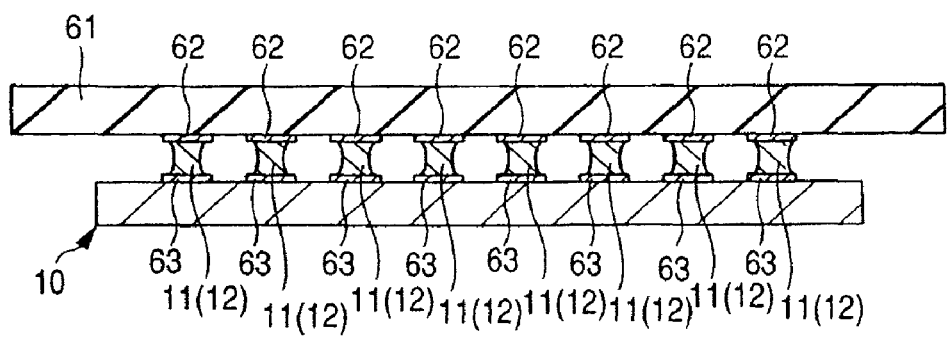
FIG. 53 is a fragmentary cross-sectional view of the semiconductor integrated circuit device during a manufacturing step following that of FIG. 52.

As illustrated in FIG. 50, in order to completely avoid the formation of a dent SC on the pads 11 and 12, lower electrodes 63 to which the pads 11 and 12 will be bonded in a later step may be subjected to probe testing using the probe card having the thin film sheet 2 with the probes 7A and 7B formed thereover, prior to the formation of the pads 11 and 12. This probe testing is followed by the formation of patterns of the pads 11 and 12 over the lower electrodes 63, as illustrated in FIG. 51, and then heating and melting treatment, as illustrated in FIG. 52, to ensure satisfactory bonding of the lower electrode 63 to the pads 11 and 12. As illustrated in FIG. 53, the pads 62 on the side of the assembly substrate 61 are then bonded to the pads 11 and 12 by reflow processing, whereby the chip 10 is mounted over the assembly substrate 61.

Also, when probe testing of these lower electrodes 63 is performed using a probe card with cantilever type probes, the dents of the probes formed on the lower electrodes 63 may become greater and deeper. When the dents of the probes become greater and deeper, there is a danger of the pads 11 and 12 dropping off from the upper surface of the lower electrodes 63 during a step of forming patterns of the pads 11 and 12 over the lower electrodes 63 and bonding the lower electrodes 63 to the pads 11 and 12 completely by heating and melting treatment. Formation of a probing region for bringing a probe into contact with the lower electrode 63 in addition to the pad formation region in which pads 11 and 12 are to be formed can be considered as one measure for overcoming this problem. Addition of such a probing region, however, enlarges the lower electrode 63 and also the chip 10.

Figure 54:
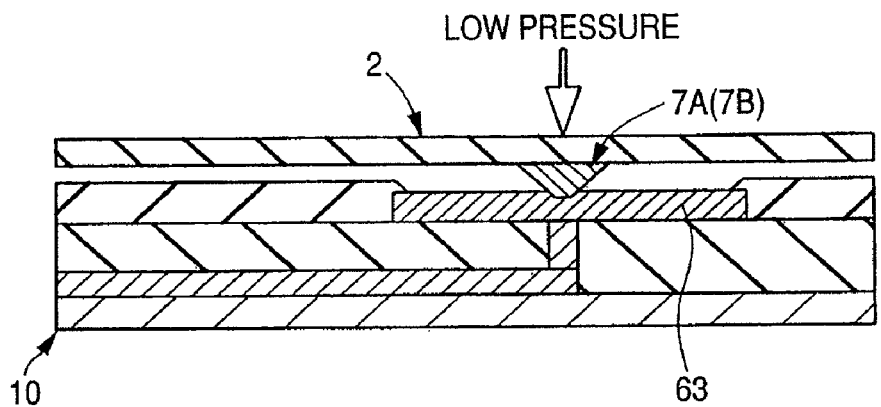
FIG. 54 is a fragmentary enlarged cross-sectional view illustrating a substantial portion of FIG. 50.
Figure 55:
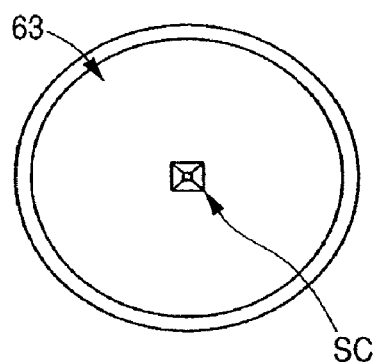
FIG. 55 is a fragmentary plan view illustrating a lower electrode after probe testing by the probe card of Embodiment 5 of the invention.
Figure 56:
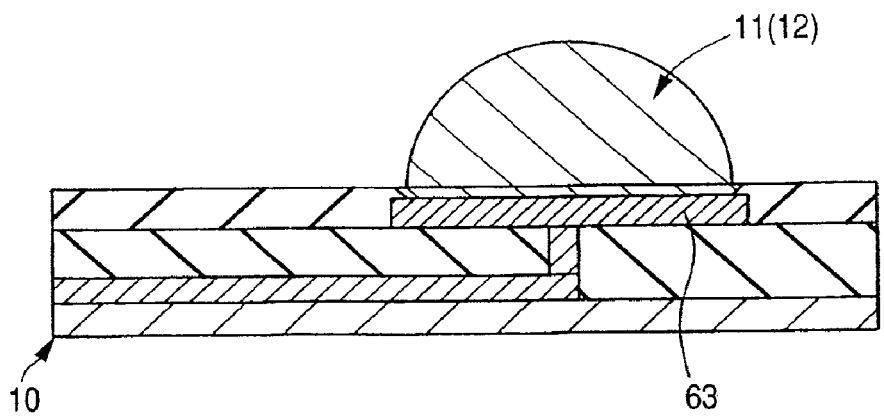
FIG. 56 is a fragmentary cross-sectional view of the semiconductor integrated circuit device during a manufacturing step following the probe testing step of FIG. 54.

FIG. 54 is an enlarged fragmentary cross-sectional view illustrating the vicinity of the lower electrode 63 and probe 7A or 7B, while FIG. 55 is a fragmentary plan view illustrating the lower electrode 63 after contact of the probe 7A or 7B thereto. As illustrated in FIGS. 50 to 53, by probe testing (refer to FIG. 54) using a probe card having the thin film sheet 2 with the probes 7A or 7B formed thereover, the dent SC of the probe formed on the lower electrode 63 can be made smaller and shallower (refer to FIG. 55). In Embodiment 5, as illustrated in FIG. 56, it is possible to prevent the pad 11 or 12 from falling off from the upper surface of the lower electrode 63 even after the steps of forming a pattern (metal film) of the pad 11 or 12 over the lower electrode 63 using a mask and bonding the lower electrode 63 to the pad 11 or 12 completely by heating and melting. As a result, the lower electrode 63 does not need a probing region to have contact with the probe 7A or 7B, which leads to downsizing of the lower electrode 63 and also downsizing of the chip 10 (refer to FIG. 54)

Embodiment 6

A description will next be made of Embodiment 6.

In Embodiments 1 to 5, the pads 11 and 12 (for example, refer to FIG. 3) were bump electrodes made of Au. In Embodiment 6, they are each a bonding pad for mounting a chip on an assembly substrate by wire bonding.

As described in conjunction with Embodiment 5, probe testing using a probe card having cantilever type probes made of tungsten inevitably enlarges and deepens the dent formed by the probe on the surface of the pad 11 or 12. When an Au wire, for example, is bonded to the pad 11 or 12, an Au ball (which will hereinafter be called a "wire ball") is formed on the pad 11 or 12 and on the interface between the wire ball and the pad 11 or 12, an eutectic alloy between Au and the metal constituting the pad 11 or 12 is formed, making it possible to electrically and mechanically reinforce the bondability of the Au wire and pad 11 or 12. According to an experiment by the present inventors, however, when a large and deep dent existed, as described above, no eutectic alloy was formed at the dent portion and bondability between the Au wire and the pad 11 or 12 was not sufficient from the electrical and mechanical viewpoints. With a decrease in the area (size) of the pad 11 or 12, the ratio of the dent in the surface of the pad 11 or 12 becomes greater, which may cause electrical and mechanical deterioration in the bondability between the Au wire and the pad 11 or 12.

Figure 57:
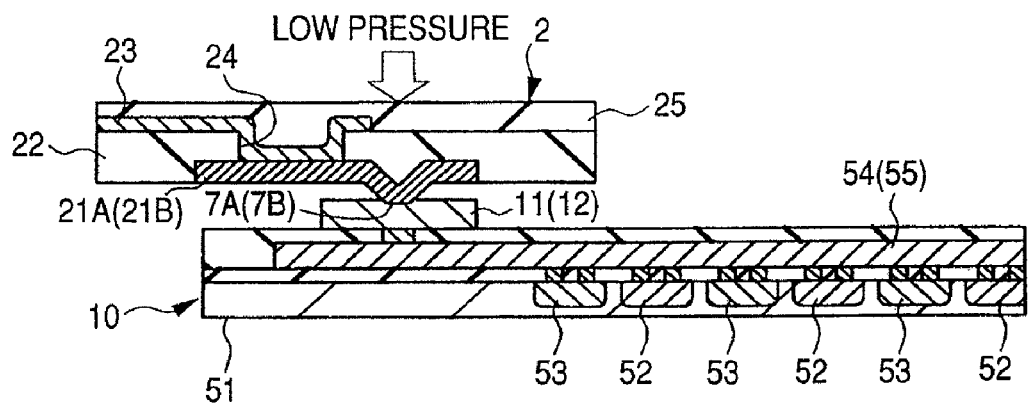
FIG. 57 is a fragmentary cross-sectional view illustrating a probe testing step performed by a probe card of Embodiment 6 of the invention.
Figure 58:
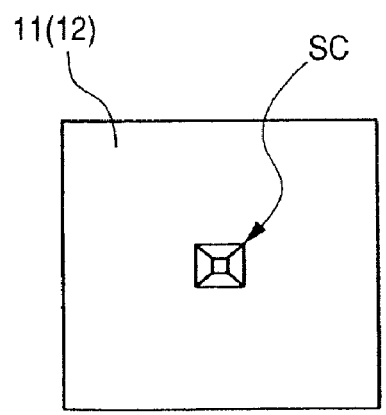
FIG. 58 is a fragmentary plan view illustrating a pad after a probe testing step by the probe card of Embodiment 6 of the invention.
Figure 59:
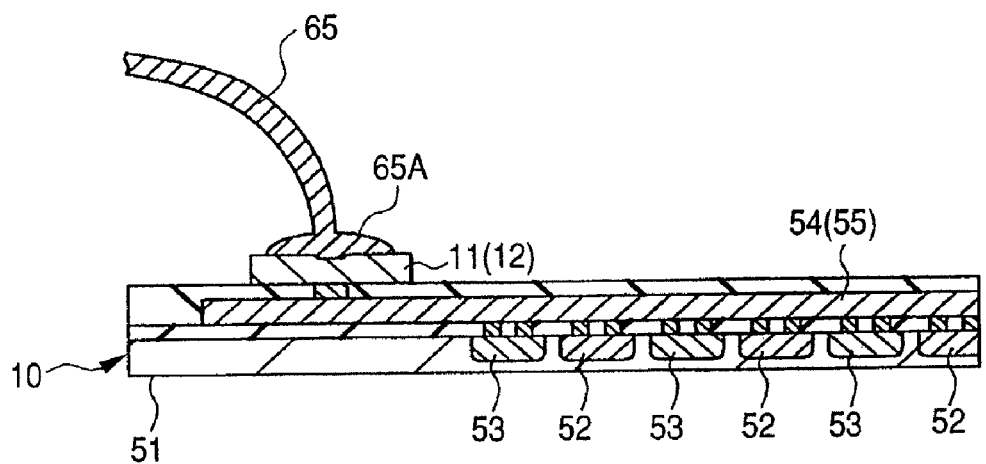
FIG. 59 is a fragmentary cross-sectional view illustrating the semiconductor integrated circuit device during a manufacturing step following the probe testing step of FIG. 58.
Figure 60:
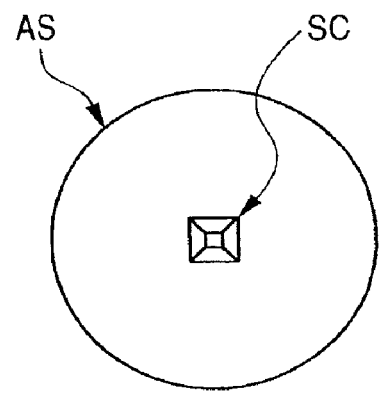
FIG. 60 is a fragmentary cross-sectional view illustrating a eutectic crystal surface between the wire ball and the pad in FIG. 59.

As illustrated in FIG. 57, on the other hand, by probe testing using a probe card having the thin film sheet 2 equipped with the probes 7 (probes 7A or 7B (refer to FIGS. 6 to 8), which card was described in conjunction with Embodiments 1 to 3, the dent SC (refer to FIG. 58) formed by the contact between the pad 11 or 12 and the probe 7 can be made smaller and shallower, as described in conjunction with Embodiment 5. When the Au wire 65 is bonded to the pad 11 or 12, the wire ball 65A is formed on the pad 11 or 12 and the above-described eutectic alloy is formed on the interface with the wire ball 65A and pad 11 or 12, as illustrated in FIG. 59, the eutectic surface AS includes the dent SC formed by the probe 7A or 7B (refer to FIG. 60). In other words, an eutectic alloy can be formed also at the dent portion SC, whereby electrically and mechanically sufficient bondability is available between the Au wire 65 and the pad 11 or 12.

Figure 61:
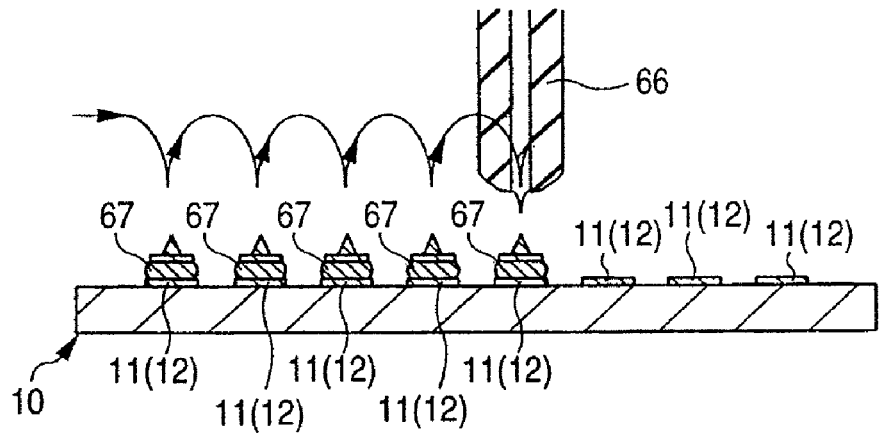
FIG. 61 is a fragmentary cross-sectional view of a semiconductor integrated circuit device according to Embodiment 6 during a manufacturing step.
Figure 62:
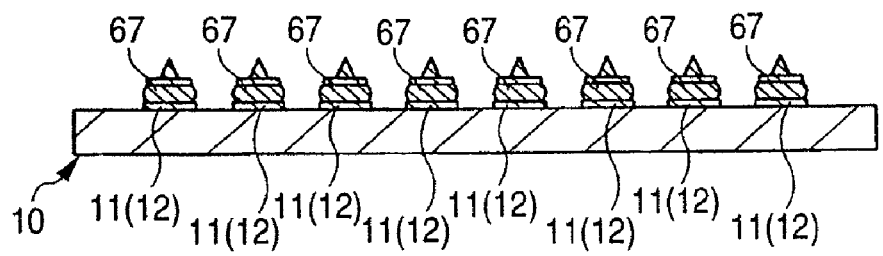
FIG. 62 is a fragmentary cross-sectional view of the semiconductor integrated circuit device during a manufacturing step following that of FIG. 61.
Figure 63:
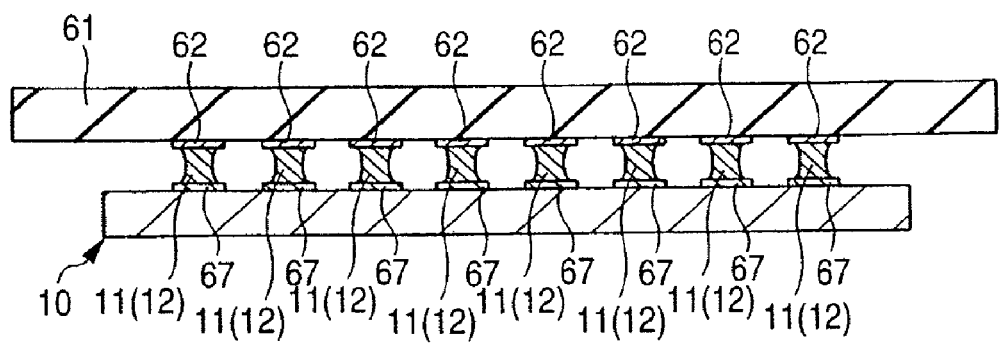
FIG. 63 is a fragmentary cross-sectional view of the semiconductor integrated circuit device during a manufacturing step following that of FIG. 62.

As illustrated in FIG. 61, with a capillary 65 similar to that employed for bonding of the Au wire 65, a wire ball 67, which will serve as a bump electrode, is formed over the pad 11 or 12 by wire bumping, the wire is torn off after the wire ball 67 is bonded to the pad 11 or 12. When the dent formed on the pad 11 or 12 by the probe testing is large and deep, an eutectic alloy between Au and the metal constituting the pad 11 is not formed and there is a risk of the wire ball 67 falling off from the pad 11 or 12 by the force present during tearing-off of the wire. When probe testing is carried out using the probe card having the thin film sheet 2 equipped with the probes 7, which card was described in Embodiments 1 to 3, the dent formed on the pad 11 or 12 can be made smaller and shallower, as described in conjunction with Embodiment 5, so that an eutectic alloy can be formed even at the dent portion. This makes it possible to attain strong mechanical bondability between the wire ball 67 and pad 11 or 12, making it possible to prevent the wire ball 67 from falling off from the pad 11 or 12 by the force produced upon tearing off the wire (refer to FIG. 62). As a result, it is possible to prevent the occurrence of an open failure, which will otherwise occur in response to the falling-off of the wire ball 67 from the pad 11 or 12 after the wire ball 67 has been bonded to the pad 62 on the side of the assembly substrate 61 by the reflow processing of the wire ball 67, when the chip 10 is mounted on the assembly substrate 61 in a later step.

Figure 64:
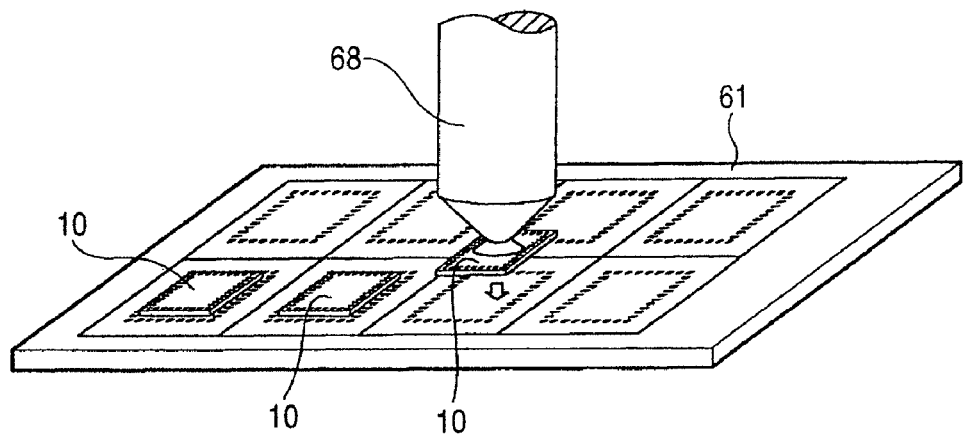
FIG. 64 is a fragmentary perspective view of the semiconductor integrated circuit device of Embodiment 6 of the invention during a manufacturing step.

When the pad 11 or 12 is a bonding pad for bonding the Au wire 65 thereto, the assembly substrate 61 is a glass epoxy substrate, and packaging is performed by a MAP (Mold Array Package) system, the wafer is first divided into respective chips 10, and, then, as illustrated in FIG. 64, the chips 10 are mounted on the assembly substrate 61 by a chip handling mechanism 68.

Figure 65:
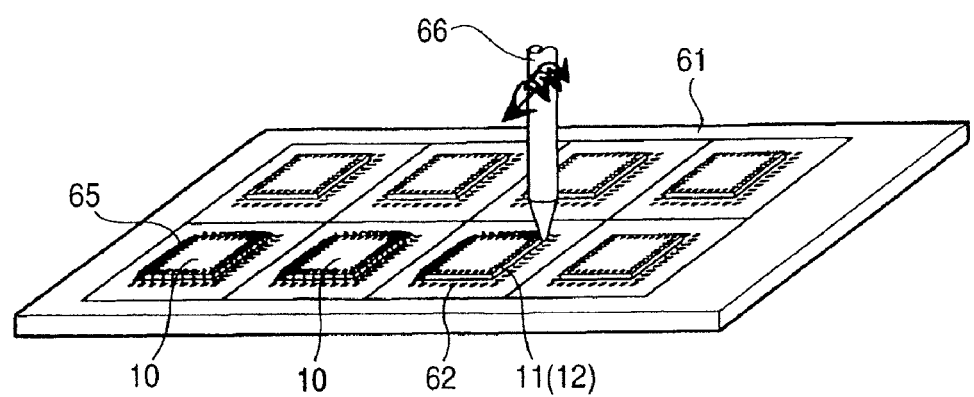
FIG. 65 is a fragmentary perspective view of the semiconductor integrated circuit device during a manufacturing step following that of FIG. 64.

As illustrated in FIG. 65, the Au wire 65 is bonded to the pad 11 or 12 on the chip 10 side and the pad 62 on the side of the assembly substrate 61 via a capillary 66. For example, when one end of the Au wire 65 is bonded to a lead frame made of Cu (copper), bonding is carried out at about 240° C. As in Embodiment 6, when one end of the Au wire 65 is bonded to the assembly substrate 61, which is a glass epoxy substrate, bonding is carried out at about 170 to 200° C., which is lower than that upon bonding to the lead frame, in order to reduce the damage to the assembly substrate 61. The temperature employed for bonding of the Au wire 65 to the pad 11 or 12 is almost equal to it. The lowering of the temperature upon bonding disturbs the formation of an eutectic alloy between Au and the metal constituting the pad 11 or 12 at the dent SC (refer to FIG. 58) formed on the pad 11 or 12. If probe testing is performed using a probe card having cantilever type probes and the dent formed over the surface of the pad 11 or 12 by the probe becomes greater and deeper, further lowering, from the mechanical and electrical viewpoints, of the bondability may occur between the Au wire and pad 11 or 12. Since the dent formed on the pad 11 or 12 can be made smaller and shallower, as described in conjunction with Embodiment 5, by carrying out probe testing using a probe card having the thin film sheet 2 having the probes 7 formed thereover, which card was described in conjunction with Embodiments 1 to 3, an eutectic alloy can be formed even at the dent portion. This makes it possible to prevent lowering of the mechanical bondability and electrical bondability between the Au wire 65 and pad 11 or 12.

Figure 66:
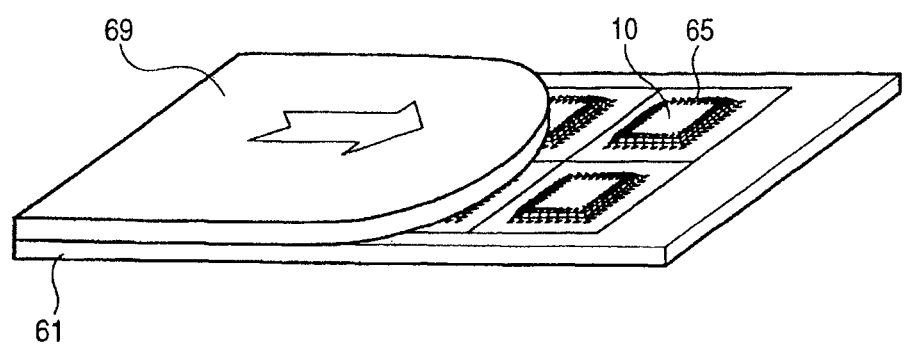
FIG. 66 is a fragmentary perspective view of the semiconductor integrated circuit device during a manufacturing step following that of FIG. 65.
Figure 67:
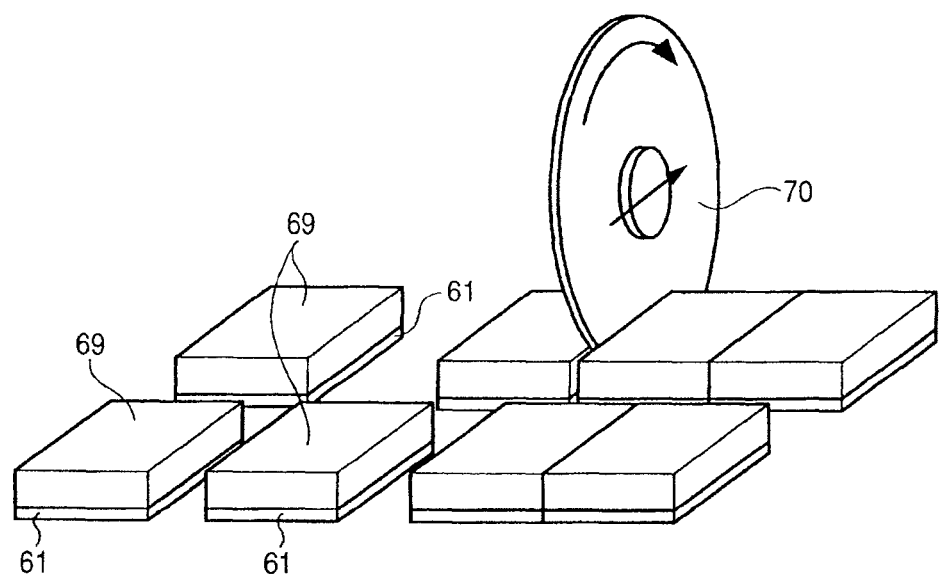
FIG. 67 is a fragmentary perspective view of the semiconductor integrated circuit device during a manufacturing step following that of FIG. 66.

As illustrated in FIG. 66, a semiconductor device of Embodiment 6 is fabricated by sealing the main surface of the assembly substrate 61 having the chip 10 mounted thereover with a molding resin (sealant) 69 and, as illustrated in FIG. 67, cutting the assembly substrate 61 and molding resin 69 using a dicing saw 70.

Embodiment 7

A description will next be made of Embodiment 7.

Figure 68:
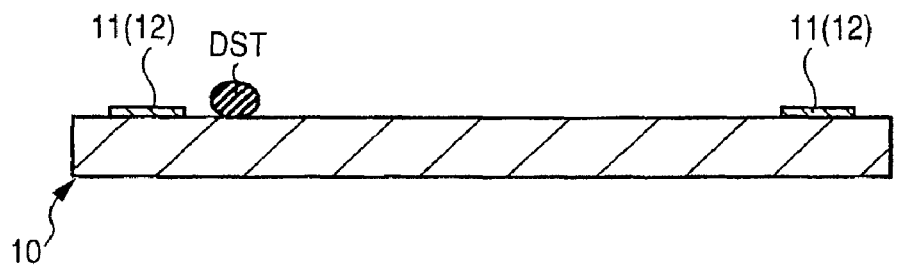
FIG. 68 is a fragmentary cross-sectional view of a semiconductor integrated circuit device according to Embodiment 7 of the invention during its manufacturing step.
Figure 69:
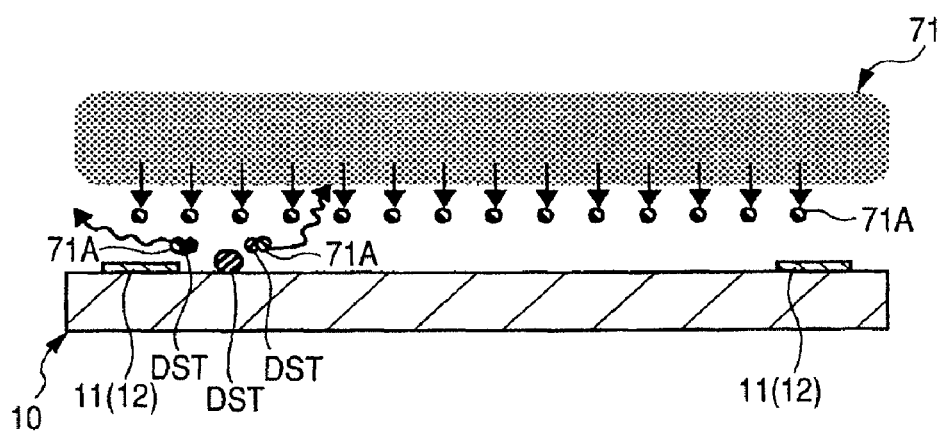
FIG. 69 is a fragmentary cross-sectional view of the semiconductor integrated circuit device during a manufacturing step following that of FIG. 68.
Figure 70:
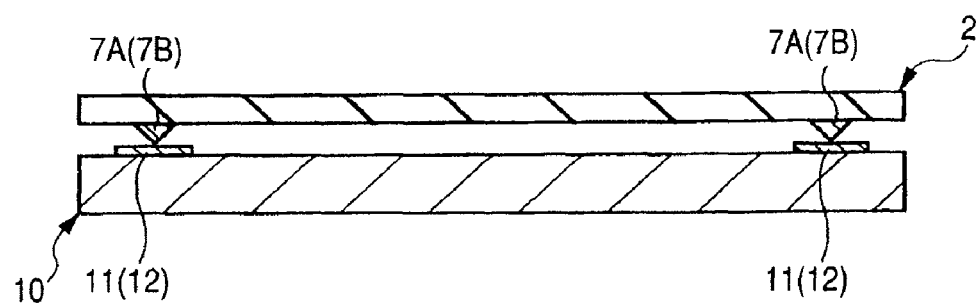
FIG. 70 is a fragmentary cross-sectional view of the semiconductor integrated circuit device during a manufacturing step following that of FIG. 69.

As described in conjunction with Embodiment 3, when the height (diameter) of the dust DST (refer to FIG. 40) that is adhered onto the surface of the chip 10 is greater than the height H1 (refer to FIG. 40) of the probe 7A or 7B (refer to FIG. 40), there is a fear that the thin film sheet 2 will run on the dust DST, which leads to a deformation of the thin film sheet 2 (refer to FIG. 2) and damage to the probe 7A or 7B. Since the probe 7A or 7B, once damaged, cannot be repaired easily, removal of the dust DST from the surface of the chip 10 prior to probe testing is required as much as possible. According to the analysis by the present inventors, the dust DST is carbon-based. In Embodiment 7, prior to probe testing, ashing (refer to FIG. 69), for example, with $O_2$ (oxygen) plasma 71 is applied to the surface of the chip 10 (refer to FIG. 68) having the pad 11 or 12 formed thereover and having dust (DST) attached thereto. By this treatment, chemical reaction between an oxygen atom 71A in the $O_2$ plasma 71 and the dust DST occurs, whereby the dust DST is eliminated from the surface of the chip 10. In other words, the dust DST can be removed from the surface of the chip 10 prior to probe testing. As a result, even if probe testing using a probe card having the thin film sheet 2 with the probes 7A or 7B formed thereover is carried out as illustrated in FIG. 70, deformation of the thin film sheet 2 and damage to the probe 7A or 7B which would otherwise occur because the thin film sheet 2 runs on the dust DST, can be prevented.

In Embodiment 7, the surface of the chip 10 is subjected to ashing. Instead of ashing, light etching with a fluorine gas may be employed. By this method, the dust DST can be removed. The chip 10 may be subjected to washing treatment (for example, ultrasonic washing with pure water or methanol) instead of plasma treatment, such as ashing or etching. The dust DST can be removed by this washing treatment. The plasma treatment and washing treatment may be used in combination, by which the dust DST can be removed more effectively.

Embodiment 8

A description will next be made of Embodiment 8.

As described above, when probe testing is performed using the probe card having the thin film sheet 2 with the probes 7 (probes 7A or 7B (refer to FIGS. 6 to 8)) formed thereover, which card was described in conjunction with Embodiments 1 to 3), the tip portion of the probe 7 breaks a natural oxide film formed over the surface of the pad 11 or 12, whereby the probe 7 is electrically connected to the pad 11 or 12. When the pad 11 or 12 is a bonding pad made of Al (aluminum), its natural oxide film is formed very easily so that the tip portion of the probe 7 should therefore break the natural oxide film without failure.

Figure 71:
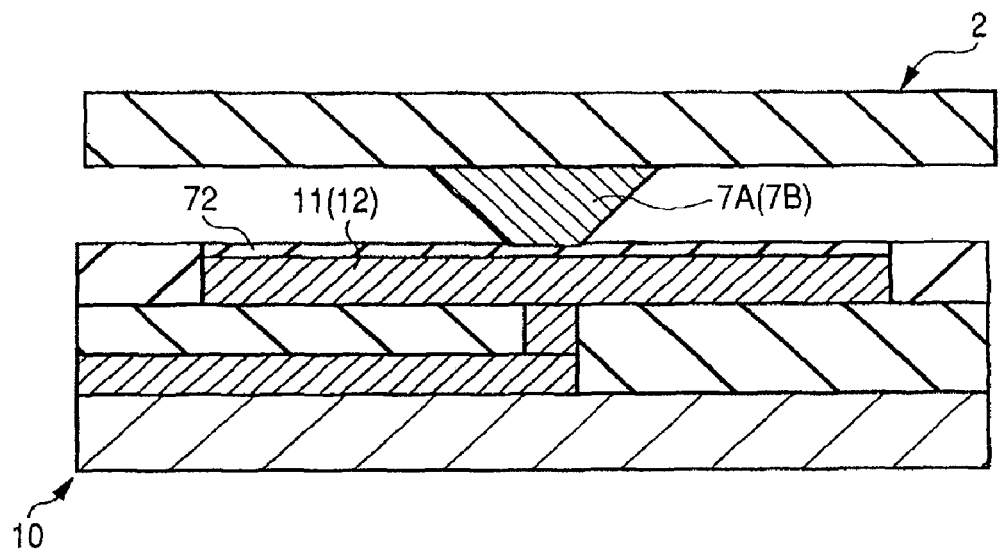
FIG. 71 is a fragmentary cross-sectional view illustrating a probe testing step performed by a probe card of Embodiment 8 of the invention.
Figure 72:
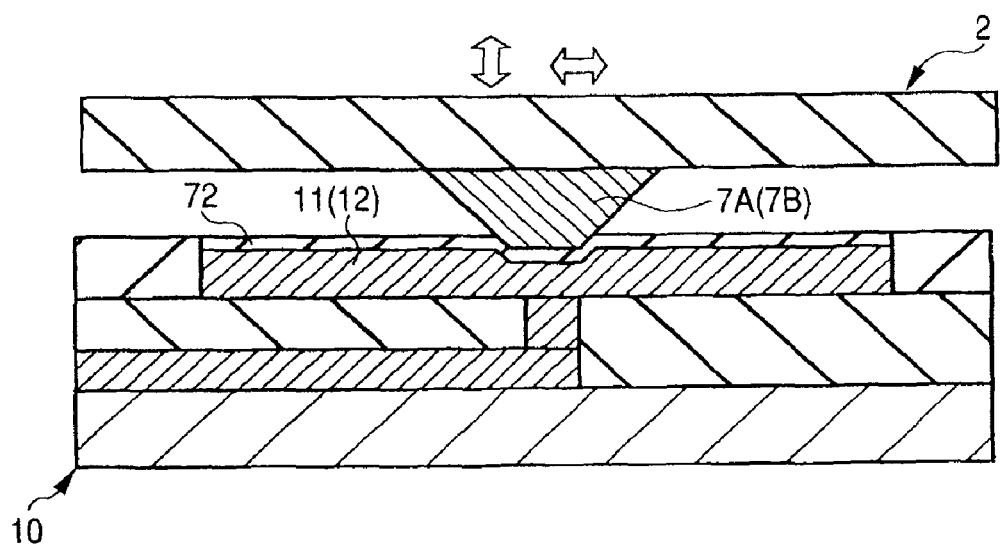
FIG. 72 is a fragmentary cross-sectional view during a probe testing step following that of FIG. 71.
Figure 73:
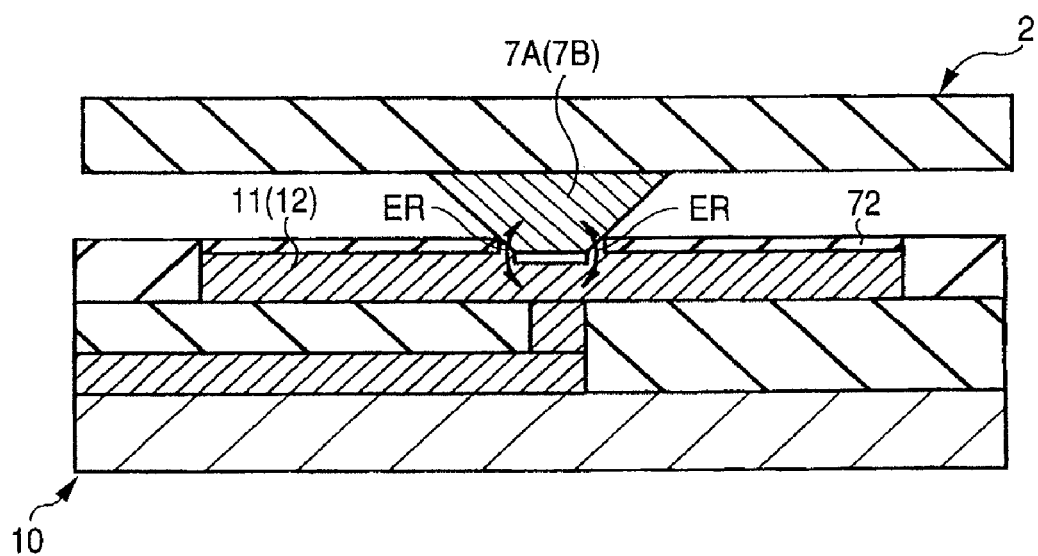
FIG. 73 is a fragmentary cross-sectional view during a probe testing step following that of FIG. 72.

In Embodiment 8, as illustrated in FIG. 71, after the probe 7A or 7B comes in contact with the natural oxide film 72 on the surface of the pad 11 or 12, the probe card is reciprocated in the vertical direction (first direction) within a predetermined distance, as illustrated in FIG. 72. In Embodiment 8, for example, the probe card is first lifted up by 20 to 30 μm and, then, it is lowered down to bring the probe 7A or 7B into contact with the surface (natural oxide film 72) of the pad 11 or 12. The probe card is lifted up by 20 to 30 μm, but the height is not limited thereto. It can be lifted up more when an increase in the height does not adversely affect the operating velocity of the probe card. By this reciprocation, the natural oxide film 72 can be broken on the side surfaces of the probe 7A or 7B, as illustrated in FIG. 73, and the broken sites can function as current channels ER between the probe card 7A or 7B and the pad 11 or 12. The vertical reciprocation of the probe card within a predetermined distance may be replaced with a horizontal (first direction) reciprocation of the chip 10 within a predetermined distance. Upon reciprocation, the distance of the chip 10 to be moved should be adjusted so that the dent SC (for example, refer to FIG. 58) of the probe 7A or 7B formed on the surface of the pad 11 or 12 does not become so large as to adversely affect the later wire bonding step, and the distance should be adjusted so that the probe 7A or 7B does not deviate from the pad 11 or 12. In Embodiment 8, the distance to be moved in one direction is about 1 µm to 10 µm, preferably about 1 µm to 5 µm, more preferably about 5 µm.

By reciprocating the probe card within a distance large enough but not to adversely affecting the later wire bonding step, the natural oxide film 72 can be broken not only on the side surfaces of the probe 7A or 7B but also on the bottom surface thereof. This enables more reliable electrical connection between the probe bad 7A or 7B and the pad 11 or 12.

Embodiment 9

A description will next be made of Embodiment 9.

Figure 74:
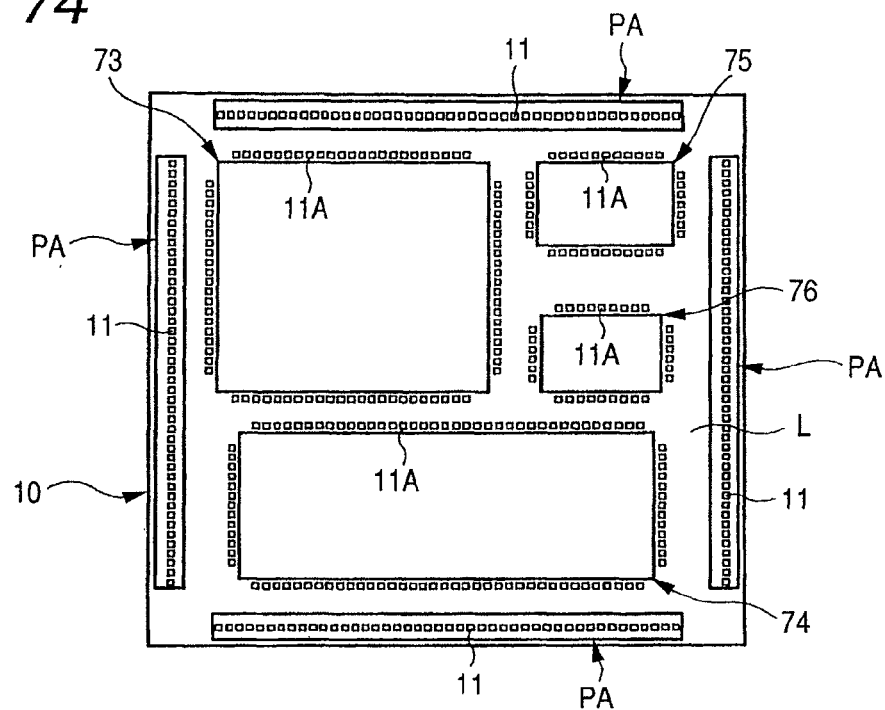
FIG. 74 is a fragmentary plan view of a semiconductor chip to be subjected to a probe testing step by a probe card according to Embodiment 9 of the invention.

FIG. 74 is a plan view of the chip 10 according to Embodiment 9. In Embodiment 9, SoC is employed as the chip 10. IPU (Intellectual Property) modules such as a CPU (Central Processing Unit) core 73, RAM (Random Access Memory) core 74, ROM (Read Only Memory) core 75 and analog core 76 are formed in the chip 10. In a pad formation region PA along the periphery of the chip 10, pads 11 to be electrically connected to these IP modules are arranged. As the width of interconnects constituting the IP modules becomes narrower, a larger number of interconnects can be incorporated in the IP modules and the IP modules have more functions. This leads to an increase in the number of BIST circuits incorporated in the chip 10 and, in turn, in the number of pads 11. With an increase in the number of pads 11, however, the pitch between two adjacent pads 11 becomes narrow and finally reaches its limit.

In Embodiment 9, for example, a BIST circuit (first circuit) is formed in each IP module and around the IP module, pads (first electrodes, electrode group) 11A, which are electrically connected to each BIST circuit, are smaller than the pads 11, and are exclusively used for probe testing, are disposed at the periphery of each IP module. As described in conjunction with Embodiment 1, in the thin film sheet 2, the probes 7A and 7B (refer to FIGS. 6 to 8) can be arranged at positions corresponding to the pads of the chip 10, so that the probes 7A and 7B can also be arranged at positions corresponding to the pads 11a, which are exclusively used for probe testing and are smaller than the pads 11. As described in conjunction with Embodiment 4, when probe testing is performed using the probe card having the thin film sheet 2, there is less fear of damage to interconnects and semiconductor elements even if these interconnects and semiconductor elements are formed below the pads 11. The pads 11 can therefore be disposed on the active region L at the center of the chip 10. This enables probe testing per each IP module. As a result, probe testing of each IP module can be performed without using the pads 11 disposed in the pad formation region PA. Upon probe testing of one IP module, signals for test can be input without going through the other IP module, whereby the test results are free from the influence of the other IP module. By the disposal of such pads 11A, the number of the pads 11 to be disposed in the pad formation region PA can be reduced.

All of the functions of the chip 10 can be tested by the probe testing per IP module, as described above, so that final probe testing using the pads 11 can be omitted. This contributes to shortening of the time spent for probe testing. Shortening of the time spent for probe testing leads to reduction in the cost necessary for probe testing.

Since the pads 11A are exclusively used for probe testing, by covering them with a protective film in a later step, the chip 10 has improved moisture resistance and deterioration resistance.

Embodiment 10

A description will next be made of Embodiment 10.

Figure 75:
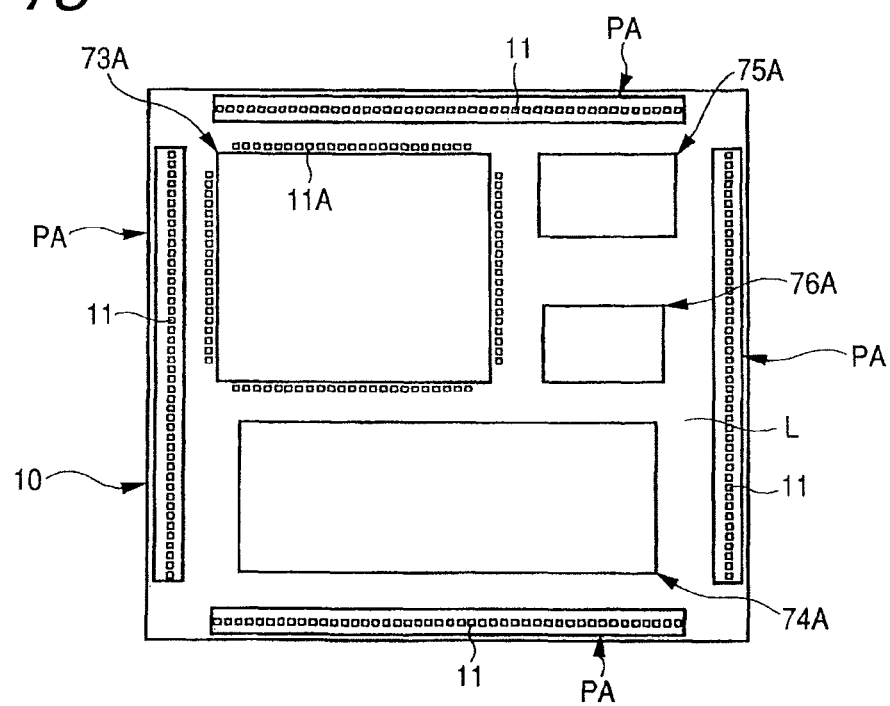
FIG. 75 is a fragmentary plan view of a semiconductor chip to be subjected to a probe testing step by a probe card according to Embodiment 10 of the invention.

Embodiment 9 was directed to probe testing using a probe card having the thin film sheet 2 with the probes 7A or 7B (refer to FIGS. 6 to 8) formed thereover while disposing, around each IP module, pads 11A to be electrically connected to each IP module, which are smaller than the pads 11 and are exclusively used for probe testing. In Embodiment 10, as illustrated in FIG. 75, a large scale microcomputer is formed over the chip 10 by fabricating a chip-in-chip system CPU core (first circuit block) 73A having, formed therein, patterns of semiconductor elements and interconnects of an existing CPU chip in the chip 10 without any modification, and disposing, on the periphery of the CPU core 73A, IP modules (circuit blocks) such as a RAM core 74A, ROM core 75A and analog core 76A, as options. In such a chip 10, probe testing of the CPU core 73A is performed using the pads (first electrode group) 11A disposed at the periphery (third region) of the CPU core 73A in a similar manner to that employed for CPU core 73 in Embodiment 9. It is therefore possible to apply the existing design pattern and probe testing pattern of the CPU chip as is. On the other hand, probe testing of the IP modules, such as RAM core 74A, ROM core 75A and analog core 76A, is performed using the pads (second electrode group) 11 disposed in a pad formation region (second region) PA disposed along the periphery of the chip 10 and by electrically connected to the corresponding IP module.

Figure 76:
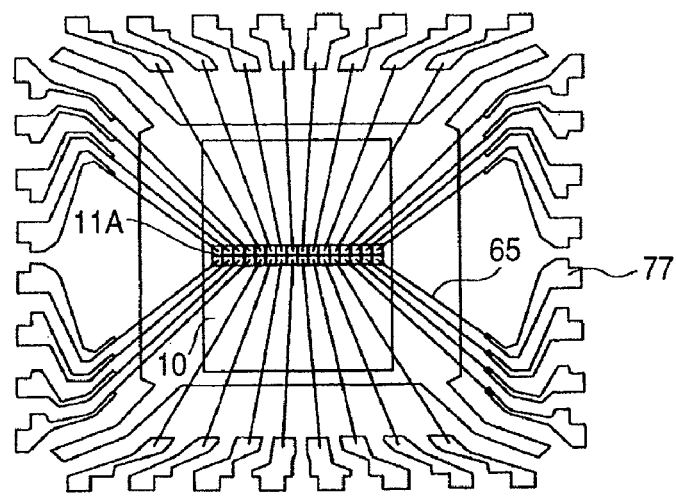
FIG. 76 is a fragmentary plan view illustrating a bonding method, to a lead frame, of the semiconductor chip as illustrated in FIG. 75.

In Embodiment 9, the pads 11A were not electrically connected to external terminals of the chip 10. In Embodiment 10, on the other hand, the CPU core 73A is formed by fabricating the patterns of the semiconductor elements and interconnects of the existing CPU chip as they are, so that the pads 11A can be used as bonding pads. For example, one end of the Au wire 65 can be bonded to it. The other end of the Au wire 65 is bonded to a lead frame 77, whereby a semiconductor integrated circuit device according to Embodiment 10 is fabricated (refer to FIG. 76).

Embodiment 11

A description will next be made of Embodiment 11.

Figure 77:
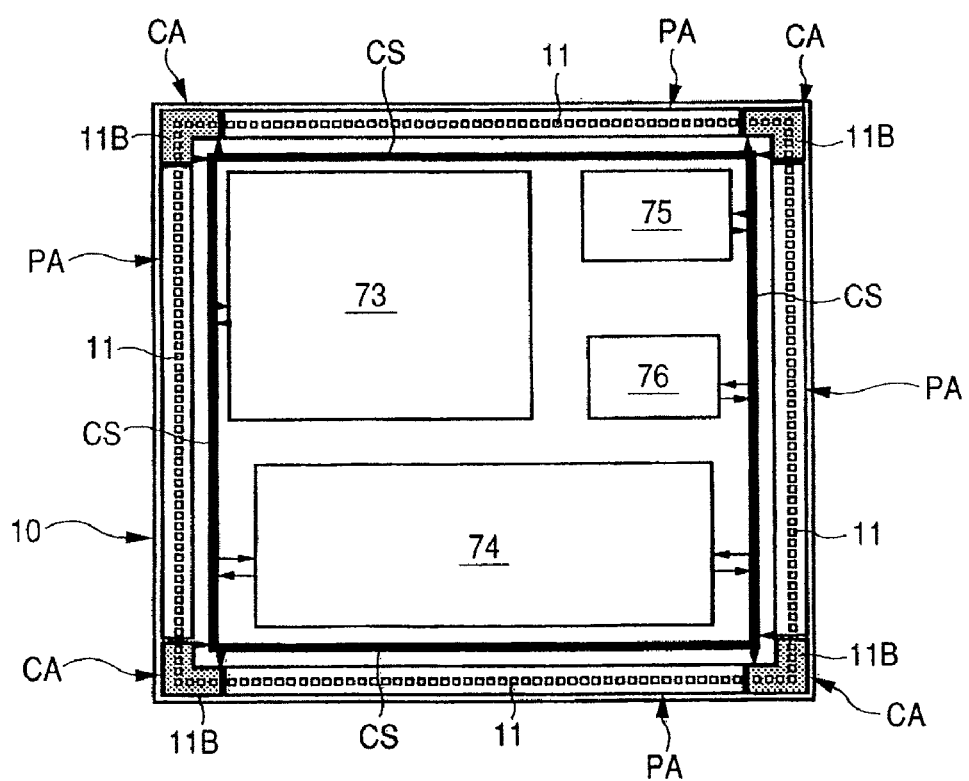
FIG. 77 is a fragmentary plan view of a semiconductor chip to be subjected to a probe testing step by a probe card according to Embodiment 11 of the invention.

In the chip 10 as described in conjunction with Embodiment 9, a stress tends to concentrate on the corner regions of the chip 10 (refer to FIG. 74) after the wire bonding step and sealing step. There is therefore a fear that cracks will appear in the protective film covering the surface of the chip 10, or, when interconnects and semiconductor elements are formed, such a stress may break these interconnects or semiconductor elements. The corner regions of the chip 10 therefore cannot be utilized for the formation of interconnects or semiconductor elements. In Embodiment 11, as illustrated in FIG. 77, pads (first electrode, third electrode group) 11B to be electrically connected to the BIST circuit disposed in each of a CPU core 73, a RAM core 74, a ROM core 75 and an analog core 76 and exclusively used for probe testing are disposed in a corner region CA of the chip 10. The probe 7A or 7B (refer to FIGS. 6 to 8) in contact with the pad 11B sends a control signal CS from the pad 11B to the BIST circuit, whereby probe testing is performed. By disposing the pads 11*b* to be electrically connected to the BIST circuit and exclusively used for probe testing in the corner regions CA of the chip 10, an increase in the number of the pads 11 to be electrically connected to the BIST circuit can be suppressed in the pad formation region PA. This improves the degree of freedom arrangement of the pads 11 in the pad formation region PA. After probe testing, the chip 10 is able to exhibit improved moisture resistance by covering the pad 11B with a protective film.

Without the pad 11B, the probe 7A or 7B existing over the region CA does not make contact with the pad and stress acts on another probe 7A or 7B, which may accelerate abrasion at the tip portion of the other probe 7A or 7B. Provision of the pad 11B can stop the acceleration of the abrasion at the tip portion of a specific probe 7A or 7B. The pad 11B need not necessarily be connected electrically to the BIST circuit, if it only serves to disturb abrasion of the tip portion of the specific probe 7A or 7B.

Such a pad 11B is preferably disposed irrespective of the presence or absence of an electrical connection to the BIST circuit. Upon designing a chip layout, the pad 11B can be arranged automatically by using an automatic layout design tool. In the region CA, another chip-corner-recognizing mark may be placed in addition to the pad 11B.

Embodiment 12

A description will next be made of Embodiment 12.

Figure 78:
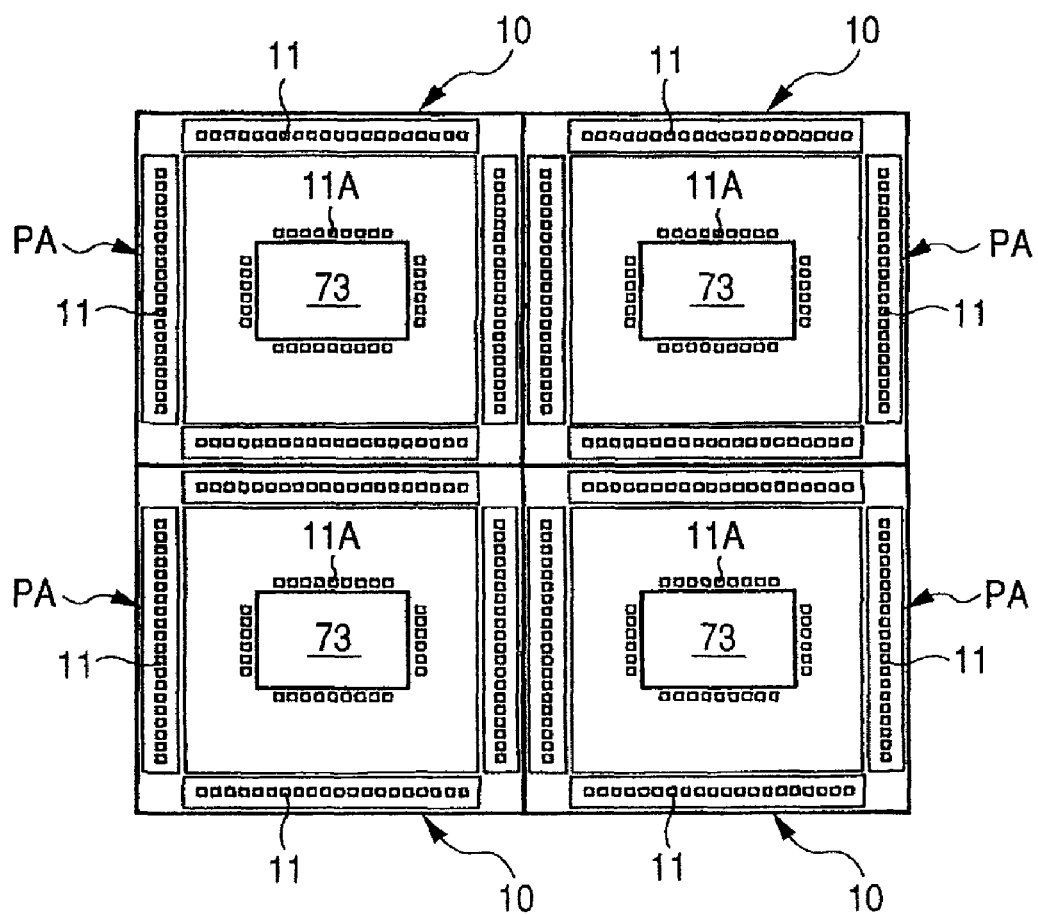
FIG. 78 is a fragmentary plan view of a semiconductor chip to be subjected to a probe testing step by a probe card according to Embodiment 12 of the invention.
Figure 79:
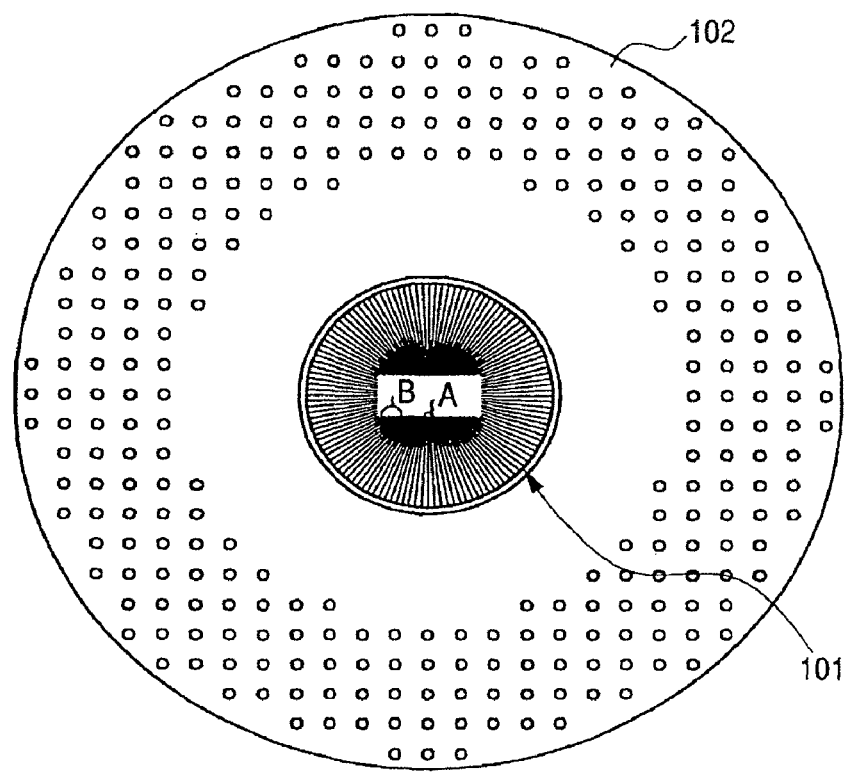
FIG. 79 is a fragmentary plan view of a prober investigated by the present inventors.
Figure 80:
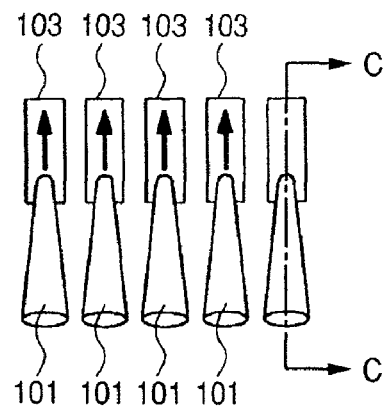
FIG. 80 is an enlarged fragmentary plan view of one region in FIG. 79 during a probe testing step.
Figure 81:
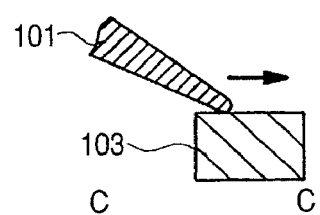
FIG. 81 is a fragmentary cross-sectional view illustrating a substantial portion of the cross-section taken along a line C-C of FIG. 80.
Figure 82:
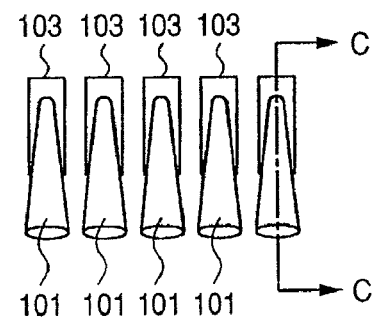
FIG. 82 is an enlarged fragmentary plan view of one region in FIG. 79 during a probe testing step following that of FIG. 80.
Figure 83:
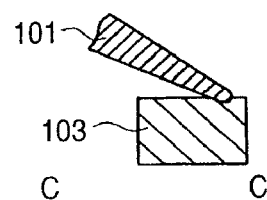
FIG. 83 is a fragmentary cross-sectional view illustrating a substantial portion of the cross-section taken along a line C-C of FIG. 82.
Figure 84:
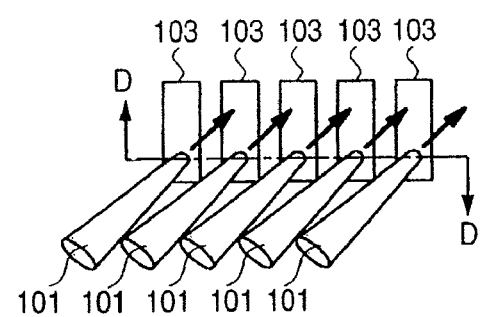
FIG. 84 is an enlarged fragmentary plan view of one region in FIG. 79 during a probe testing step.
Figure 85:
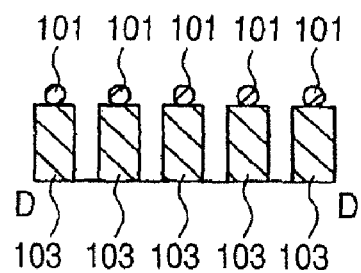
FIG. 85 is a fragmentary cross-sectional view illustrating a substantial portion of the cross-section taken along a line D-D of FIG. 84.
Figure 86:
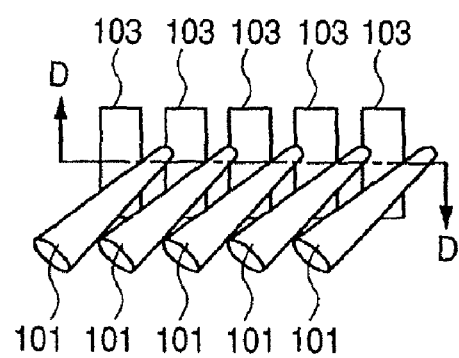
FIG. 86 is an enlarged fragmentary plan view of one region in FIG. 79 during a probe test step following that of FIG. 84.
Figure 87:
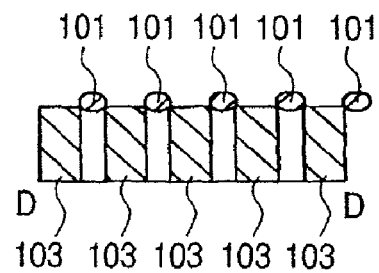
FIG. 87 is a fragmentary cross-sectional view illustrating a substantial portion of the cross-section taken along a line D-D of FIG. 86.

When probe testing is performed by using a probe card having the thin film sheet 2 with the probes 7A or 7B (refer to FIGS. 6 to 8)) formed thereover, which card was described in conjunction with Embodiments 1 to 3, a narrow pad-to-pad pitch chip having at least 2000 pins can be subjected to this probe testing. If a chip having 2000 pins of pads can be subjected to probe testing with the above-described probe card, probe testing can be performed simultaneously for four chips, each chip having 500 pins of pads. Thus, many chips can be treated simultaneously. Such multi-chip probe testing can be used in combination with the probe testing per IP module, as described in conjunction with Embodiment 9. As illustrated in FIG. 78, probe testing is effected by performing the operation for one chip 10 simultaneously for four chips 19, more specifically, by simultaneously bringing the probes 7A and 7B into contact with the pads 11 disposed in the pad formation region PA along the periphery of the chip 10, and the pads 11A which encompass the CPU core 73, which is an IP module, are electrically connected to the CPU core 73 and are exclusively used for probe testing of the CPU core 73. The number of the chips 10 is not limited to four, but should be at least two. Such simultaneous testing for plural chips 10 can reduce the time necessary for probe testing, and this leads to improvement in the throughput of the probe testing. In addition, since the throughput of probe testing can be improved, the cost of probe testing can be reduced.

The present invention has been described specifically based on some embodiments. It should however be borne in mind that the invention is not limited to them, but can be modified within an extent not departing from the scope of the invention.

In the above-described Embodiments, probe testing was performed prior to dicing of a wafer into respective chips. It may be performed after separation into respective chips.

In the above-described Embodiments, the probe had a rhodium film as a surface film. Any film can be used instead of the rhodium film insofar as it has high hardness, excellent abrasion resistance, resistance to adhesion of a material constituting the pad, and low resistance.

The method of fabrication of the semiconductor integrated circuit device according to the invention can be applied widely to a probe testing step in the fabrication of a semiconductor integrated circuit device.

What is claimed is:

1. A method of manufacturing a semiconductor integrated circuit device, comprising the steps of:
   (a) providing a semiconductor wafer which has a plurality of chip regions each having a semiconductor integrated circuit formed thereon and each having a plurality of first electrodes electrically connected to the semiconductor integrated circuit;
   (b) preparing a first card comprising a wiring substrate having first interconnects formed thereon, a thin film probe sheet having a plurality of contact terminals to be brought into contact with the first electrodes, and a pressing tool arranged over a region of the thin film probe sheet in which the plurality of contact terminals are formed,
   the thin film probe sheet including a first insulating film, a plurality of second interconnects formed over a upper surface of the first insulating film, and a second insulating film formed over the plurality of second interconnects,
   a first material formed over the second insulating film and arranged over the region of the thin film probe sheet in which the plurality of contact terminals are formed,
   the first material having first openings,
   elastic materials formed in the first openings,
   the plurality of contact terminals being formed at a lower surface of the first insulating film,
   the plurality of second interconnects being electrically connected to the plurality of contact terminals and to the first interconnects,
   the pressing tool being arranged over the first material and the elastic materials such that the pressing tool is in contact with the elastic materials,
   wherein the first material has a linear expansion coefficient close to that of the semiconductor wafer; and
   (c) bringing tip portions of the contact terminals into contact with the first electrodes of the semiconductor wafer by pressing the thin film probe sheet with the pressing tool, for performing electrical testing of the semiconductor integrated circuit,
   wherein each of the tip portions of the contact terminals is disposed over a corresponding one of the first electrodes.

2. The method according to claim 1, wherein the first material is 42 alloy or invar.

3. The method according to claim 1, wherein the first material is a silicon material.

4. The method according to claim 1, wherein the elastic material is an elastomer.

5. The method according to claim 1, wherein the first insulating film and the second insulating film are polyimide films.

6. The method according to claim 1, further comprising a step of subjecting said semiconductor wafer to plasma treatment, thereby to eliminate a dust from said main surface of said semiconductor wafer, wherein the dust is a dust adhering to the main surface of the semiconductor device, and wherein the dust exists in a semiconductor manufacturing line for forming the semiconductor wafer.

7. The method according to claim 6, wherein the plasma treatment includes supplying oxygen plasma to the main surface of the semiconductor wafer so as to conduct a chemical reaction between the oxygen plasma and the dust, so as to eliminate the dust.

8. The method according to claim 7, wherein the dust is comprised of a carbon-based material.

9. The method according to claim 6, wherein after the step (a), the semiconductor wafer is subjected to a washing step in combination with being subjected to the plasma treatment.

10. The method according to claim 1, wherein second openings are formed in the first insulating film and the second insulating film.

11. The method according to claim 1, wherein the second openings are slit openings.

12. A method of manufacturing a semiconductor integrated circuit device, comprising the steps of:
  (a) providing a semiconductor wafer which has a plurality of chip regions each having a semiconductor integrated circuit formed thereon and each having a plurality of first electrodes electrically connected to the semiconductor integrated circuit;
  (b) preparing a first card comprising a wiring substrate having first interconnects formed thereon, a first sheet having a plurality of contact terminals to be brought into contact with the first electrodes and a pressing mechanism arranged over a region of the first sheet in which the plurality of contact terminals are formed,
  the first sheet including a first insulating film, a plurality of second interconnects formed over a upper surface of the first insulating film, a second insulating film formed over the plurality of second interconnects, and a second insulating film formed over the plurality of second interconnects,
  a second sheet formed over the second insulating film and arranged over the region of the first sheet in which the plurality of contact terminals are formed,
  the second sheet having first openings,
  elastic materials formed in the first openings,
  the plurality of contact terminals being formed at a lower surface of the first insulating film,
  the plurality of second interconnects being electrically connected to the plurality of contact terminals and to the first interconnects,
  the pressing mechanism having a plate form and arranged over the second sheet and the elastic materials such that the pressing mechanism is in contact with the elastic materials,
  wherein the second sheet is comprised of a metal sheet and has a linear expansion coefficient close to that of the semiconductor wafer; and
  (c) bringing tip portions of the contact terminals into contact with the first electrodes of the semiconductor wafer by pressing the first sheet with the pressing mechanism for performing electrical testing of the semiconductor integrated circuit,
  wherein each of the tip portions of the contact terminals is disposed over a corresponding one of the first electrodes.

13. The method according to claim 12, wherein the second sheet is comprised of 42 alloy or invar.

14. The method according to claim 12, wherein the second sheet is comprised of a silicon material.

15. The method according to claim 12, wherein the elastic material is comprised of an elastomer.

16. The method according to claim 12, wherein the first insulating film and the second insulating film are comprised of polyimide films.

17. The method according to claim 12, wherein second openings are formed in the first insulating film and the second insulating film.

18. The method according to claim 12, wherein the second openings are slit openings.

* * * * *